(12) United States Patent
Na et al.

(10) Patent No.: US 10,707,260 B2
(45) Date of Patent: Jul. 7, 2020

(54) CIRCUIT FOR OPERATING A MULTI-GATE VIS/IR PHOTODIODE

(71) Applicant: Artilux, Inc., Menlo Park, CA (US)

(72) Inventors: Yun-Chung Na, Zhubei (TW); Szu-Lin Cheng, Zhubei (TW); Shu-Lu Chen, Zhubei (TW); Han-Din Liu, Zhubei (TW); Hui-Wen Chen, Zhubei (TW); Che-Fu Liang, Zhubei (TW); Yuan-Fu Lyu, Taoyuan (TW); Chien-Lung Chen, Taoyuan (TW); Chung-Chih Lin, Zhubei (TW); Kuan-Chen Chu, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 115 days.

(21) Appl. No.: 15/952,088

(22) Filed: Apr. 12, 2018

(65) Prior Publication Data

US 2018/0233528 A1    Aug. 16, 2018

Related U.S. Application Data

(63) Continuation-in-part of application No. 15/228,282, filed on Aug. 4, 2016, now Pat. No. 9,954,016.
(Continued)

(51) Int. Cl.
*H01L 27/146*    (2006.01)
*H04N 1/193*    (2006.01)
(Continued)

(52) U.S. Cl.
CPC .... *H01L 27/14643* (2013.01); *H01L 31/0352* (2013.01); *H01L 31/0376* (2013.01);
(Continued)

(58) Field of Classification Search
CPC .................................... H01L 27/14649–14652
See application file for complete search history.

(56) References Cited

U.S. PATENT DOCUMENTS

| 3,621,466 A | 11/1971 | Toshio |
| 4,341,918 A | 7/1982 | Evans, Jr. et al. |

(Continued)

FOREIGN PATENT DOCUMENTS

| EP | 2224319 | 9/2010 |
| EP | 2330637 | 6/2011 |

(Continued)

OTHER PUBLICATIONS

Alsam et al: "What the Eye Did Not See—A Fusion Approach to Image Coding", Advances in Visual Computing, dated Jan. 1, 2012, pp. 199-208 (with partial english translation).
(Continued)

*Primary Examiner* — Brigitte A Paterson
(74) *Attorney, Agent, or Firm* — Fish & Richardson P.C.

(57) ABSTRACT

A circuit that includes: a photodiode configured to absorb photons and to generate photo-carriers from the absorbed photons; a first MOSFET transistor that includes: a first channel terminal coupled to a first terminal of the photodiode and configured to collect a portion of the photo-carriers generated by the photodiode; a second channel terminal; and a gate terminal coupled to a first control voltage source; a first readout circuit configured to output a first readout voltage; a second readout circuit configured to output a second readout voltage; and a current-steering circuit configured to steer the photo-carriers generated by the photodiode to one or both of the first readout circuit and the second readout circuit.

10 Claims, 35 Drawing Sheets

Related U.S. Application Data

(60) Provisional application No. 62/271,386, filed on Dec. 28, 2015, provisional application No. 62/251,691, filed on Nov. 6, 2015, provisional application No. 62/217,031, filed on Sep. 11, 2015, provisional application No. 62/211,004, filed on Aug. 28, 2015, provisional application No. 62/210,991, filed on Aug. 28, 2015, provisional application No. 62/210,946, filed on Aug. 27, 2015, provisional application No. 62/209,349, filed on Aug. 25, 2015, provisional application No. 62/200,652, filed on Aug. 4, 2015, provisional application No. 62/500,457, filed on May 2, 2017, provisional application No. 62/504,531, filed on May 10, 2017, provisional application No. 62/583,854, filed on Nov. 9, 2017, provisional application No. 62/485,003, filed on Apr. 13, 2017, provisional application No. 62/561,266, filed on Sep. 21, 2017, provisional application No. 62/613,054, filed on Jan. 3, 2018, provisional application No. 62/542,329, filed on Aug. 8, 2017, provisional application No. 62/643,295, filed on Mar. 15, 2018, provisional application No. 62/651,085, filed on Mar. 31, 2018.

(51) Int. Cl.

| | | |
|---|---|---|
| *H01L 31/0352* | (2006.01) | |
| *H01L 31/0376* | (2006.01) | |
| *H01L 31/102* | (2006.01) | |
| *H01L 31/075* | (2012.01) | |
| *H01L 31/109* | (2006.01) | |
| *H01L 31/103* | (2006.01) | |

(52) U.S. Cl.
CPC .... *H01L 31/035272* (2013.01); *H01L 31/075* (2013.01); *H01L 31/102* (2013.01); *H01L 31/103* (2013.01); *H01L 31/109* (2013.01); *H04N 1/1931* (2013.01)

(56) References Cited

U.S. PATENT DOCUMENTS

| | | | |
|---|---|---|---|
| 4,604,527 A | 8/1986 | Chenevas-Paula et al. |
| 4,607,168 A | 8/1986 | Oritsuki et al. |
| 4,767,936 A | 8/1988 | Muakami et al. |
| 4,782,376 A | 11/1988 | Catalano |
| 4,926,231 A | 5/1990 | Hwang et al. |
| 5,453,611 A | 9/1995 | Oozu |
| 5,673,284 A | 9/1997 | Congdon et al. |
| 5,965,875 A | 10/1999 | Merrill |
| 6,384,462 B1 | 5/2002 | Pauchard et al. |
| 6,483,130 B1 | 11/2002 | Yang et al. |
| 6,894,267 B2 | 5/2005 | Kakinuma |
| 6,958,194 B1 | 10/2005 | Hopper |
| 7,090,133 B2 | 8/2006 | Zhu |
| 7,411,265 B2 | 8/2008 | Sekiguchi |
| 7,456,874 B1 | 11/2008 | Ono |
| 7,557,368 B2 | 7/2009 | Hegarty et al. |
| 7,629,661 B2 | 12/2009 | Rafferty et al. |
| 7,750,958 B1 | 7/2010 | Dierickx |
| 7,826,058 B1 | 11/2010 | Ulrich et al. |
| 7,884,310 B2 | 2/2011 | Buettgen |
| 7,961,301 B2 | 7/2011 | Emhart et al. |
| 7,972,885 B1 | 7/2011 | Dutta et al. |
| 8,129,813 B2 | 3/2012 | Herz |
| 8,183,510 B2 | 5/2012 | Venezia et al. |
| 8,405,823 B2 | 3/2013 | Pfaff |
| 8,824,779 B1 | 9/2014 | Smyth |
| 8,860,083 B1* | 10/2014 | Trezza ............... H01L 31/1105 257/187 |
| 8,975,668 B2 | 3/2015 | Costello et al. |
| 9,236,520 B2 | 1/2016 | Okhonin |
| 9,239,626 B1 | 1/2016 | Wu et al. |
| 9,472,588 B1 | 10/2016 | Liu et al. |
| 9,635,351 B2 | 4/2017 | Dielacher et al. |
| 9,748,429 B1 | 8/2017 | Davids et al. |
| 9,786,715 B2 | 10/2017 | Na et al. |
| 9,893,112 B2 | 2/2018 | Na et al. |
| 10,418,407 B2 | 9/2019 | Na et al. |
| 2003/0042500 A1 | 3/2003 | Rhodes et al. |
| 2003/0189159 A1 | 10/2003 | Lnoue |
| 2004/0121507 A1 | 6/2004 | Bude et al. |
| 2005/0077588 A1 | 4/2005 | Kasuga |
| 2005/0167709 A1 | 8/2005 | Augusto |
| 2005/0186759 A1 | 8/2005 | So |
| 2005/0233495 A1 | 10/2005 | Yang et al. |
| 2006/0110844 A1 | 5/2006 | Lee et al. |
| 2006/0289957 A1 | 12/2006 | Morse et al. |
| 2007/0164767 A1 | 7/2007 | Herz |
| 2007/0187796 A1 | 8/2007 | Rafferty et al. |
| 2007/0218578 A1 | 9/2007 | Lee et al. |
| 2007/0218580 A1 | 9/2007 | Hsu et al. |
| 2008/0121866 A1 | 5/2008 | Yuan et al. |
| 2008/0157254 A1 | 7/2008 | Kang |
| 2008/0181452 A1 | 7/2008 | Kwon et al. |
| 2008/0303058 A1 | 12/2008 | Mori et al. |
| 2009/0050891 A1 | 2/2009 | Katoh |
| 2009/0152604 A1 | 6/2009 | Zhu et al. |
| 2009/0166684 A1 | 7/2009 | Yahav et al. |
| 2009/0200589 A1 | 8/2009 | Qian et al. |
| 2009/0237770 A1 | 9/2009 | Kim et al. |
| 2009/0242935 A1 | 10/2009 | Fitzgerald |
| 2010/0078680 A1 | 4/2010 | Cheng et al. |
| 2010/0102409 A1 | 4/2010 | Hansson |
| 2010/0184246 A1 | 7/2010 | Sakai |
| 2011/0031578 A1 | 2/2011 | Miura et al. |
| 2011/0102553 A1 | 5/2011 | Corcoran et al. |
| 2011/0109880 A1 | 5/2011 | Nummela |
| 2011/0128430 A1 | 6/2011 | Fossum |
| 2011/0155893 A1 | 6/2011 | Endo et al. |
| 2011/0181591 A1 | 7/2011 | Benitez |
| 2011/0188780 A1 | 8/2011 | Wang et al. |
| 2011/0255071 A1 | 10/2011 | Van Der Tempel |
| 2011/0304696 A1 | 12/2011 | Centen et al. |
| 2012/0080726 A1 | 4/2012 | Sakano |
| 2012/0133922 A1 | 5/2012 | Pfaff |
| 2012/0241769 A1 | 9/2012 | Katoh |
| 2012/0248514 A1 | 10/2012 | Korekado et al. |
| 2012/0287085 A1 | 11/2012 | Yuki et al. |
| 2012/0307232 A1 | 12/2012 | Mase |
| 2013/0026548 A1 | 1/2013 | McCarten |
| 2013/0062506 A1 | 3/2013 | Hu |
| 2013/0062522 A1 | 3/2013 | Jiang et al. |
| 2013/0062663 A1 | 3/2013 | Yuan et al. |
| 2013/0075607 A1 | 3/2013 | Bikumandla et al. |
| 2013/0119234 A1 | 5/2013 | Lee et al. |
| 2013/0128070 A1 | 5/2013 | Ishikawa |
| 2013/0154918 A1 | 6/2013 | Vaught et al. |
| 2013/0248865 A1 | 9/2013 | Toriyama et al. |
| 2013/0278631 A1 | 10/2013 | Border et al. |
| 2013/0280879 A1 | 10/2013 | Stecher et al. |
| 2013/0283213 A1 | 10/2013 | Guendelman |
| 2013/0321271 A1 | 12/2013 | Bychkov |
| 2014/0002700 A1 | 1/2014 | Oishi |
| 2014/0043227 A1 | 2/2014 | Skogo et al. |
| 2014/0054444 A1 | 2/2014 | Sasaki |
| 2014/0054736 A1 | 2/2014 | Meade et al. |
| 2014/0111664 A1 | 4/2014 | Kumano |
| 2014/0117428 A1 | 5/2014 | Lee et al. |
| 2014/0159129 A1 | 6/2014 | Wang |
| 2014/0183549 A1 | 7/2014 | Park et al. |
| 2014/0184496 A1 | 7/2014 | Gribetz et al. |
| 2014/0206443 A1 | 7/2014 | Sharp et al. |
| 2014/0252437 A1 | 9/2014 | Ho et al. |
| 2014/0285404 A1 | 9/2014 | Takano et al. |
| 2014/0285420 A1 | 9/2014 | Kamimura et al. |
| 2014/0285641 A1 | 9/2014 | Kato et al. |
| 2014/0312206 A1 | 10/2014 | Okhonin et al. |
| 2014/0367740 A1 | 12/2014 | Morse |
| 2014/0368613 A1 | 12/2014 | Krupka |

(56) References Cited

U.S. PATENT DOCUMENTS

| | | | |
|---|---|---|---|
| 2015/0001664 A1 | 1/2015 | Van Der Tempel | |
| 2015/0014661 A1 | 1/2015 | Joo et al. | |
| 2015/0022435 A1 | 1/2015 | Luebke | |
| 2015/0041761 A1 | 2/2015 | Cheng et al. | |
| 2015/0043826 A1 | 2/2015 | Ishimitsu | |
| 2015/0092983 A1 | 4/2015 | Nguyen et al. | |
| 2015/0171146 A1 | 6/2015 | Ooki et al. | |
| 2015/0193938 A1 | 7/2015 | Freedman et al. | |
| 2015/0281618 A1* | 10/2015 | Saito | H04N 9/31 348/303 |
| 2015/0286340 A1 | 10/2015 | Send et al. | |
| 2015/0331508 A1 | 11/2015 | Nho et al. | |
| 2016/0027837 A1 | 1/2016 | Webster et al. | |
| 2016/0049476 A1 | 2/2016 | Rachmady et al. | |
| 2016/0141329 A1 | 5/2016 | Cheng et al. | |
| 2016/0150174 A1 | 5/2016 | Hynecek | |
| 2016/0155883 A1 | 6/2016 | Shi et al. | |
| 2016/0161599 A1 | 6/2016 | Seliuchenko et al. | |
| 2016/0172393 A1 | 6/2016 | Kim et al. | |
| 2016/0187976 A1 | 6/2016 | Levesque et al. | |
| 2016/0190304 A1 | 6/2016 | Morin et al. | |
| 2016/0225922 A1 | 8/2016 | Akkaya et al. | |
| 2016/0239974 A1 | 8/2016 | Wang | |
| 2016/0284750 A1 | 9/2016 | Ionescu et al. | |
| 2016/0316159 A1 | 10/2016 | Yoneda | |
| 2016/0335475 A1 | 11/2016 | Krenzer et al. | |
| 2016/0372502 A1 | 12/2016 | Li et al. | |
| 2016/0381789 A1 | 12/2016 | Rogers et al. | |
| 2017/0040361 A1 | 2/2017 | Canon | |
| 2017/0040362 A1 | 2/2017 | Na et al. | |
| 2017/0062508 A1 | 3/2017 | Na et al. | |
| 2017/0068319 A1 | 3/2017 | Viswanathan | |
| 2017/0075421 A1 | 3/2017 | Na et al. | |
| 2017/0084648 A1 | 3/2017 | Liu et al. | |
| 2017/0123233 A1 | 5/2017 | Sabovic | |
| 2017/0131389 A1 | 5/2017 | Na et al. | |
| 2017/0142362 A1* | 5/2017 | Liu | H04N 5/378 |
| 2017/0177075 A1 | 6/2017 | Zhang | |
| 2017/0196451 A1 | 7/2017 | Tian | |
| 2017/0221212 A1 | 8/2017 | Adam et al. | |
| 2017/0223339 A1 | 8/2017 | Kondo et al. | |
| 2017/0237911 A1 | 8/2017 | Won | |
| 2017/0244949 A1 | 8/2017 | Peterson | |
| 2018/0006081 A1 | 1/2018 | Na et al. | |
| 2018/0007255 A1 | 1/2018 | Tang | |
| 2018/0012916 A1 | 1/2018 | Na et al. | |
| 2018/0012917 A1 | 1/2018 | Na et al. | |
| 2018/0012918 A1 | 1/2018 | Na et al. | |
| 2018/0061883 A1 | 3/2018 | Na et al. | |
| 2018/0137610 A1 | 5/2018 | Aflaki | |
| 2018/0151732 A1 | 5/2018 | Mehandru | |
| 2018/0175084 A1 | 6/2018 | Na et al. | |
| 2018/0175095 A1 | 6/2018 | Sallin | |
| 2018/0188356 A1 | 7/2018 | Na et al. | |
| 2018/0190698 A1 | 7/2018 | Na et al. | |
| 2018/0190702 A1 | 7/2018 | Na et al. | |
| 2018/0233521 A1 | 8/2018 | Na et al. | |
| 2018/0247968 A1 | 8/2018 | Na et al. | |
| 2018/0261645 A1 | 9/2018 | Na et al. | |
| 2018/0269239 A1 | 9/2018 | Na et al. | |
| 2019/0011984 A1 | 1/2019 | Na et al. | |
| 2019/0033432 A1 | 1/2019 | Na et al. | |
| 2019/0049564 A1 | 2/2019 | Na et al. | |
| 2019/0081095 A1* | 3/2019 | Hanzawa | H01L 27/14603 |
| 2019/0103435 A1 | 4/2019 | Na et al. | |

FOREIGN PATENT DOCUMENTS

| | | |
|---|---|---|
| JP | H0548139 | 2/1993 |
| JP | 2000-133791 | 5/2000 |
| JP | 2003-225207 | 8/2003 |
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-66097 | 3/2011 |
| JP | 2011-128024 | 6/2011 |
| JP | 2012-146920 | 8/2012 |
| JP | 2015-194838 | 11/2015 |
| WO | WO 2005/036647 | 4/2005 |
| WO | WO 2013-104718 | 7/2013 |
| WO | WO 2014-085789 | 6/2014 |
| WO | WO 2014-197226 | 12/2014 |
| WO | WO 2015-104307 | 7/2015 |
| WO | WO 2016/038416 | 3/2016 |
| WO | WO 2016/077791 | 5/2016 |
| WO | WO2016/187566 | 11/2016 |
| WO | WO 2016/208215 | 12/2016 |
| WO | WO 2017/015580 | 1/2017 |
| WO | WO 2017/018477 | 2/2017 |
| WO | WO 2017/024121 | 2/2017 |
| WO | WO 2017/035447 | 3/2017 |

OTHER PUBLICATIONS

EP Search Report in European Application No. EP18189000, dated Jan. 9, 2019, 17 pages.

Zanuttigh et al: "ToF Depth Camera Components", Time-of-Flight and Structured Light Depth Cameras: Technology and Applications, dated May 24, 2016, pp. 31-33.

International Search Report and Written Opinion in International Application No. PCT/US2016/043609, dated Nov. 1, 2016, 21 pages.

International Search Report and Written Opinion in International Application No. PCT/US2016/045526, dated Nov. 22, 2016, 15 pages.

International Search Report and Written Opinion in International Application No. PCT/US2016/048915, dated Nov. 22, 2016, 17 pages.

International Search Report and Written Opinion in International Application No. PCT/US2016/060493, dated Jan. 10, 2017, 20 pages.

International Search Report and Written Opinion in International Application No. PCT/US2016/066073, dated Mar. 7, 2017, 16 pages.

International Preliminary Report on Patentability in International Application No. PCT/US2016/043609, dated Jan. 23, 2018, 12 pages.

International Preliminary Report on Patentability in International Application No. PCT/US2016/045526, dated Feb. 6, 2018, 10 pages.

International Preliminary Report on Patentability in International Application No. PCT/US2016/048915, dated Feb. 27, 2018, 8 pages.

Bamji et al., "A 0.13 μm CMOS System-on-Chip for a 512 × 424 Time-of-Flight Image Sensor With Multi-Frequency Photo-Demodulation up to 130 MHz and 2 GS/s ADC," IEEE J. Solid-State Circuits, Jan. 2015, 50(1):303-319.

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-μm CMOS Technology," IEEE Trans. Electron. Dev., Jun. 2011, 58(6):1702-1709.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Geng, "Structured-light 3D surface imaging: A tutorial," Advances in Optics and Photonics, Jun. 30, 2011, 3(2):128-160.

(56) References Cited

OTHER PUBLICATIONS

Joo et al., "High-sensitivity 10 Gbps Ge-on-Si photoreceiver operating at λ~1.55 pm," Optics Express, Aug. 2, 2010, 18(16):16474-16479.
Kato et al., "320 × 240 Back-Illuminated 10-µm CAPD Pixels for High-Speed Modulation Time-of-Flight CMOS Image Sensor," IEEE J. Solid-State Circuits Apr. 2018, 53(4):1071-1078.
Kawahito et al., "A CMOS Time-of-Flight Range Image Sensor With Gates-on-Field-Oxide Structure," IEEE Sensors J. Dec. 2007, 7(12):1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron. Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon. Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
Perenzoni et al., "Compact SPAD-Based Pixel Architectures for Time-Resolved Image Sensors," Sensors, May 23, 2016, 16(5):745, 12 pages.
Rafferty et a., "Monolithic germanium SWIR imaging array," 2008 IEEE Conference on Technologies for Homeland Security, Waltham, MA, May 12, 2008, p. 577-582.
Ringbeck et al., "Multidimensional measurement by using 3-D PMD sensors," Adv. Radio Sci., Jan. 1, 2007, 5:135-146.
Tseng et al., "A self-assembled microbonded germanium/silicon heterojunction photodiode for 25 Gb/s high-speed optical interconnects," Sci. Rep. Nov. 15, 2013, 3:3225, 6 pages.
Van Der Tempel et al., "Lock-in Pixel Using a Current-Assisted Photonic Demodulator Implemented in 0.6 µm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J. Mar. 2007, 7(3):317-318.
Wu et al., "A critically coupled Germanium photodetector under vertical illumination," Opt Express, Dec. 31, 2012, 20(28):29338-29346.
Yin et al., "31GHz Ge n-i-p waveguide photodetectors on Silicon-on-Insulator substrate," Optics Express Oct. 17, 2007, 15(21):13965-13971.
Yokogawa et al., "IR sensitivity enhancement of CMOS Image Sensor with diffractive light trapping pixels," Sci. Rep. Jun. 19, 2017, 7(1):3832, 9 pages.

Hutchinson et al., "High-Resolution Aliasing-Free Optical Beam Steering," Optica, vol. 3, No. 8, dated Aug. 5, 2016, 4 pages.
Extended European Search Report in European Application No. 16840192.5, dated Mar. 19, 2019, 7 pages.
Extended European Search Report in European Application No. 16833863, dated Jul. 18, 2018, 6 pages.
Extended European Search Report in European Application No. 181602004, dated Jul. 18, 2018, 6 pages.
Extended European Search Report in European Application No. 181602053, dated Jul. 18, 2018, 6 pages.
Extended European Search Report in European Application No. 168630325, dated Aug. 23, 2018, 5 pages.
International Preliminary Report on Patentability in International Application No. PCT/US2016/060493, dated May 8, 2018, 11 pages.
International Preliminary Report on Patentability in International Application No. PCT/US2016/066073, dated Jul. 12, 2018, 7 pages.
International Search Report and Written Opinion in International Application No. PCT/US2018/020262, dated Jun. 6, 2018, 14 pages.
International Search Report and Written Opinion in International Application No. PCT/US2018/025949, dated Jul. 10, 2018, 14 pages.
International Search Report and Written Opinion in International Application No. PCT/US2018/027369, dated Jul. 31, 2018, 14 pages.
Fang et al., "An Integration PIN/MISS OEIC for High Current Photoreceiver Applications," IEEE Transactions on Electron Devices, Jan. 1997, 44(1):34-38.
Extended European Search Report in European Application No. 18189000.5. dated Apr. 2, 2019, 14 pages.
PCT International Search Report and Written Opinion in International Appln. PCT/US19/19167, dated May 14, 2019, 15 pages.
Extended European Search Report in European Application No. 181760315, dated Aug. 27, 2018, 6 pages.
Extended European Search Report in European Application No. 16828622, dated Sep. 7, 2018, 6 pages.
Fussum et al., "A Review of the Pinned Photodiode for CCD and CMOS Image Sensors," IEEE J. Electron Devices Soc. May 1, 2014, 2(3):33-43.
Gulden et al., "Novel optical distance sensor based on MSM technology." IEEE Sensors Journal. Oct. 2004, 4(5):612-8.
Place et al., "Rad tolerant CMOS image sensor based on hole collection 4T pixel pinned photodiode." IEEE Transactions on Nuclear Science. Dec. 6, 2012, 59(6):2888-93.
Tseng et al., "High-performance silicon-on-insulator grating coupler with completely vertical emission," Sep. 21, 2015, 23(19):24433-9.
PCT International Preliminary Report on Patentability in International Appln. No. PCT/US2018/020262, dated Sep. 3, 2019, 11 pages.
PCT International Preliminary Report on Patentability in International Appln. No. PCT/US2018/027369, dated Oct. 24, 2019, 15 pages.
Extended European Search Report in European Application No. 18783894.1-1211, dated Mar. 9, 2020, 6 pages.
Ramireza et al, "Recent progress on the quantum-dot avalanche photodiode," 22nd Annual Meeting of the IEEE Lasers and Electro-optics Society, Oct. 4, 2009, 2 pages.

* cited by examiner

FIG. 2

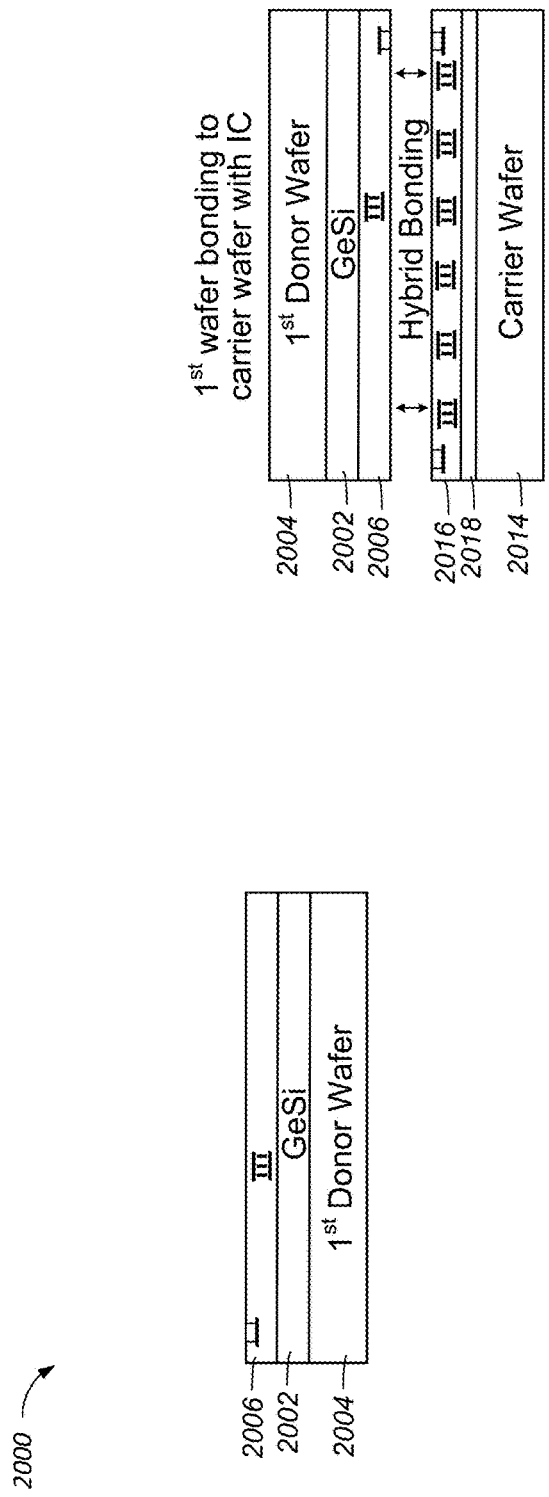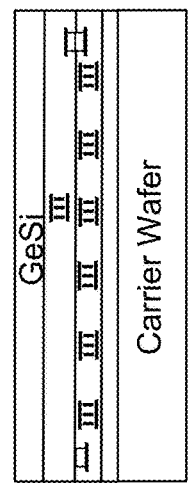

CIRCUIT FOR OPERATING A MULTI-GATE VIS/IR PHOTODIODE

CROSS-REFERENCE TO RELATED APPLICATIONS

This application is a continuation in part of U.S. application Ser. No. 15/228,282, filed on Aug. 4, 2016, which claims the right of priority to U.S. Provisional Application No. 62/271,386, filed on Dec. 28, 2015, U.S. Provisional Application No. 62/251,691, filed on Nov. 6, 2015, U.S. Provisional Application No. 62/217,031, filed on Sep. 11, 2015, U.S. Provisional Application No. 62/211,004, filed on Aug. 28, 2015, U.S. Provisional Application No. 62/210,991, filed on Aug. 28, 2015, U.S. Provisional Application No. 62/210,946, filed on Aug. 27, 2015, U.S. Provisional Application No. 62/209,349, filed on Aug. 25, 2015, and U.S. Provisional Application No. 62/200,652, filed on Aug. 4, 2015. This application claims the right of priority to U.S. Provisional Application No. 62/500,457, filed on May 2, 2017, U.S. Provisional Application No. 62/504,531, filed on May 10, 2017, U.S. Provisional Application No. 62/583,854, filed on Nov. 9, 2017, U.S. Provisional Application No. 62/485,003, filed on Apr. 13, 2017, U.S. Provisional Application No. 62/561,266, filed on Sep. 21, 2017, U.S. Provisional Application No. 62/613,054, filed on Jan. 3, 2018, U.S. Provisional Application No. 62/542,329, filed on Aug. 8, 2017, U.S. Provisional Application No. 62/643,295, filed on Mar. 15, 2018, and U.S. Provisional Application No. 62/651,085, filed on Mar. 31, 2018.

BACKGROUND

This specification relates to detecting light using a photodiode.

Light propagates in free space or an optical medium is coupled to a photodiode that converts an optical signal to an electrical signal for processing.

SUMMARY

A photodiode may be used to detect optical signals and convert the optical signals to electrical signals that may be further processed by another circuitry. Photodiodes may be used in consumer electronics products, image sensors, data communications, time-of-flight (TOF) applications, medical devices, and many other suitable applications. Conventionally, silicon is used as an image sensor material, but silicon has a low optical absorption efficiency for wavelengths in the near-infrared (NIR) spectrum or longer. Other materials and/or material alloys such as germanium and germanium-silicon may be used as image sensor materials with innovative optical device structure design described in this specification. According to one innovative aspect of the subject matter described in this specification, a photodiode is formed using materials such as germanium or germanium-silicon to increase the speed and/or the sensitivity and/or the dynamic range and/or the operating wavelength range of the device. In one embodiment, photodiodes formed using germanium or germanium-silicon and photodiodes formed using silicon may be integrated on a common substrate to yield a photodiode array having a greater operating wavelength range.

According to another innovative aspect of the subject matter described in this specification, light reflected from a three-dimensional object may be detected by photodiodes of an imaging system. The photodiodes convert the detected light into electrical charges. Each photodiode may include multiple gates that are controlled to collect the electrical charges. The collection of the electrical charges controlled by the multiple gates may be altered over time, such that the imaging system may determine the phase and other information of the sensed light. The imaging system may use the phase information to analyze characteristics associated with the three-dimensional object including depth information or a material composition. The imaging system may also use the phase information to analyze characteristics associated with eye-gesture recognition, body-gesture recognition, three-dimensional model scanning/video recording, and/or augmented/virtual reality applications.

In general, one innovative aspect of the subject matter described in this specification can be embodied in an optical apparatus that includes: a semiconductor substrate formed from a first material, the semiconductor substrate including a first n-doped region; and a photodiode supported by the semiconductor substrate, the photodiode including an absorption region configured to absorb photons and to generate photo-carriers from the absorbed photons, the absorption region being formed from a second material different than the first material and including: a first p-doped region; and a second n-doped region coupled to the first n-doped region, wherein a second doping concentration of the second n-doped region is less than or substantially equal to a first doping concentration of the first n-doped region.

Embodiments of the optical apparatus can include one or more of the following features. For example, the semiconductor substrate can be formed by bonding a first semiconductor layer and a second semiconductor layer. The first material can be silicon and the second material can include germanium.

In some embodiments, the first doping concentration of the first n-doped region can be substantially equal to 16 times the second doping concentration of the second n-doped region.

In some embodiments, the first and second doping concentrations can be set such that a first Fermi level of the first n-doped region and a second Fermi level of the second n-doped region are substantially equal.

In some embodiments, the first p-doped region can be arranged on a first surface of the absorption region, and the second n-doped region can be arranged on a second surface opposing the first surface.

In some embodiments, the first p-doped region and the second n-doped region can be arranged on a first surface of the absorption region.

In some embodiments, the semiconductor substrate can further include a recess, and at least a portion of the absorption region can be embedded in the recess. In some embodiments, the recess can include a sidewall spacer. In some embodiments, the first n-doped region can surround at least a portion of the recess. In some embodiments, the first n-doped region and the second n-doped region can be adjacent.

In some embodiments, the optical apparatus can further include a first metallic interconnect coupled to the first n-doped region and the second n-doped region.

In some embodiments, the optical apparatus can further include: one or more readout regions coupled to one or more readout circuits, the one or more readout regions configured to provide the photo-carriers generated by the photodiode to the one or more readout circuits; and one or more gates coupled to one or more control signals that control carrier transports between the photodiode and the one or more readout regions. The one or more readout regions and the one or more gates can be supported by the semiconductor substrate. The one or more readout regions can further include one or more floating-diffusion capacitors.

In some embodiments, the optical apparatus can further include: a lens supported by the semiconductor substrate. The lens can be integrally formed on the semiconductor substrate.

In some embodiments, the optical apparatus can further include: a spacer layer supported by the semiconductor substrate, wherein, in a direction normal to a substrate surface, the spacer layer is arranged between the absorption region and the lens. The spacer layer can have a thickness corresponding to a focal length of the lens.

In some embodiments, the optical apparatus can further include: an anti-reflection layer supported by the semiconductor substrate and arranged between the semiconductor substrate and the lens.

Another innovative aspect of the subject matter described in this specification can be embodied in an optical apparatus that includes: a semiconductor substrate formed from a first material and including a recess; and a photodiode supported by the semiconductor substrate, the photodiode including an absorption region configured to absorb photons and to generate photo-carriers from the absorbed photons, wherein the absorption region is formed from a second material different than the first material and at least a portion of the absorption region is embedded in the recess, and wherein the absorption region includes: a first p-doped region; a first n-doped region; a second n-doped region; and a first gate coupled to a first control signal and configured to control a carrier transport between the first n-doped region and the second n-doped region, wherein a first doping concentration of the first n-doped region is less than or substantially equal to a second doping concentration of the second n-doped region.

Another innovative aspect of the subject matter described in this specification can be embodied in an optical apparatus that includes: a first semiconductor substrate formed from a first material and including a recess; a photodiode supported by the first semiconductor substrate, the photodiode including an absorption region configured to absorb photons and to generate photo-carriers from the absorbed photons, wherein the absorption region is formed from a second material different than the first material and at least a portion of the absorption region is embedded in the recess, and wherein the absorption region includes: a first p-doped region; and a first n-doped region; a second semiconductor substrate formed from a third material different than the second material, the second semiconductor substrate including: a second n-doped region; one or more readout regions coupled to one or more readout circuits, the one or more readout regions configured to provide the photo-carriers generated by the photodiode to the one or more readout circuits; and one or more gates coupled to one or more control signals that control carrier transports between the photodiode and the one or more readout regions; and a metallic interconnect coupled to the first n-doped region and the second n-doped region, wherein a first doping concentration of the first n-doped region is less than or substantially equal to a second doping concentration of the second n-doped region.

Another innovative aspect of the subject matter described in this specification can be embodied in a circuit that includes: a photodiode configured to absorb photons and to generate photo-carriers from the absorbed photons; a first MOSFET transistor including: a first channel terminal coupled to a first terminal of the photodiode and configured to collect a portion of the photo-carriers generated by the photodiode; a second channel terminal; and a gate terminal coupled to a first control voltage source; a first readout circuit configured to output a first readout voltage, the first readout circuit including: a first capacitor configured to integrate the photo-carriers generated by the photodiode; and a first reset MOSFET transistor configured to charge the first capacitor to a first voltage; a second readout circuit configured to output a second readout voltage, the second readout circuit including: a second capacitor configured to integrate the photo-carriers generated by the photodiode; and a second reset MOSFET transistor configured to charge the second capacitor to a second voltage; and a current-steering circuit configured to steer the photo-carriers generated by the photodiode to one or both of the first readout circuit and the second readout circuit, the current-steering circuit including: a first current-steering MOSFET transistor including a second gate terminal coupled to a second control voltage source, a third channel terminal coupled to the second channel terminal, and a fourth channel terminal coupled to the first readout circuit; and a second current-steering MOSFET transistor including a third gate terminal coupled to a third control voltage source, a fifth channel terminal coupled to the second channel terminal, and a sixth channel terminal coupled to the second readout circuit, wherein, during operation of the circuit, the first control voltage source generates a first control voltage configured to create a first voltage difference between the first voltage and a third voltage of the first terminal of the photodiode, and to create a second voltage difference between the second voltage and the third voltage of the first terminal of the photodiode.

Embodiments of the circuit can include one or more of the following features. For example, the circuit can further include a first semiconductor layer and a second semiconductor layer, wherein the photodiode is supported by the first semiconductor layer, and the first MOSFET transistor, the first readout circuit, the second readout circuit, and the current-steering circuit are supported by the second semiconductor layer.

In some embodiments, the circuit can further include a first semiconductor layer and a second semiconductor layer, wherein the photodiode and the first MOSFET transistor are supported by the first semiconductor layer, and the first readout circuit, the second readout circuit, and the current-steering circuit are supported by the second semiconductor layer.

In some embodiments, the circuit can further include a first semiconductor layer and a second semiconductor layer, wherein the photodiode, the first MOSFET transistor, and the current-steering circuit are supported by the first semiconductor layer, and the first readout circuit and the second readout circuit are supported by the second semiconductor layer.

In some embodiments, during operation of the circuit, the first control voltage can be configured to operate the first MOSFET transistor in a subthreshold region or a saturation region.

In some embodiments, the first voltage difference can be greater than or equal to 10% of the first voltage, and the second voltage difference can be greater than or equal to 10% of the second voltage.

In some embodiments, during operation of the circuit, the first control voltage source can reduce a first dark current integrated by the first capacitor and a second dark current integrated by the second capacitor relative to a comparable circuit without the first MOSFET transistor.

In some embodiments, the photodiode can further include a light absorption region including germanium.

In some embodiments, the photodiode can further include a recess, and at least a portion of the light absorption region can be embedded in the recess.

In some embodiments, during operation of the circuit, the second control voltage source and the third control voltage source can be controlled to operate the circuit in a time-of-flight imaging mode by steering the photo-carriers to the first readout circuit for a first period, and steering the photo-carriers to the second readout circuit for a second period.

In some embodiments, during operation of the circuit, the second control voltage source and the third control voltage source can be controlled to operate the circuit in an intensity imaging mode by steering the photo-carriers to the first readout circuit and the second readout circuit in a synchronous manner.

In some embodiments, during operation of the circuit, the second control voltage source and the third control voltage source can be controlled to operate the circuit in an intensity imaging mode by steering the photo-carriers to one of the first readout circuit and the second readout circuit while operating in the intensity imaging mode.

Another innovative aspect of the subject matter described in this specification can be embodied in a circuit that includes: a photodiode configured to absorb photons and to generate photo-carriers from the absorbed photons; a first readout circuit configured to output a first readout voltage, the first readout circuit including: a first capacitor configured to integrate the photo-carriers generated by the photodiode; and a first reset MOSFET transistor configured to charge the first capacitor to a first voltage; a second readout circuit configured to output a second readout voltage, the second readout circuit including: a second capacitor configured to integrate the photo-carriers generated by the photodiode; and a second reset MOSFET transistor configured to charge the second capacitor to a second voltage; a first MOSFET transistor including: a first channel terminal; a second channel terminal coupled to the first readout circuit; and a first gate terminal coupled to a first control voltage source; a second MOSFET transistor including: a third channel terminal; a fourth channel terminal coupled to the second readout circuit; and a second gate terminal coupled to the first control voltage source; and a current-steering circuit configured to steer the photo-carriers generated by the photodiode to one or both of the first readout circuit and the second readout circuit, the current-steering circuit including: a first current-steering MOSFET transistor including a third gate terminal coupled to a second control voltage source, a fifth channel terminal coupled to a first terminal of the photodiode and configured to collect a portion of the photo-carriers generated by the photodiode, and a sixth channel terminal coupled to the first channel terminal; and a second current-steering MOSFET transistor including a fourth gate terminal coupled to a third control voltage source, a seventh channel terminal coupled to the first terminal of the photodiode and configured to collect a portion of the photo-carriers generated by the photodiode, and an eighth channel terminal coupled to the third channel terminal, wherein, during operation of the circuit, the first control voltage source generates a first control voltage configured to create a first voltage difference between the first voltage and a third voltage of the first terminal of the photodiode, and to create a second voltage difference between the second voltage and the third voltage of the first terminal of the photodiode.

Embodiments of the circuit can include one or more of the following features. For example, the circuit can further include a first semiconductor layer and a second semiconductor layer, wherein the photodiode is supported by the first semiconductor layer, and the first MOSFET transistor, the second MOSFET transistor, the first readout circuit, the second readout circuit, and the current-steering circuit are supported by the second semiconductor layer.

In some embodiments, the circuit can further include a first semiconductor layer and a second semiconductor layer, wherein the photodiode and the current-steering circuit are supported by the first semiconductor layer, and the first readout circuit, the second readout circuit, the first MOSFET transistor, and the second MOSFET transistor are supported by the second semiconductor layer.

In some embodiments the circuit can further include a first semiconductor layer and a second semiconductor layer, wherein the photodiode, the current-steering circuit, the first MOSFET transistor, and the second MOSFET transistor are supported by the first semiconductor layer, and the first readout circuit and the second readout circuit are supported by the second semiconductor layer.

In some embodiments, during operation of the circuit, the first control voltage can be configured to operate the first MOSFET transistor and the second MOSFET transistor in a subthreshold region or a saturation region.

In some embodiments, the first voltage difference can be greater than or equal to 10% of the first voltage, and the second voltage difference can be greater than or equal to 10% of the second voltage.

In some embodiments, during operation of the circuit, the first control voltage source can reduce a first dark current integrated by the first capacitor and a second dark current integrated by the second capacitor relative to a comparable circuit without the first MOSFET transistor and the second MOSFET transistor.

In some embodiments, during operation of the circuit, the second control voltage source and the third control voltage source can be controlled to operate the circuit in a time-of-flight imaging mode by steering the photo-carriers to the first readout circuit for a first period, and steering the photo-carriers to the second readout circuit for a second period.

In some embodiments, during operation of the circuit, the second control voltage source and the third control voltage source can be controlled to operate the circuit in an intensity imaging mode by steering the photo-carriers to the first readout circuit and the second readout circuit in a synchronous manner.

In some embodiments, during operation of the circuit, the second control voltage source and the third control voltage source can be controlled to operate the circuit in an intensity imaging mode by steering the photo-carriers to one of the first readout circuit and the second readout circuit while operating in the intensity imaging mode.

Another innovative aspect of the subject matter described in this specification can be embodied in a circuit that includes: a photodiode configured to absorb photons and to generate photo-carriers from the absorbed photons; a first readout circuit configured to output a first readout voltage, the first readout circuit including: a first capacitor configured to integrate the photo-carriers generated by the photodiode; and a first reset MOSFET transistor configured to charge the first capacitor to a first voltage; a second readout circuit configured to output a second readout voltage, the second readout circuit including: a second capacitor configured to integrate the photo-carriers generated by the photodiode; and a second reset MOSFET transistor configured to charge the second capacitor to a second voltage; and a current-steering circuit configured to steer the photo-carriers generated by the photodiode to one or both of the first readout circuit and the second readout circuit, the current-steering circuit including: a first current-steering MOSFET transistor including a first gate terminal coupled to a first control voltage source, a first channel terminal coupled to a first terminal of the photodiode and configured to collect a portion of the photo-carriers generated by the photodiode, and a second channel terminal coupled to the first readout circuit; and a second current-steering MOSFET transistor including a second gate terminal coupled to a second control voltage source, a third channel terminal coupled to the first terminal of the photodiode and configured to collect a portion of the photo-carriers generated by the photodiode, and a fourth channel terminal coupled to the second readout circuit, wherein, during operation of the circuit, the first control voltage source generates a first control voltage configured to create a first voltage difference between the first voltage and a third voltage of the first terminal of the photodiode, and the second control voltage source generates a second control voltage configured to create a second voltage difference between the second voltage and the third voltage of the first terminal of the photodiode.

Embodiments of the circuit can include one or more of the following features. For example, the circuit can further include a first semiconductor layer and a second semiconductor layer, wherein the photodiode is supported by the first semiconductor layer, and the first readout circuit, the second readout circuit, and the current-steering circuit are supported by the second semiconductor layer.

In some embodiments, the circuit can further include a first semiconductor layer and a second semiconductor layer, wherein the photodiode and the current-steering circuit are supported by the first semiconductor layer, and the first readout circuit and the second readout circuit are supported by the second semiconductor layer.

In some embodiments, during operation of the circuit, the first control voltage can be configured to operate the first current-steering MOSFET transistor in a subthreshold region or a saturation region, and the second control voltage can be configured to operate the second current-steering MOSFET transistor in the subthreshold region or the saturation region.

In some embodiments, the first voltage difference can be greater than or equal to 10% of the first voltage, and the second voltage difference can be greater than or equal to 10% of the second voltage.

In some embodiments, during operation of the circuit, the first control voltage source and the second control voltage source can be controlled to operate the circuit in a time-of-flight imaging mode by steering the photo-carriers to the first readout circuit for a first period, and steering the photo-carriers to the second readout circuit for a second period.

In some embodiments, during operation of the circuit, the first control voltage source and the second control voltage source can be controlled to operate the circuit in an intensity imaging mode by steering the photo-carriers to the first readout circuit and the second readout circuit in a synchronous manner.

In some embodiments, during operation of the circuit, the first control voltage source and the second control voltage source can be controlled to operate the circuit in an intensity imaging mode by steering the photo-carriers to one of the first readout circuit and the second readout circuit while operating in the intensity imaging mode.

Advantageous implementations may include one or more of the following features. Germanium is an efficient absorption material for near-infrared wavelengths, which reduces the problem of slow photo-carriers generated at a greater substrate depth when an inefficient absorption material, e.g., silicon, is used. An increased device bandwidth allows the use of a higher modulation frequency in an optical sensing system, giving advantages such as a greater depth resolution. A germanium-silicon alloy material as the optical absorption layer with innovative design provides higher optical absorption efficiency over conventional Si material, which may provide a more sensitive sensor in the visible and near-infrared spectrums, may reduce crosstalk between neighboring pixels, and may allow for a reduction of pixel sizes. A hybrid sensor design may support time-of-flight (TOF), near-infrared, and visible image sensing within the same sensing array. An increased device bandwidth allows the use of a higher modulation frequency in a time-of-flight system, giving a greater depth resolution. In a time-of-flight system where the peak intensity of optical pulses is increased while the duty cycle of the optical pulses is decreased, the signal-to-noise ratio can be improved while maintaining substantially the same power consumption for the time-of-flight system. This is made possible when the device bandwidth is increased so that the duty cycle of the optical pulses can be decreased without distorting the pulse shape.

The details of one or more implementations are set forth in the accompanying drawings and the description below. Other potential features and advantages will become apparent from the description, the drawings, and the claims.

BRIEF DESCRIPTION OF THE DRAWINGS

FIG. 2 is an example of a photodiode array.

FIGS. 20A-20F illustrate an example design for fabricating a photodiode array.

Like reference numbers and designations in the various drawings indicate like elements. It is also to be understood that the various exemplary embodiments shown in the figures are merely illustrative representations and are not necessarily drawn to scale.

DETAILED DESCRIPTION

Photodiodes may be used to detect optical signals and convert the optical signals to electrical signals that may be further processed by another circuitry. In general, a material absorbs light at various wavelengths to generate free carriers depending on an energy bandgap associated with the material. For example, at room temperature, silicon may have an energy bandgap of 1.12 eV, germanium may have an energy bandgap of 0.66 eV, and a germanium-silicon alloy may have an energy bandgap between 0.66 eV and 1.12 eV depending on the composition. In general, a material having a lower energy bandgap has a higher absorption coefficient at a particular wavelength. If the absorption coefficient of a material is too low, the optical signal cannot be converted to an electrical signal efficiently. However, if the absorption coefficient of a material is too high, free carriers will be generated near the surface of the material, which may be recombined to reduce efficiency. Silicon is not an efficient sensor material for NIR wavelengths due to its large bandgap. On the other hand, germanium has an absorption coefficient that may be too high for shorter wavelengths (e.g., blue), where free carriers may recombine at the surface. A photodiode array that integrates silicon and germanium/germanium-silicon on a common substrate, where a photodiode array uses silicon to detect visible light and uses germanium or germanium-silicon to detect NIR light, would enable the photodiode array to have a wide detection spectrum. In this application, the term "photodiode" may be used interchangeably as the term "photodetector" or the term "optical sensor". In this application, the term "germanium-silicon (GeSi)", "silicon-germanium (SiGe)" may be used interchangeably, and both include all suitable SiGe composition combinations from more than 90% germanium (Ge) to more than 90% silicon (Si). In this application, the GeSi layer may be formed using blanket epitaxy, selective epitaxy, or other applicable technique. Furthermore, a strained super lattice structure including multiple layers such as alternating SiGe layer with different compositions may be used for the absorption or forming a quantum well structure.

Figure 1:
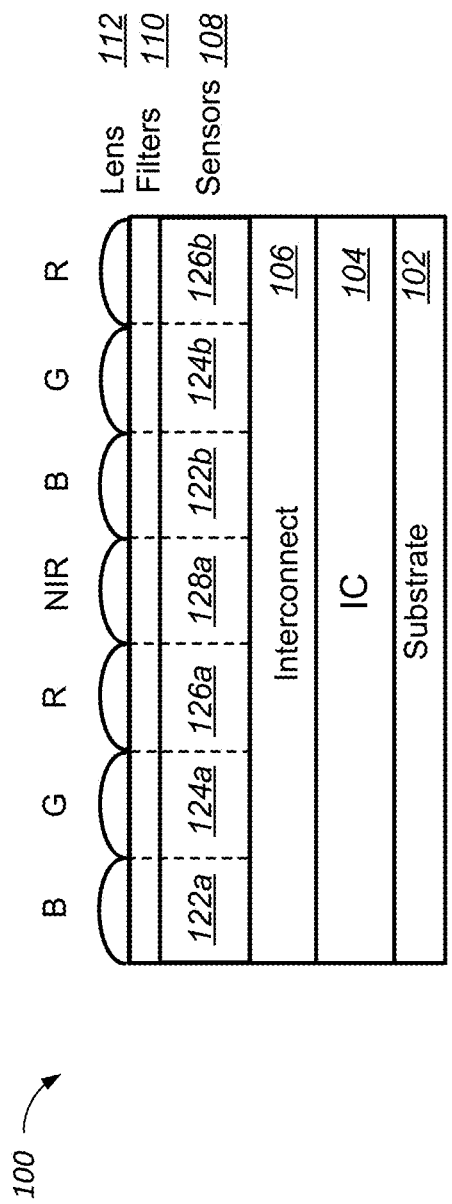
FIG. 1 is an example of a photodiode array.

FIG. 1 is an example a photodiode array 100 where germanium or germanium-silicon photodiodes are integrated with silicon photodiodes. An optical image sensor array is an example of a photodiode array. The photodiode array 100 includes a substrate 102, an integrated circuit layer 104, an interconnect layer 106, a sensor layer 108, a filter layer 110, and a lens layer 112. In general, light of a single wavelength or multiple wavelengths enters the lens layer 112, where the light may be focused, collimated, expanded, or processed according to the lens design. The light then enters the filter layer 110, where the filter layer 110 may be configured to pass light having a specific wavelength range. The photodiodes in the sensor layer 108 converts the incident light into free carriers. The integrated circuit layer 104 collects the free carriers through the interconnect layer 106 and processes the free carriers according to the specific application.

In general, the substrate 102 may be a silicon substrate, a silicon-on-insulator (SOI) substrate, or any other suitable carrier substrate materials. The integrated circuits of the integrated circuit layer 104 and the interconnects of the interconnect layer 106 may be fabricated using CMOS processing techniques. For example, the interconnects may be formed by dry-etching a contact hole through a dielectric layer and filling the contact hole by a copper using chemical vapor deposition (CVD). Furthermore, the shape of the lens could be concave, convex, planar with surface structure, or other shapes, and its shape should not be limited by the exemplary drawings here.

The sensor layer 108 includes multiple groups of photodiodes for detecting light of different wavelength ranges. For example, a group of photodiodes that includes photodiodes 122a, 122b, and others not shown in this figure may be configured to detect light of a blue wavelength range (e.g., 460 nm±40 nm). As another example, a group of photodiodes that includes photodiodes 124a, 124b, and others not shown in this figure may be configured to detect light of a green wavelength range (e.g., 540 nm±40 nm). As another example, a group of photodiodes that includes photodiodes 126a, 126b, and others not shown in this figure may be configured to detect light of a red wavelength range (e.g., 620 nm±40 nm). As another example, a group of photodiodes that includes photodiode 128a and others not shown in this figure may be configured to detect light of a NIR wavelength range (e.g., 850 nm±40 nm, 940 nm±40 nm, or >1 µm). Each photodiode may be isolated by insulating sidewall spacers, trenches, or other suitable isolation structures.

In some implementations, the wavelength range that a photodiode is configured to detect may be controlled by an optical filter in the filter layer 110. For example, the photodiode 126a is configured to receive a red wavelength range, where the center wavelength and the limits of the wavelength range are controlled by the characteristics of the filter above the photodiode 126a. A filter may be formed by depositing layers of dielectric materials, such that light having a wavelength within a specific wavelength range would pass through the filter and light having a wavelength outside the specific wavelength range would be reflected by the filter. A filter may also be formed by forming a layer of a material on the photodiode, such that light having a wavelength within a specific wavelength range would pass through the filter and light having a wavelength outside the specific wavelength range would be absorbed by the filter. For example, a silicon layer may be formed on a germanium-silicon photodiode, where the silicon layer absorbs visible light but is transparent to NIR light.

In some implementations, the wavelength range that a photodiode is configured to detect may be controlled by a material composition of the photodiode. For example, an increase in germanium composition in a germanium-silicon alloy may increase the sensitivity of the photodiode at longer wavelengths. In some implementations, the wavelength range that a photodiode is configured to detect may be controlled by a combination of the optical filter and the material composition of the photodiode.

In some implementations, the groups of photodiodes that are configured to detect visible light (e.g., red, green, and blue) may be silicon photodiodes, while the group of photodiodes that are configured to detect NIR light may be germanium photodiodes or germanium-silicon photodiodes.

In some other implementations, one or more groups of photodiodes that are configured to detect visible light (e.g., green and blue) may be silicon photodiodes, while one or more other groups of photodiodes that are configured to detect visible light (e.g., red) and the group of photodiodes that are configured to detect NIR light may be germanium photodiodes or germanium-silicon photodiodes. For example, the group of photodiodes that detect red light may be germanium-silicon photodiodes having a lower germanium concentration than the germanium-silicon photodiodes in the group of photodiodes that detect NIR light. In some implementations, the germanium concentration may range from 10% to 100%. As another example, the group of photodiodes that detect red light may be germanium-silicon photodiodes having a different thickness from the germanium-silicon photodiodes in the group of photodiodes that detect NIR light.

Figure 2:
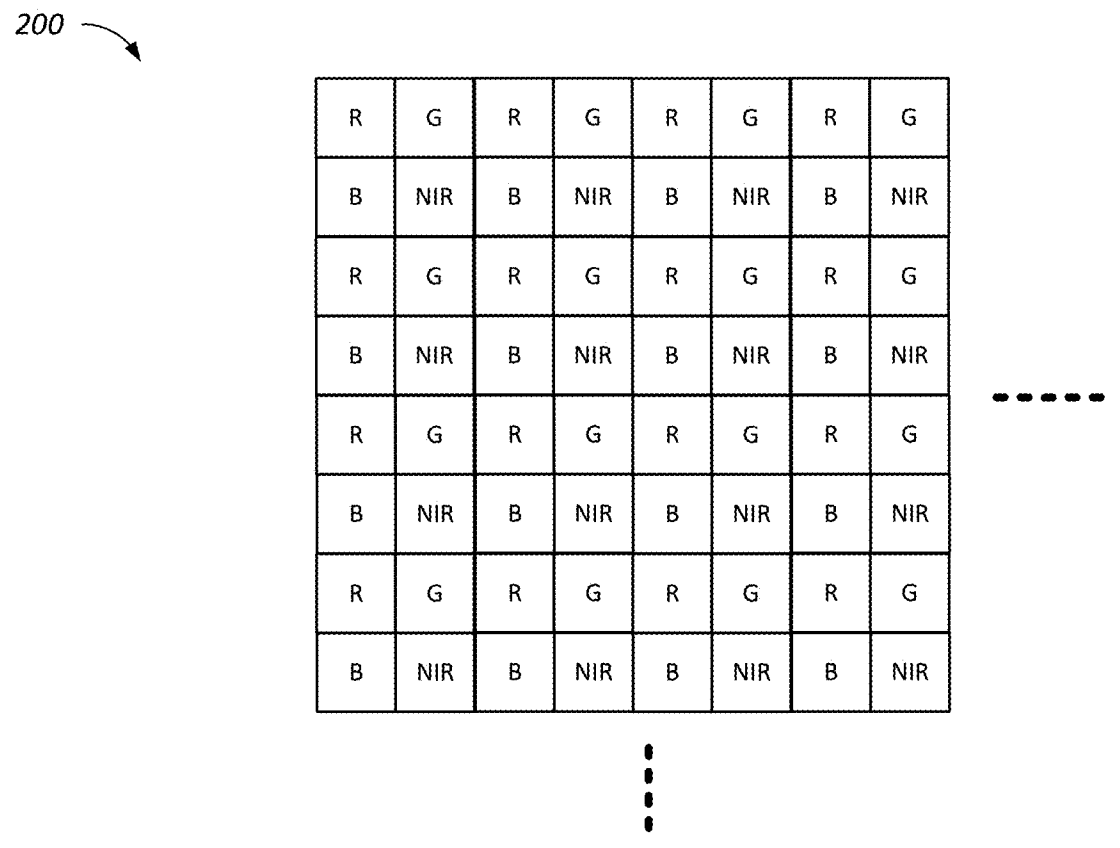

FIG. 2 is an example photodiode array 200 that shows a top view of a two-dimensional photodiode array, where germanium or germanium-silicon photodiodes are integrated with silicon photodiodes. The photodiodes in the photodiode array 200 are similar to the photodiodes described in the photodiode array 100. The photodiodes of the photodiode array 200 are arranged as pixels. In some implementations, silicon photodiodes are formed as pixels for detecting visible light, and germanium or germanium-silicon photodiodes are embedded in the silicon as pixels for detecting NIR light. In some other implementations, silicon photodiodes are formed as pixels for detecting blue and green light, and germanium or germanium-silicon photodiodes are embedded in the silicon as pixels for detecting red and NIR light.

Figure 3:
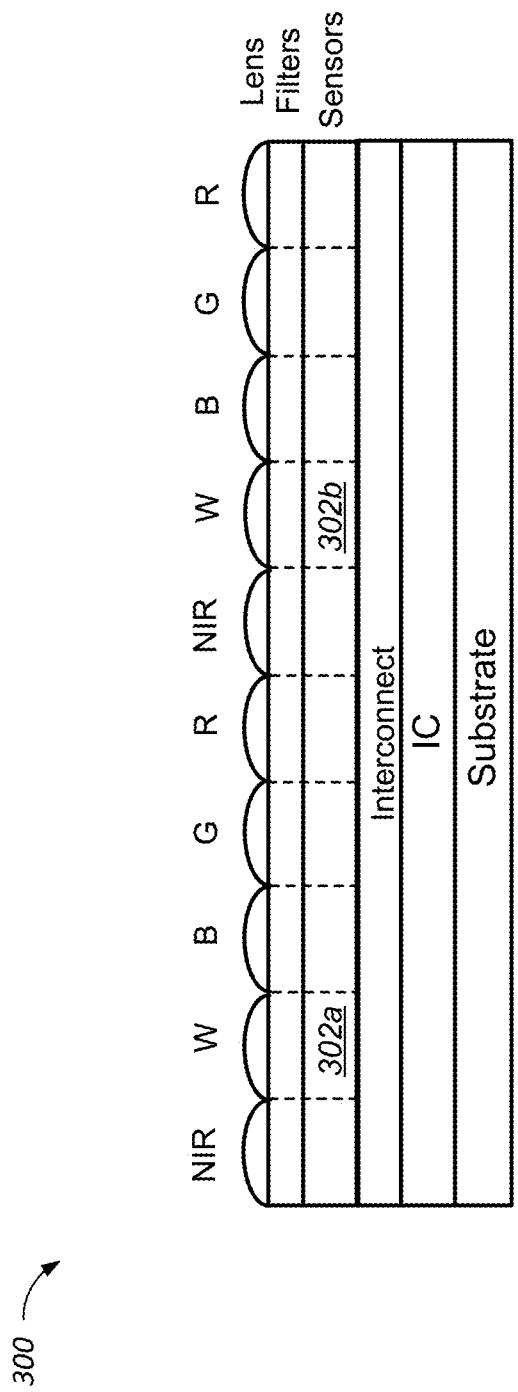
FIG. 3 is an example of a photodiode array.

FIG. 3 is an example photodiode array 300, where germanium or germanium-silicon photodiodes are integrated with silicon photodiodes. The photodiodes in the photodiode array 300 are similar to the photodiodes described in the photodiode array 100. In addition, the photodiode array 300 includes a group of photodiodes 302a, 302b, and others not shown in this figure that are configured to detect light of a white wavelength range (e.g., 420 nm to 660 nm). In some implementations, the photodiodes 302a and 302b may be silicon photodiodes. In some other implementations, the photodiodes 302a and 302b may be germanium or germanium-silicon photodiodes to improve the overall light absorption of the diodes. For example, the group of photodiodes that detect white light may be germanium-silicon photodiodes having a lower germanium concentration than the germanium-silicon photodiodes in the group of photodiodes that detect NIR light. As another example, the group of photodiodes that detect white light may be germanium-silicon photodiodes having a different thickness from the germanium-silicon photodiodes in the group of photodiodes that detect NIR light.

Figure 4A:
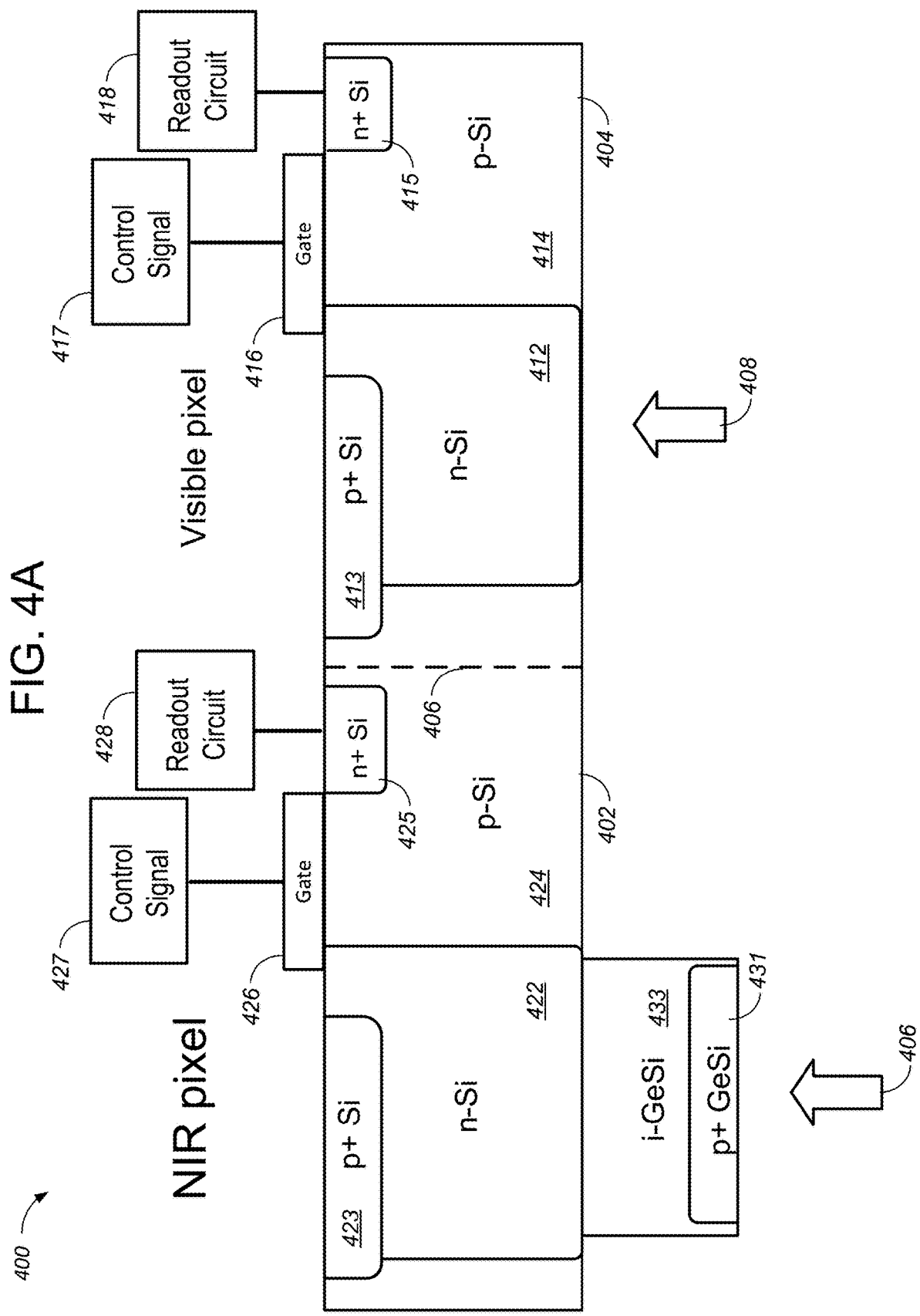
FIGS. 4A and 4B are examples of a photodiode for detecting visible and infrared light.

FIG. 4A illustrates example photodiodes 400 for detecting visible and infrared optical signals. The example photodiodes 400 includes an NIR pixel 402 and a visible pixel 404 that are formed on a common substrate. The NIR pixel 402 and the visible pixel 404 are separated by an isolation structure 406. The NIR pixel 402 is configured to detect an optical signal having a wavelength in the NIR range. The visible pixel 404 is configured to detect an optical signal having a wavelength in the visible range (e.g., blue and/or green and/or red). The NIR pixel 402 and the visible pixel 404 may be photodiodes in the sensor layer 108 as described in reference to FIG. 1, for example.

The visible pixel 404 includes an n-Si region 412, a p+ Si region 413, a p-Si region 414, an n+ Si region 415, a first gate 416, a first control signal 417 coupled to the first gate 416, and a readout circuit 418 coupled to the n+ Si region 415. The n-Si region 412 may be lightly doped with an n-dopant, e.g., about $10^{16}$ cm$^{-3}$ with phosphorus. The p+ Si region 413 may have a p+ doping, where the activated dopant concentration is as high as a fabrication process may achieve, e.g., about $5\times10^{20}$ cm$^{-3}$ with boron. The p-Si region 414 may be lightly doped with a p-dopant, e.g., about $10^{15}$ cm$^{-3}$ with boron. The n+ Si region 415 may have an n+ doping, where the activated dopant concentration is as high as a fabrication process may achieve, e.g., about $5\times10^{20}$ cm$^{-3}$ with phosphorous.

In general, the n-Si layer 412 receives an optical signal 408 and converts the optical signal 408 into electrical signals. The optical signal 408 enters the n-Si region 412, where the n-Si region 412 absorbs the optical signal 408 and converts the absorbed light into free carriers. In some implementations, the optical signal 408 may be filtered by a wavelength filter not shown in this figure, such as a filter in the filter layer 110 as described in reference to FIG. 1. In some implementations, a beam profile of the optical signal 408 may be shaped by a lens not shown in this figure, such as a lens in the lens layer 112 as described in reference to FIG. 1.

In general, a difference between the Fermi level of the p+ Si region 413 and the Fermi level of the n-Si region 412 creates an electric field between the two regions, where free electrons generated by the n-Si region 412 are drifted to a region below the p+ Si region 413 by the electric field. The first gate 416 may be coupled to the first control signal 417. For example, the first gate 416 may be coupled to a voltage source, where the first control signal 417 may be a DC voltage signal from the voltage source. The first control signal 417 controls a flow of free electrons from the region below the p+ Si region 413 to the n+ Si region 415. For example, if a voltage of the control signal 417 exceeds a threshold voltage, free electrons accumulated in the region below the p+ Si region 413 will drift to the n+ Si region 415.

The n+ Si region 415 may be coupled to the first readout circuit 418. The first readout circuit 418 may be in a three-transistor configuration consisting of a reset gate, a source-follower, and a selection gate, or any suitable circuitry for processing free carriers. In some implementations, the first readout circuit 418 may be fabricated on a substrate that is common to the visible pixel 404. For example, the first readout circuit 418 may be fabricated on the integrated circuit layer 104 as described in reference to FIG. 1. In some other implementations, the first readout circuit 418 may be fabricated on another substrate and co-packaged with the visible pixel 404 via die/wafer bonding or stacking.

The NIR pixel 402 includes an n-Si region 422, a p+ Si region 423, a p-Si region 424, an n+ Si region 425, a second gate 426, a second control signal 427 coupled to the second gate 426, a second readout circuit 428 coupled to the n+ Si region 425, a p+ GeSi region 431, and an intrinsic GeSi region 433. The n-Si region 422 may be lightly doped with an n-dopant, e.g., about $10^{16}$ cm$^{-3}$ with phosphorus. The p+ Si region 423 may have a p+ doping, where the activated dopant concentration is as high as a fabrication process may achieve, e.g., about $5\times10^{20}$ cm$^{-3}$ with boron. The p-Si region 424 may be lightly doped with a p-dopant, e.g., about $10^{15}$ cm$^{-3}$ with boron. The n+ Si region 425 may have an n+ doping, where the activated dopant concentration is as high as a fabrication process may achieve, e.g., about $5\times10^{20}$ cm$^{-3}$ with phosphorous.

In general, the intrinsic GeSi region 433 receives an optical signal 406 and converts the optical signal 406 into electrical signals. In some implementations, the optical signal 406 may be filtered by a wavelength filter not shown in this figure, such as an NIR filter in the filter layer 110 as described in reference to FIG. 1. In some implementations, a beam profile of the optical signal 406 may be shaped by a lens not shown in this figure, such as a lens in the lens layer 112 as described in reference to FIG. 1.

In some implementations, a thickness of the intrinsic GeSi region 433 may be between 0.05 µm to 2 µm. In some implementations, the intrinsic GeSi region 433 may include a p+ GeSi region 431. The p+ GeSi region 431 may repel the photo-electrons away from the intrinsic GeSi region 433 to avoid surface recombination and thereby may increase the carrier collection efficiency. For example, the p+ GeSi region 431 may have a p+ doping, where the dopant concentration is as high as a fabrication process may achieve, e.g., about $5\times10^{20}$ cm$^{-3}$ when the intrinsic GeSi region 433 is germanium and doped with boron.

The generated free carriers in the intrinsic GeSi region 433 may drift or diffuse into the n-Si region 422. In general, a difference between the Fermi level of the p+ Si region 423 and the Fermi level of the n-Si region 422 creates an electric field between the two regions, where free electrons collected from the intrinsic GeSi region 433 by the n-Si region 422 are drifted to a region below the p+ Si region 423 by the electric field. The second gate 426 may be coupled to the second control signal 427. For example, the second gate 426 may be coupled to a voltage source, where the second control signal 427 may be a DC voltage signal from the voltage source. The second control signal 427 controls a flow of free electrons from the region below the p+ Si region 423 to the n+ Si region 425. For example, if a voltage of the second control signal 427 exceeds a threshold voltage, free electrons accumulated in the region below the p+ Si region 423 will drift to the n+ Si region 425. The n+ Si region 425 may be coupled to the second readout circuit 428. The second readout circuit 428 may be similar to the first readout circuit 418.

Although not shown in FIG. 4A, in some other implementations, the visible pixel 404 and the NIR pixel 402 may alternatively be fabricated to collect holes instead of electrons. In this case, the p+ Si regions 413 and 423 would be replaced by n+ Si regions, the n-Si regions 412 and 413 would be replaced by p-Si regions, the p-Si regions 414 and 424 would be replaced by n-Si regions, and the n+ Si region 415 and 425 would be replaced by p+ Si regions. Note that the drawings shown here are for illustration and working principle explanation purpose.

Figure 4B:
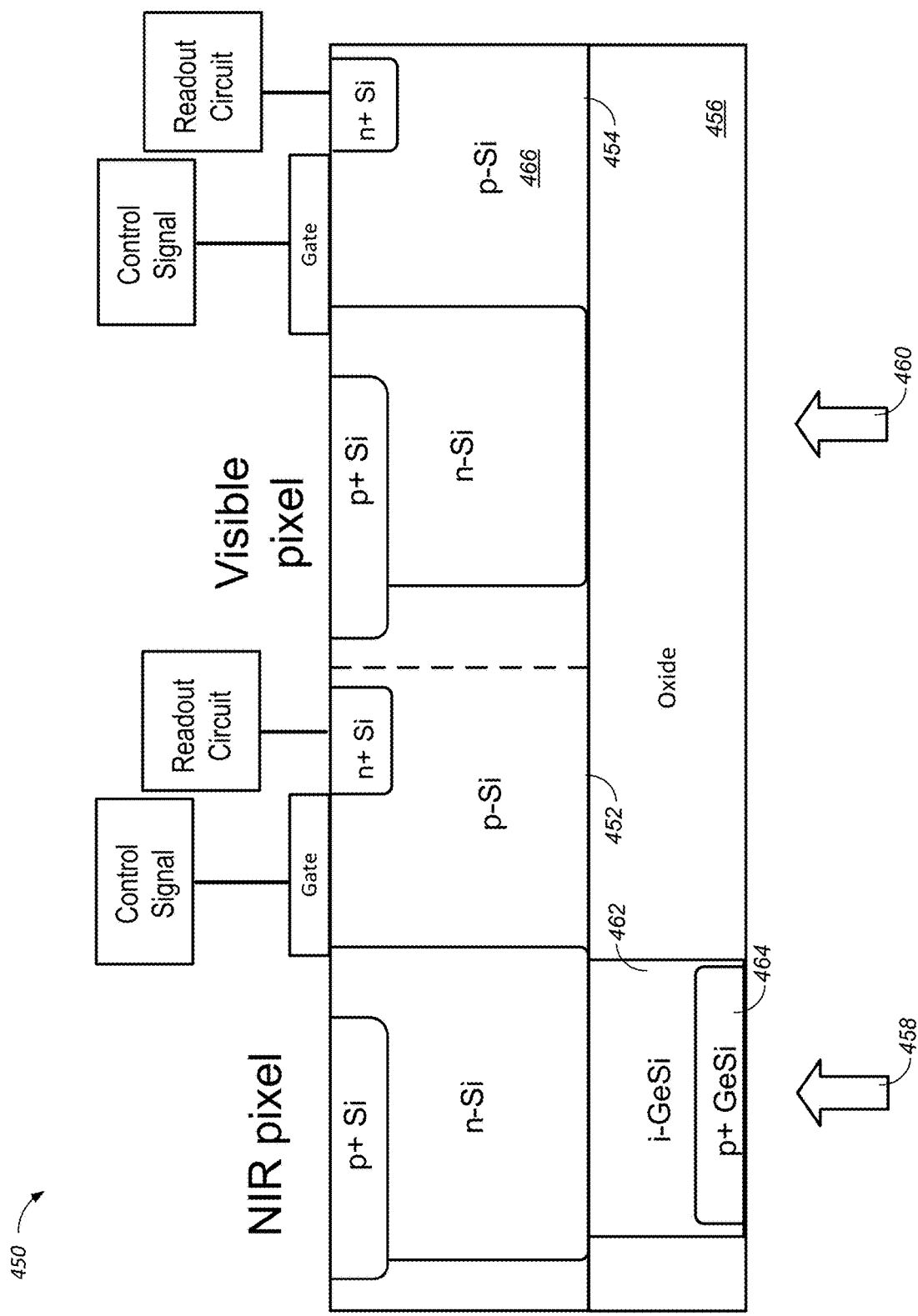

FIG. 4B illustrates example photodiodes 450 for detecting visible and infrared optical signals. The photodiodes 450 includes a visible pixel 454 and an NIR pixel 452. The visible pixel 454 is similar to the visible pixel 404 as described in reference to FIG. 4A. The NIR pixel 452 is similar to the NIR pixel 402 as described in reference to FIG. 4A. Here, the surface of the visible pixel 454 and the NIR pixel 452 that receive optical signals 458 and 460 is a planarized surface, where the intrinsic GeSi region 462 and the p+ GeSi region 464 are embedded in an oxide layer 456. For example, the oxide layer 456 may be formed on the p-Si region 466. A thickness of the oxide layer 456 may be selected to be the thickness of the intrinsic GeSi region 462. A sensor region may be formed in the oxide layer 456 by etching or any other suitable techniques. Germanium-silicon may be selectively grown in the sensor region to form the intrinsic GeSi region 462. A planarized surface between the visible pixel 454 and the NIR pixel 452 enables additional processing on the photodiode surface and/or bonding with devices fabricated on a separate substrate.

Figure 5:
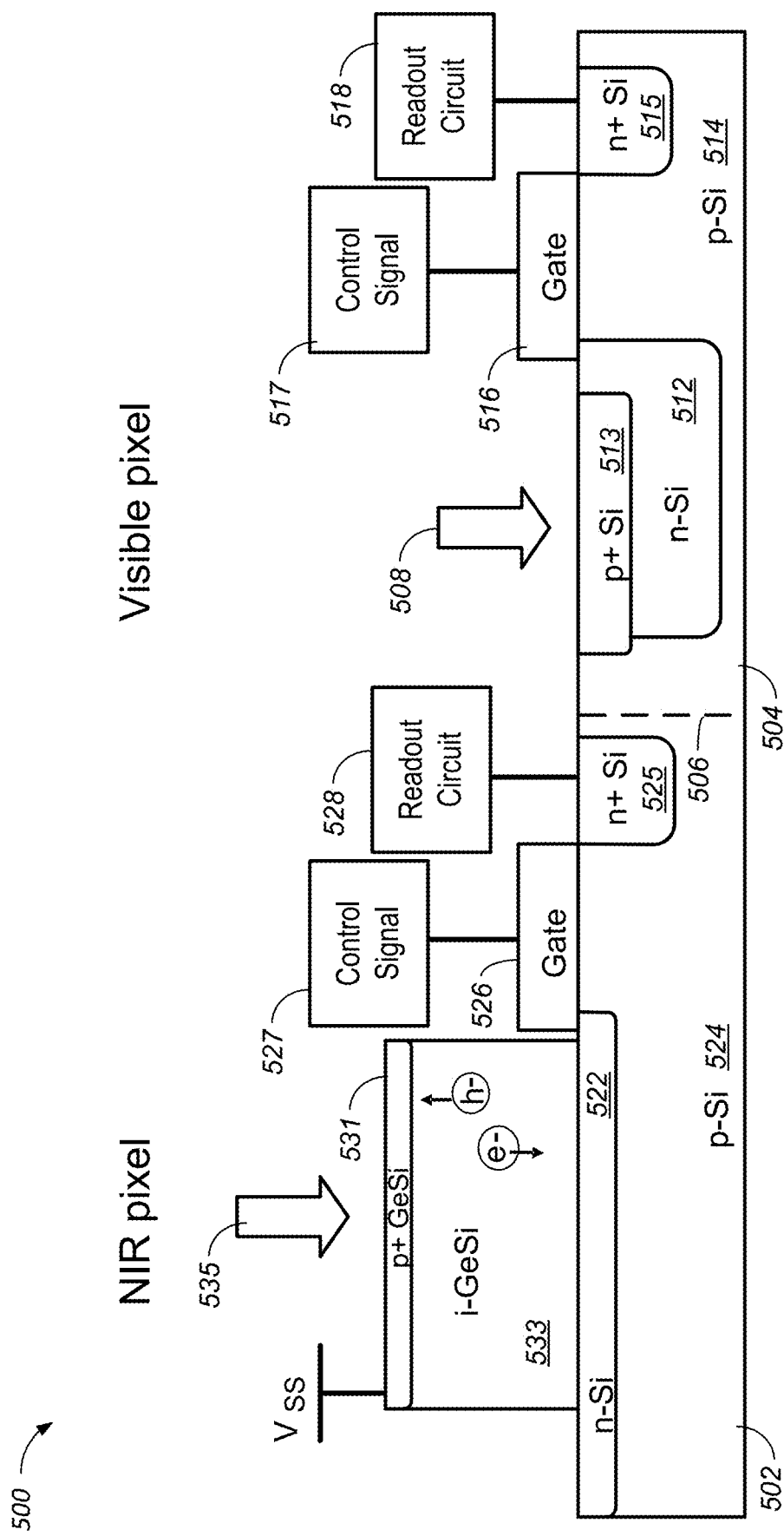
FIG. 5 is an example of a photodiode for detecting visible and infrared light.

FIG. 5 illustrates example photodiodes 500 for detecting visible and infrared optical signals. The example photodiodes 500 includes an NIR pixel 502 and a visible pixel 504 that are formed on a common substrate. The NIR pixel 502 and the visible pixel 504 are separated by an isolation structure 506. The NIR pixel 502 is configured to detect an optical signal having a wavelength in the NIR range. The visible pixel 504 is configured to detect an optical signal having a wavelength in the visible range (e.g., blue and/or green and/or red). The NIR pixel 502 and the visible pixel 504 may be photodiodes in the sensor layer 108 as described in reference to FIG. 1, for example.

The visible pixel 504 includes an n-Si region 512, a p+ Si region 513, a p-Si region 514, an n+ Si region 515, a first gate 516, a first control signal 517 coupled to the first gate 516, and a readout circuit 518 coupled to the n+ Si region 515. The n-Si region 512 may be lightly doped with an n-dopant, e.g., about $10^{16}$ cm$^{-3}$ with phosphorus. The p+ Si region 513 may have a p+ doping, where the activated dopant concentration is as high as a fabrication process may achieve, e.g., about $5\times10^{20}$ cm$^{-3}$ with boron. The p-Si region 514 may be lightly doped with a p-dopant, e.g., about $10^{15}$ cm$^{-3}$ with boron. The n+ Si region 515 may have an n+ doping, where the activated dopant concentration is as high as a fabrication process may achieve, e.g., about $5\times10^{20}$ cm$^{-3}$ with phosphorous.

In general, the p+ Si layer 513 receives an optical signal 508. Since the thickness of the p+ Si layer 513 is generally thin (e.g., 100 nm), the optical signal 508 propagates into the n-Si region 512, where the n-Si region 512 absorbs the optical signal 508 and converts the optical signal 508 into free carriers. In some implementations, the optical signal 508 may be filtered by a wavelength filter not shown in this figure, such as a filter in the filter layer 110 as described in reference to FIG. 1. In some implementations, a beam profile of the optical signal 508 may be shaped by a lens not shown in this figure, such as a lens in the lens layer 112 as described in reference to FIG. 1.

In general, a difference between the Fermi level of the p+ Si region 513 and the Fermi level of the n-Si region 512 creates an electric field between the two regions, where free electrons generated by the n-Si region 512 are drifted to a region below the p+ Si region 513 by the electric field. The first gate 516 may be coupled to the first control signal 517. For example, the first gate 516 may be coupled to a voltage source, where the first control signal 517 may be a DC voltage signal from the voltage source. The first control signal 517 controls a flow of free electrons from the region below the p+ Si region 513 to the n+ Si region 515. For example, if a voltage of the control signal 517 exceeds a threshold voltage, free electrons accumulated in the region below the p+ Si region 513 will drift to the n+ Si region 515 for collection. The n+ Si region 515 may be coupled to the first readout circuit 518 that processes the collected electrical signal. The first readout circuit 518 may be similar to the first readout circuit 418 as described in reference to FIG. 4A.

The NIR pixel 502 includes an n-Si region 522, a p-Si region 524, an n+ Si region 525, a second gate 526, a second control signal 527 coupled to the second gate 526, a second readout circuit 528 coupled to the n+ Si region 525, a p+ GeSi region 531, and an intrinsic GeSi region 533. The n-Si region 522 may be lightly doped with an n-dopant, e.g., about $10^{16}$ cm$^{-3}$ with phosphorus. The p-Si region 524 may be lightly doped with a p-dopant, e.g., about $10^{15}$ cm$^{-3}$ with boron. The n+ Si region 525 may have an n+ doping, where the activated dopant concentration is as high as a fabrication process may achieve, e.g., about $5 \times 10^{20}$ cm$^{-3}$ with phosphorous.

The p+ GeSi region 531 receives an optical signal 535 and converts the optical signal 406 into electrical signals. Since the thickness of the p+ GeSi layer 531 is generally thin (e.g., 100 nm), the optical signal 535 propagates into the intrinsic GeSi region 533, where the intrinsic GeSi region 533 absorbs the optical signal 535 and converts the optical signal 535 into free carriers. In some implementations, the optical signal 535 may be filtered by a wavelength filter not shown in this figure, such as an NIR filter in the filter layer 110 as described in reference to FIG. 1. In some implementations, a beam profile of the optical signal 535 may be shaped by a lens not shown in this figure, such as a lens in the lens layer 112 as described in reference to FIG. 1.

In some implementations, a thickness of the intrinsic GeSi region 533 may be between 0.05 μm to 2 μm. In some implementations, the p+ GeSi region 531 may repel the photo-electrons away from the intrinsic GeSi region 533 to avoid surface recombination and thereby may increase the carrier collection efficiency. For example, the p+ GeSi region 531 may have a p+ doping, where the dopant concentration is as high as a fabrication process may achieve, e.g., about $5 \times 10^{20}$ cm$^{-3}$ when the intrinsic GeSi region 533 is germanium and doped with boron.

The generated free carriers in the intrinsic GeSi region 533 may drift or diffuse into the n-Si region 522. In some implementations, a source supply voltage Vss may be applied to the NIR pixel 502 to create an electric field between the p+ GeSi region 531 and the n-Si region 522, such that the free electrons may drift towards the n-Si region 522 while the free holes may drift towards the p+ GeSi region 531.

The second gate 526 may be coupled to the second control signal 527. For example, the second gate 526 may be coupled to a voltage source, where the second control signal 527 may be a DC voltage signal from the voltage source. The second control signal 527 controls a flow of free electrons from the n-Si region 522 to the n+ Si region 525. For example, if a voltage of the second control signal 527 exceeds a threshold voltage, free electrons accumulated in the n-Si region 522 will drift towards the n+ Si region 525. The n+ Si region 525 may be coupled to the second readout circuit 528 for further processing of the collected electrical signal. The second readout circuit 528 may be similar to the first readout circuit 418 as described in reference to FIG. 4A.

Although not shown in FIG. 5, in some other implementations, the visible pixel 504 and the NIR pixel 502 may alternatively be fabricated to collect holes instead of electrons. In this case, the p+ Si region 513 would be replaced by an n+ Si region, the n-Si regions 512 and 522 would be replaced by p-Si regions, the p-Si regions 514 and 524 would be replaced by n-Si regions, and the n+ Si region 515 and 525 would be replaced by p+ Si regions.

Figure 6:
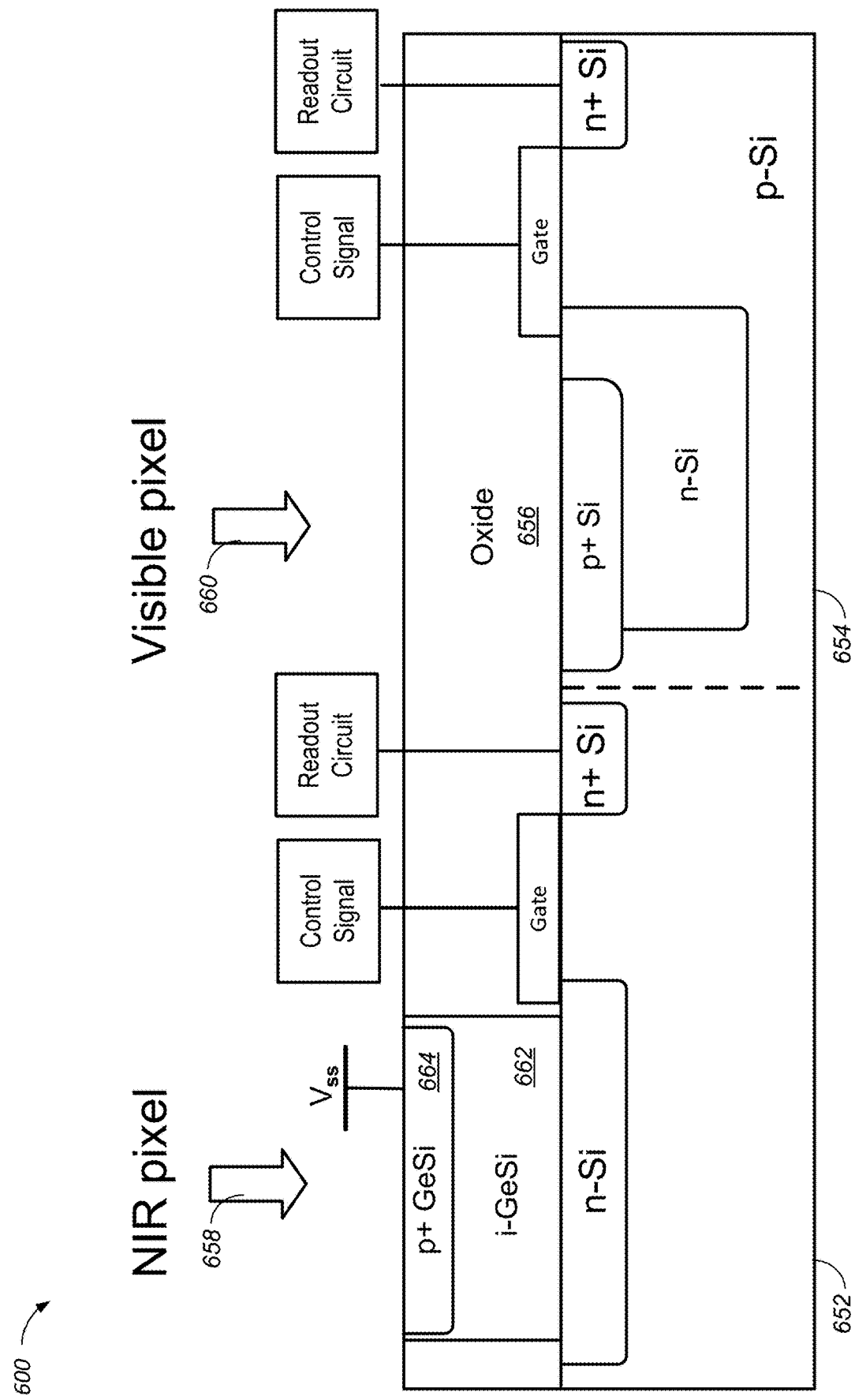
FIG. 6 is an example of a photodiode for detecting visible and infrared light.

FIG. 6 illustrates example photodiodes 600 for detecting visible and infrared optical signals. The photodiodes 600 includes a visible pixel 654 and an NIR pixel 652. The visible pixel 654 is similar to the visible pixel 504 as described in reference to FIG. 5. The NIR pixel 652 is similar to the NIR pixel 502 as described in reference to FIG. 5. Here, the surface of the visible pixel 654 and the NIR pixel 652 that receive optical signals 660 and 658 is a planarized surface, where the intrinsic GeSi region 662 and the p+ GeSi region 664 are embedded in an oxide layer 656. A planarized surface between the visible pixel 654 and the NIR pixel 652 enables additional processing on the photodiode surface and/or bonding with devices fabricated on a separate substrate.

In time-of-flight (TOF) applications, depth information of a three-dimensional object may be determined using a phase difference between a transmitted light pulse and a detected light pulse. For example, a two-dimensional array of pixels may be used to reconstruct a three-dimensional image of a three-dimensional object, where each pixel may include one or more photodiodes for deriving phase information of the three-dimensional object. In some implementations, time-of-flight applications use light sources having wavelengths in the near-infrared (NIR) range. For example, a light-emitting-diode (LED) may have a wavelength of 850 nm, 940 nm, 1050 nm, or 1310 nm. Some photodiodes may use silicon as an absorption material, but silicon is an inefficient absorption material for NIR wavelengths. Specifically, photo-carriers may be generated deeply (e.g., greater than 10 μm in depth) in the silicon substrate, and those photo-carriers may drift and/or diffuse to the photodiode junction slowly, which results in a decrease in the device bandwidth. Moreover, a small voltage swing is typically used to control photodiode operations in order to minimize power consumption. For a large absorption area (e.g., 10 μm in diameter), the small voltage swing can only create a small lateral/vertical field across the large absorption area, which affects the drift velocity of the photo-carriers being swept across the absorption area. The device bandwidth is therefore further limited. For TOF applications using NIR wavelengths, a multi-gate photodiode using germanium-silicon (GeSi) as an absorption material addresses the technical issues discussed above.

Figure 7:
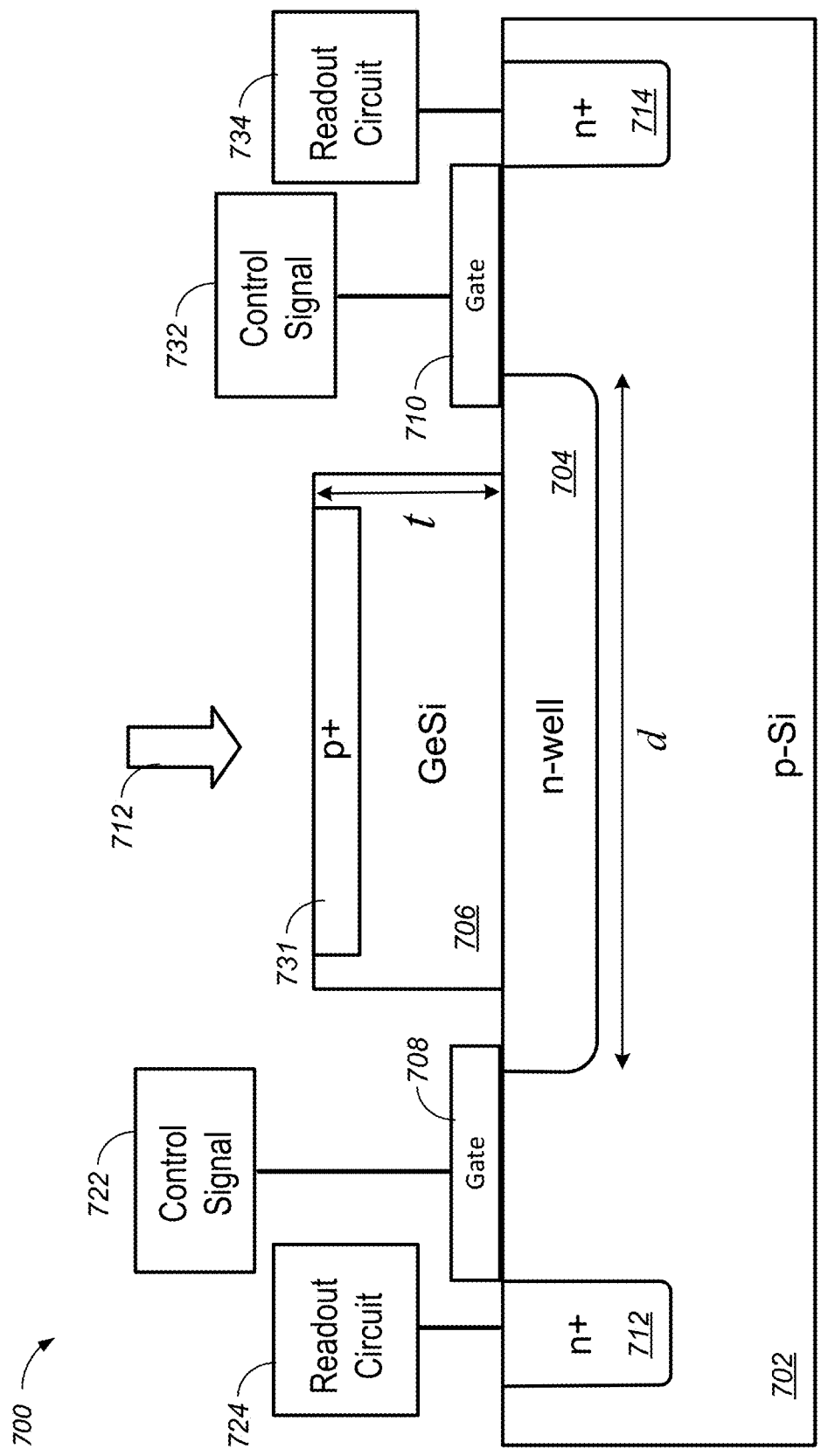
FIG. 7 is an example of a multi-gate photodiode.

FIG. 7 is an example multi-gate photodiode 700 for converting an optical signal to an electrical signal. The multi-gate photodiode 700 includes an absorption layer 706 fabricated on a substrate 702. The substrate 702 may be any suitable substrate where semiconductor devices can be fabricated on. For example, the substrate 702 may be a silicon substrate. The coupling between the absorption layer 706 and a first n+ Si region 712 is controlled by a first gate 708. The coupling between the absorption layer 706 and a second n+ Si region 714 is controlled by a second gate 710.

In general, the absorption layer 706 receives an optical signal 712 and converts the optical signal 712 into electrical signals. The absorption layer 706 is selected to have a high absorption coefficient at the desired wavelength range. For NIR wavelengths, the absorption layer 706 may be a GeSi mesa, where the GeSi absorbs photons in the optical signal 712 and generates electron-hole pairs. The material composition of germanium and silicon in the GeSi mesa may be selected for specific processes or applications. In some implementations, the absorption layer 706 is designed to have a thickness t. For example, for 850 nm wavelength, the thickness of the GeSi mesa may be approximately 1 μm to have a substantial quantum efficiency. In some implementations, the surface of the absorption layer 706 is designed to have a specific shape. For example, the GeSi mesa may be circular, square, or rectangular depending on the spatial profile of the optical signal 712 on the surface of the GeSi mesa. In some implementations, the absorption layer 706 is designed to have a lateral dimension d for receiving the optical signal 712. For example, the GeSi mesa may have a circular shape, where d can range from 1 μm to 50 μm.

In some implementations, the absorption layer 706 may include a p+ GeSi region 731. The p+ GeSi region 731 may repel the photo-electrons from the surface of the absorption region 706 and thereby may increase the device bandwidth. For example, the p+ GeSi region 731 may have a p+ doping, where the dopant concentration is as high as a fabrication process may achieve, e.g., about $5 \times 10^{20}$ $cm^{-3}$ when the absorption region 706 is germanium and doped with boron.

The multi-gate photodiode 700 includes an n-well region 704 implanted in the substrate 702. For example, the doping level of the n-well region 704 may range from $10^{15}$ $cm^{-3}$ to $10^{20}$ $cm^{-3}$. In general, the n-well region 704 is used to collect electrons generated by the absorption region 706.

The first gate 708 is coupled to a first control signal 722 and a first readout circuit 724. For example, the first gate 708 may be coupled to a voltage source, where the first control signal 722 may be a time-varying multi-level voltage signal from the voltage source. The first readout circuit 724 may be in a three-transistor configuration consisting of a reset gate, a source-follower, and a selection gate, or any suitable circuitry for processing free carriers. In some implementations, the first readout circuit 724 may be fabricated on the substrate 702. In some other implementations, the first readout circuit 724 may be fabricated on another substrate and co-packaged with the multi-gate photodiode 700 via die/wafer bonding or stacking. The second gate 710 is coupled to a second control signal 732 and a second readout circuit 734. The second control signal 732 is similar to the first control signal 722, and the second readout circuit 734 is similar to the first readout circuit 724.

The first control signal 722 and the second control signal 732 are used to control the collection of electrons generated by the absorbed photons. For example, when the first gate 708 is turned "on" and the second gate is turned "off", electrons would drift from the n-well region 704 to the n+ Si region 712. Conversely, when the first gate 708 is turned "off" and the second gate is turned "on", electrons would drift from the n-well region 704 to the n+ Si region 714. In some implementations, a voltage may be applied between the p+ GeSi region 731 and the n-well 704 to increase the electric field inside the absorption layer 706 for drifting the electrons towards the n-well region 704.

Figure 8:
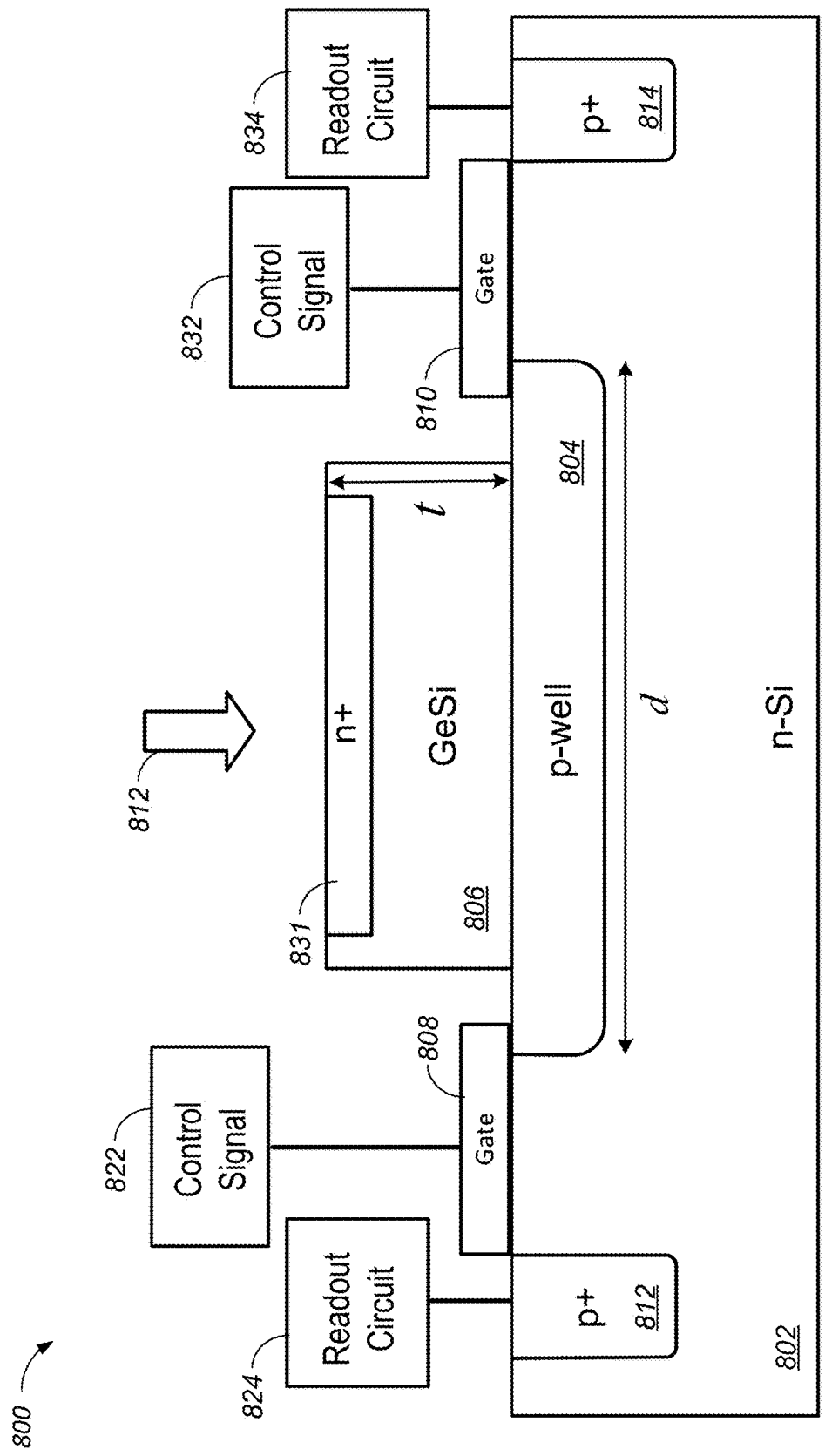
FIG. 8 is an example of a multi-gate photodiode.

FIG. 8 is an example multi-gate photodiode 800 for converting an optical signal to an electrical signal. The multi-gate photodiode 800 includes an absorption layer 806 fabricated on a substrate 802. The substrate 802 may be any suitable substrate where semiconductor devices can be fabricated on. For example, the substrate 802 may be a silicon substrate. The coupling between the absorption layer 806 and a first p+ Si region 812 is controlled by a first gate 808. The coupling between the absorption layer 806 and a second p+ Si region 814 is controlled by a second gate 810.

In general, the absorption layer 806 receives an optical signal 812 and converts the optical signal 812 into electrical signals. The absorption layer 806 is similar to the absorption layer 706 as described in reference to FIG. 7. In some implementations, the absorption layer 806 may include an n+ GeSi region 831. The n+ GeSi region 831 may repel the holes from the surface of the absorption region 806 and thereby may increase the device bandwidth. For example, the n+ GeSi region 831 may have a n+ doping, where the dopant concentration is as high as a fabrication process may achieve, e.g., about $5 \times 10^{20}$ $cm^{-3}$ when the absorption region 806 is germanium and doped with phosphorus.

The multi-gate photodiode 800 includes a p-well region 804 implanted in the substrate 802. For example, the doping level of the p-well region 804 may range from $10^{15}$ $cm^{-3}$ to $10^{20}$ $cm^{-3}$. In general, the p-well region 804 is used to collect holes generated by the absorption region 806.

The first gate 808 is coupled to a first control signal 822 and a first readout circuit 824. The first gate 808, the first control signal 822, and the first readout circuit 824 are similar to the first gate 708, the first control signal 722, and the first readout circuit 724 as described in reference to FIG. 7. The second gate 810 is coupled to a second control signal 832 and a second readout circuit 834. The second gate 810, the second control signal 832, and the second readout circuit 834 are similar to the second gate 710, the second control signal 732, and the second readout circuit 734 as described in reference to FIG. 7

The first control signal 822 and the second control signal 832 are used to control the collection of holes generated by the absorbed photons. For example, when the first gate 808 is turned "on" and the second gate 810 is turned "off", holes would drift from the p-well region 804 to the p+ Si region 812. Conversely, when the first gate 808 is turned "off" and the second gate 810 is turned "on", holes would drift from the p-well region 804 to the p+ Si region 814. In some implementations, a voltage may be applied between the n+ GeSi region 831 and the p-well 804 to increase the electric field inside the absorption layer 806 for drifting the holes towards the p-well region 804.

Figure 9A:
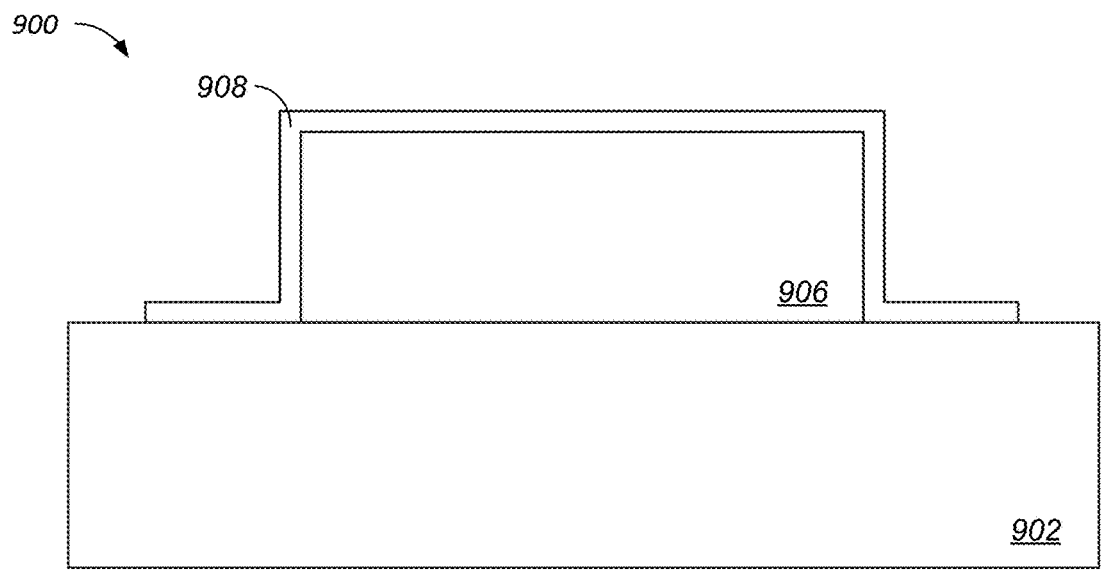
FIGS. 9A-9C are examples of a photodetector.

FIG. 9A shows an example photodetector 900 for converting an optical signal to an electrical signal. The photodetector 900 includes an absorption layer 906 fabricated on a substrate 902, and a first layer 908 formed on top of the absorption layer 906 and the substrate 902. The substrates 902 may be similar to the substrate 702 described previously, and the absorption layers 906 may be similar to the absorption layer 706 described previously, and may be formed, for example, from Ge or GeSi with Ge concentration ranging from 1-99%. The background doping polarity and doping level of the Ge or GeSi absorption layer 906 may be P-type and range from $10^{14}$ $cm^{-3}$ to $10^{16}$ $cm^{-3}$. The background doping level may be due to, for example, explicit incorporation of doping, or due to material defects introduced during formation of the absorption layer 906. The absorption layer 906 of the photodetector 900 has a mesa structure and is supported by the substrate 902, and while a vertical sidewall has been shown, the shape and sidewall profile of the mesa structure may depend on the specifics of the growth and fabrication process for the absorption layer 906.

The first layer 908 covers an upper surface and side surfaces of the absorption layer 906, and covers a portion of an upper surface of the substrate 902 on which the absorption layer 906 is formed. The first layer 908 may be formed from a Complementary Metal-Oxide-Semiconductor (CMOS) process compatible material (CPCM), such as amorphous silicon, polysilicon, epitaxial silicon, aluminum oxide family (e.g., $Al_2O_3$), silicon oxide family (e.g., $SiO_2$), Ge oxide family (e.g., $GeO_2$), germanium-silicon family (e.g., $Ge_{0.4}Si_{0.6}$), silicon nitride family (e.g., $Si_3N_4$), high-k materials (e.g. HfOx, ZnOx, LaOx, LaSiOx), and any combination thereof. The presence of the first layer 908 over the surfaces of the absorption layer 906 may have various effects. For example, the first layer 908 may act as a surface passivation layer to the absorption layer 906, which may reduce dark current or leakage current generated by defects present at the surface of the absorption layer 906. In the case of a germanium (Ge) or a germanium-silicon (GeSi) absorption layer 906, the surface defects may be a significant source of dark current or leakage current, which contributes to an increased noise level of the photocurrent generated by the photodetector 900. By forming the first layer 908 over the surfaces of the absorption layer 906, the dark current or leakage current may be reduced, thereby reducing the noise level of the photodetector 900. As another example, the first layer 908 may modulate a Schottky barrier level between a contact formed on the photodetector 900 and the absorption layer 906 and/or the substrate 902. The barrier modulation effect is further described in U.S. patent application Ser. No. 15/908,328 titled "HIGH-SPEED LIGHT SENSING APPARATUS II," which is fully incorporated by reference herein.

Figure 9B:
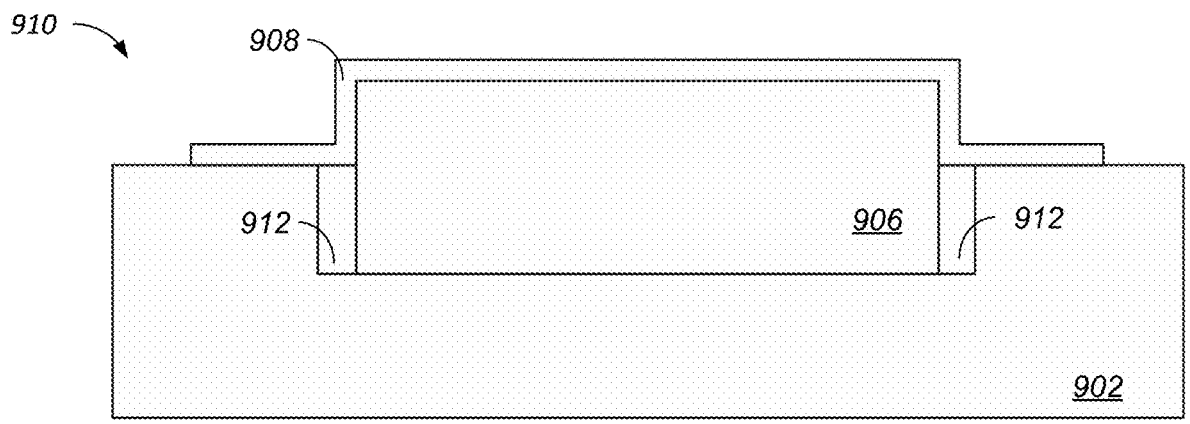

FIG. 9B shows an example photodetector 910 for converting an optical signal to an electrical signal. The photodetector 910 is similar to the photodetector 900 in FIG. 9A, but differs in that the absorption layer 906 is partially embedded in a recess formed on the substrate 902, and the photodetector 910 further includes spacers 912. The spacers 912 may be a dielectric material such as various oxides and nitrides that separates the sidewalls of the absorption layer 906 from the substrate 902. In some implementations, the spaces 912 may be omitted, and the embedded portion of the absorption layer 906 may be in direct contact with a surface of the recess formed in the substrate 902, such as a [110] sidewall of a silicon substrate.

Figure 9C:
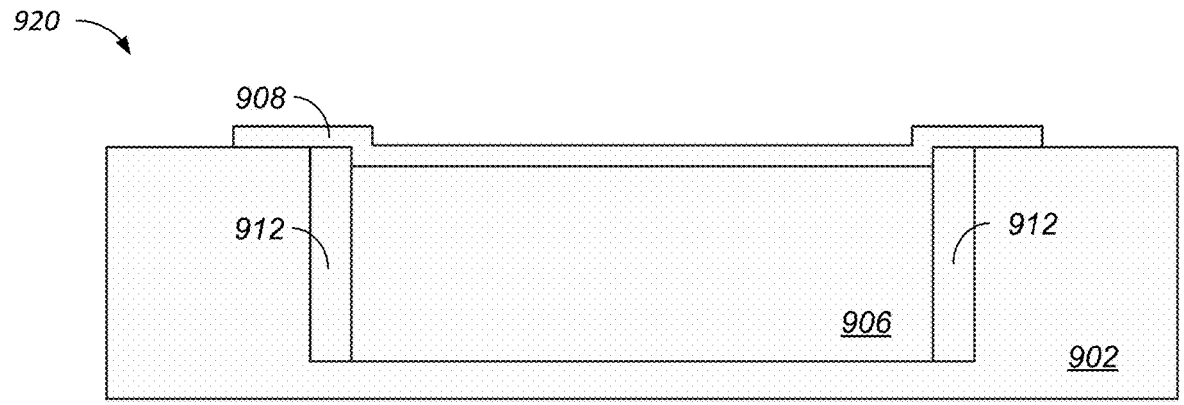

FIG. 9C shows an example photodetector 920 for converting an optical signal to an electrical signal. The photodetector 920 is similar to the photodetector 910 in FIG. 9B, but differs in that the absorption layer 906 is fully embedded in the recess formed on the substrate 902.

While the photodiodes illustrated and described in relation to FIGS. 4A, 4B, 5, 6, 7, and 8 have germanium regions or absorption layers that are protruding from a surface of the substrate in a manner similar to the photodiode 900 shown in FIG. 9A, in general, the previously described photodiodes may be formed to have partially embedded or fully embedded germanium regions or absorption layers as shown in FIG. 9B and FIG. 9C.

Figure 10A:
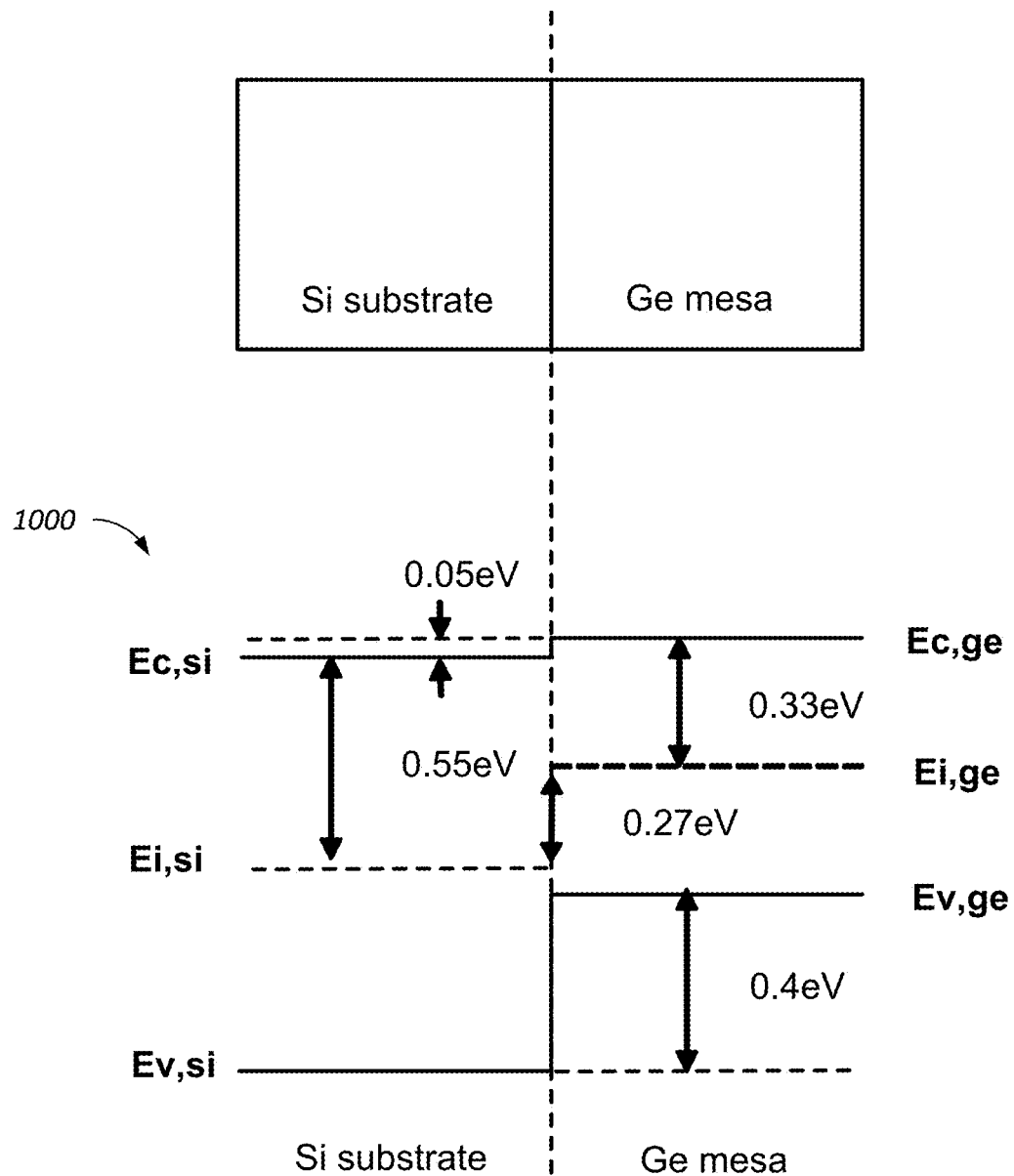
FIG. 10A shows an example band diagram across a silicon substrate and a germanium mesa.

FIG. 10A shows an example band diagram 1000 across a silicon substrate and a germanium mesa. The band diagram 1000 illustrates various energy levels that charge carriers such as electrons and holes experience at various locations of the silicon-germanium heterojunction. The vertical axis corresponds to an energy level E, and the horizontal axis corresponds to a position x across the heterojunction formed between the silicon substrate and the germanium mesa. The silicon substrate and the germanium mesa have respective valence bands with energy level of Ev,si and Ev,ge, and respective conduction bands with energy level of Ec,si and Ec,ge. Intrinsic fermi levels Ei,si and Ei,ge for silicon and germanium, respectively, have been marked for reference.

In general, different semiconductor materials have different conduction band and valence band energy levels. For example, the energy level of the conduction band of silicon (Ec,si) is approximately 0.05 eV lower than the energy level of the conduction band of germanium (Ec,ge), and the energy level of the valence band of silicon (Ev,si) is approximately 0.4 eV lower than the energy level of the valence band of germanium (Ev,ge). Further, for an intrinsic semiconductor, the fermi level of the semiconductor is at the mid-point between the conduction band and the valence band. As such, the intrinsic fermi level of silicon (Ei,si) is approximately 0.27 eV lower than the intrinsic fermi level of germanium (Ei,ge). Such misalignment in the fermi levels across a Si—Ge heterojunction creates a built-in potential and a depletion region, which impedes a flow of current across the heterojunction. The built-in potential may be overcome by an application of external bias voltage across the heterojunction. However, increasing the external bias voltage may be undesirable in certain cases. For example, increased external bias voltage may increase a dark current generated by a photodiode implementing the Si—Ge heterojunction, increase a power consumed by the photodiode implementing the Si—Ge heterojunction, or a combination thereof. As such, a technique for reducing or eliminating the built-in potential across a heterojunction to enhance a flow of current across the heterojunction will now be described.

The fermi levels of silicon and germanium may be aligned in various ways to reduce or eliminate the built-in potential. The techniques include 1) doping Ge with P-type dopants, 2) doping Si with N-type dopants, 3) doping Ge with P-type dopants in combination with doping Si with N-type dopants, 4) doping both Ge and Si with N-type dopants, and 5) a combination thereof. The concentrations of the dopants for various scenarios may be determined through standard band-diagram calculations, taking into account the polarity and concentration of an intrinsic doping of a material, and/or an intrinsic carrier concentration of the material. As an example, the calculation has been performed for techniques 1) to 4) described above assuming an intrinsic carrier concentration $n_{i,si}$ of $10^{10}$ cm$^{-3}$ for silicon and an intrinsic carrier concentration of $n_{i,ge}$ of $2*10^{13}$ cm$^{-3}$ for germanium. The Fermi energy level of a semiconductor doped with N-type or P-type dopant at the concentration $N_D$ or $N_A$, respectively, is higher than or lower than, respectively, the mid-gap energy level of the semiconductor. The change in the Fermi energy level due to the doping can be calculated by the equations $k_B T*\ln(N_D/n_{i,si})$ and $k_B T*\ln(N_A/n_{i,si})$, respectively, wherein $k_B$ is the Boltzmann constant and T is the temperature. For the first technique, germanium may be doped with Boron at a concentration of approximately $4*10^{17}$ cm$^{-3}$ (e.g., $6.47*10^{17}$ cm$^{-3}$). For the second technique, silicon may be doped with phosphorous at a concentration of approximately $3*10^{14}$ cm$^{-3}$ (e.g., $3.24*10^{14}$ cm$^{-3}$). For the third technique, germanium may be doped with boron at a concentration less than $6.47*10^{17}$ cm$^{-3}$ (e.g., $4*10^{17}$ cm$^{-3}$ or less) in combination with doping silicon with phosphorous at a concentration less than $3.24*10^{14}$ cm$^{-3}$ (e.g., $3*10^{14}$ cm$^{-3}$ or less). For the fourth technique, germanium may be doped with phosphorous at a concentration substantially equal to $G*10^{\wedge}P$ cm$^{-3}$ in combination with doping silicon with phosphorous at a concentration substantially equal to $16*G*10^{\wedge}P$ cm$^{-3}$.

It is appreciated that the fourth technique may be advantageous over the first, second, and third techniques for various reasons. For example, the parameters G and P are tunable parameters that may be tuned to control widths of the depletion regions formed around the Si—Ge heterojunction. As another example, the parameters G and P may be tuned such that the resulting doping level falls within a level that can be reliably achieved using standard integrated circuit fabrication techniques. A doping level above $1*10^{16}$ cm$^{-3}$, for example, may be readily achieved using standard dopant implantation techniques. As such, in some implementations, germanium may be doped with phosphorous at a concentration substantially equal to $5*10^{17}$ cm$^{-3}$ and silicon may be doped with phosphorous at a concentration substantially equal to $8*10^{18}$ cm$^{-3}$.

Dopant concentrations that are "approximately X" or are "substantially equal to X" may correspond to a range of values that are functionally equivalent to the numerical concentration X, and/or a concentration that is within a fabrication variation of the provided value. For example, a doping concentration that falls within 1%, within 5%, within 25%, or within 50% of X may be considered to be "approximately" or "substantially equal to" X. As another example, a doping concentration that effectively performs the same function as the numerical concentration X, such as reducing or eliminating the built-in potential to a similar degree as X, may be considered to be "approximately" or "substantially equal to" X.

While an example band diagram and an example calculation has been performed for a heterojunction between pure silicon and pure germanium without intrinsic doping, in general, the described techniques may be applied to heterojunctions of other materials, such as between silicon and silicon-germanium alloy, and to materials with or without intrinsic doping. The silicon-germanium alloy of various compositions may have corresponding conduction band energy level, valence band energy level, and intrinsic fermi level, which may be determined and used in calculating the appropriate doping concentrations for the various techniques that are described.

Figure 10B:
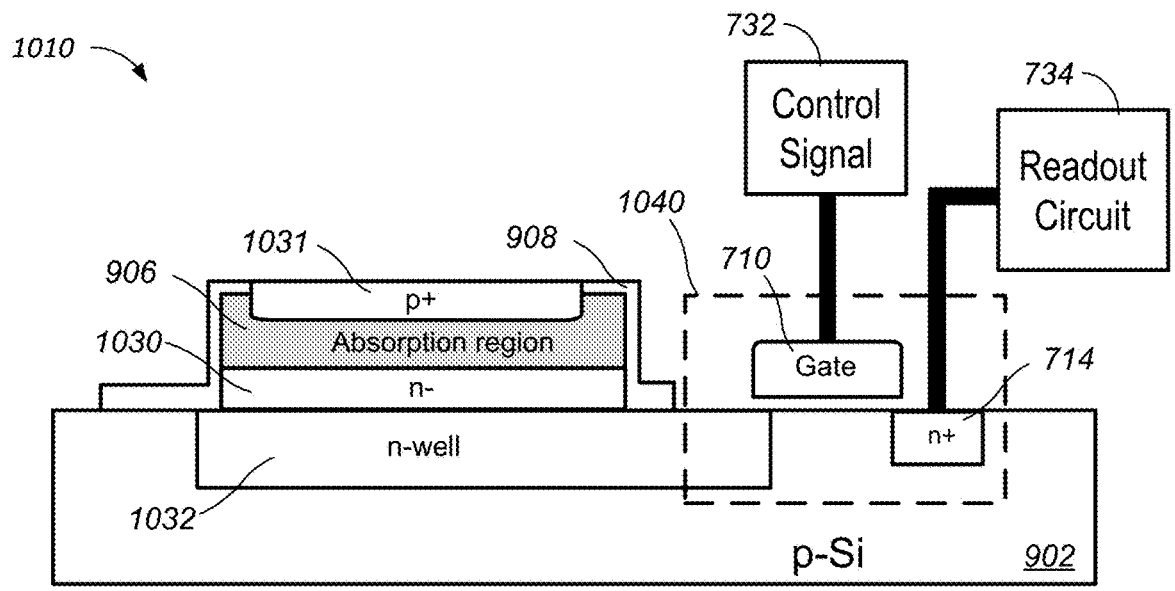
FIGS. 10B-10D show examples of photodiodes with reduced built-in potential.

The techniques for reducing or eliminating the built-in potential across the Si—Ge heterojunction have been described so far. Now, various examples of photodiodes implementing the built-in potential reduction technique will be described. Referring to FIG. 10B, an example photodiode 1010 with reduced built-in potential is shown. The photodiode 1010 includes the substrate 902, the absorption layer 906, the first layer 908, an n-doped region 1030, a p-doped region 1031, an n-well 1032, the gate 710, and the n+ Si region 714. The operation of the photodiode 1010 is generally similar to the operation of the photodiode 700 except as described.

The p-doped region 1031 is arranged on a first surface of the absorption region 906 facing away from the surface of the substrate 902. The p-doped region 1031 may repel the photo-electrons from the surface of the absorption region 906 and may thereby increase the device bandwidth. For example, the p-doped region 1031 may have a p+ doping, where the dopant concentration is as high as a fabrication process may achieve, e.g., about $5\times10^{20}$ cm$^{-3}$, when the absorption region 906 is germanium and doped with boron. The p-doped region 1031 may be similar to the p+ GeSi region 731 where the absorption region 906 is a GeSi absorption region.

The n-doped region 1030 is arranged on a second surface of the absorption region 906 facing the surface of the substrate 902. The second surface may be opposite from the first surface of the absorption region 906. The n-doped region 1030 may be formed by implantation of dopants into the absorption region 906, or may be formed by diffusing the dopants from the n-well 1032. The configuration of the photodiode 1010 in which the p-doped region 1031 and the n-doped region 1030 are vertically separated within the absorption region 906 may be referred to as a vertical PIN photodiode.

The n-well 1032 is an n-doped region formed in the substrate 902. The n-well 1032 may be formed by implantation of dopants into the substrate 902. In general, the n-well 1032 is used to collect photo-generated carriers generated by the absorption region 906. In some implementations, a voltage may be applied between the p-doped region 1031 and the n-well 1032 to increase the electric field inside the absorption region 906 for drifting the electrons towards the n-well 1032.

Photo-generated carriers such as electrons generated by the absorption region 906 may be repelled by the p-doped region 1031 toward the heterojunction interface between the absorption region 906 and the silicon substrate 902. The n-doped region 1030 and the n-well 1032 are configured to align the fermi levels of the absorption region 906 and the silicon substrate 902 such that the photo-generated carriers may flow across the heterojunction. In general, a first doping concentration of the n-doped region 1030 may be less than or substantially equal to a second doping concentration of the n-well 1032. Such doping concentrations may lead to a reduction of misalignment between the fermi levels across the heterojunction. In case where the absorption region 906 is an intrinsic germanium layer, the n-doped region 1030 may be doped with phosphorous at a concentration substantially equal to $G*10^P$ cm$^{-3}$, and the n-well 1032 may be doped with phosphorous at a concentration substantially equal to $16*G*10^P$ cm$^{-3}$ to substantially align the fermi levels across the heterojunction.

In some implementations, the n-doped region 1030 and the n-well 1032 are adjacent to each other (e.g., in direct contact without intervening layers). In some other implementations, an intervening layer (e.g., a silicon-germanium layer) may be present between the n-doped region 1030 and the n-well 1032.

Once the photo-generated carriers generated by the absorption region 906 have crossed the heterojunction and have been collected by the n-well 1032, the photo-generated carriers may then be transported to a readout region of the photodiode 1010, such as the n+ Si region 714, under the control of the gate 710. A readout region generally refers to a region of a photodiode where the photo-generated carriers generated by the photodiode may be collected, or read-out, by a circuit such as the readout circuit 734. Examples of the readout regions include n+ Si regions 415, 425, 515, 525, 712, and 714, and p+ Si regions 812, and 814. The readout circuit 734 is coupled to the readout region to read-out the photo-generated carriers generated by the photodiode 1010.

The gate 710 is formed over a surface of the substrate 902. For example, a dielectric layer may be present between the substrate 902 and the gate 710 and provide support to the gate 710. As such, the gate 710 is supported by the substrate 902. The readout region (e.g., n+ Si region 714) is formed on the surface of the substrate 902, and is thereby supported by the substrate 902.

In some implementations, a capacitor may be coupled to the readout region of the photodiode 1010. Examples of the capacitors include floating-diffusion capacitors, metal-oxide-metal (MOM) capacitors, metal-insulator-metal (MIM) capacitors, and metal-oxide-semiconductor (MOS) capacitors. In some implementations, a floating-diffusion capacitor may be integrally formed in the readout region. For example, the n+ Si region 714 may implement a floating-diffusion capacitor, which may simultaneously function as a channel terminal for the MOSFET 1040, as a capacitor for storing photo-generated carriers, and as a readout region. The capacitor coupled to the readout region may integrate the photo-generated carriers generated by the absorption region 906, which may be read-out by the readout circuit 734.

The n-well 1032, the gate 710, and the n+ Si region 714 may form a metal-oxide-semiconductor field-effect transistor (MOSFET) 1040 that controls a flow of current between the n-well 1032 and the n+ Si region 714. The substrate 902 may be a P-type silicon substrate, and a portion of the substrate 902 located under the gate 710 may act as a channel of the MOSFET 1040. A portion of the n-well 1032 that is proximal or underneath the gate 710, or the entire n-well 1032, may be referred to as a channel terminal (e.g., first channel terminal) of the MOSFET 1040. A portion of the n+ Si region 714 that is proximal or underneath the gate 710, or the entire n+ Si region 714, may be referred to as a channel terminal (e.g., second channel terminal) of the MOSFET 1040. The first and second channel terminals may also be referred to as source and drain terminal of the MOSFET 1040. Additional description associated with operation of a MOSFET will be provided in relation to FIG. 24A.

While the photodiode 1010 described has a single gate 710, additional gates may be provided. For example, the gate 708, the control signal 722, the n+ Si region 712, and the readout circuit 724 of FIG. 7 may be implemented in the photodiode 1010 to implement multi-gate photodiode 1010 that operates in a manner analogous to the multi-gate photodiode 700 of FIG. 7.

Figure 10C:
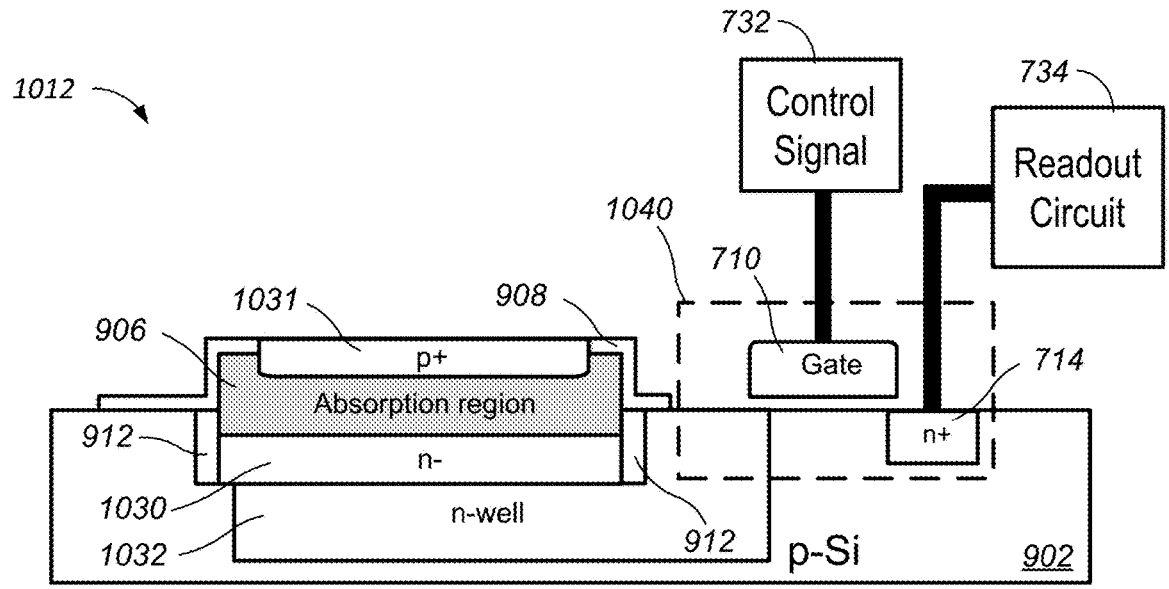

Referring to FIG. 10C, an example photodiode 1012 with reduced built-in potential is shown. The photodiode 1012 is similar to the photodiode 1010 of FIG. 10B, but differs in that the absorption region 906 is now partially embedded in a recess formed on the substrate 902, and the photodiode 1020 further includes the spacers 912. The n-well 1032 surrounds at least a portion of the recess, thereby surrounding at least a portion of the absorption region 906. In some implementations, the n-well 1032 fully surrounds the embedded portion of the absorption region 906.

The photo-generated carriers may travel downward through the heterojunction formed between the absorption region 906 and the silicon substrate 902. The photo-generated carriers may then be guided by the n-well 1032 toward the gate 710 such that the transport of the photo-generated carriers between the n-well 1032 and the n-doped region 714 may be controlled by the gate 710.

The spacers 912 may be electrically insulating (e.g., $SiO_2$), semiconducting (e.g., undoped amorphous, poly, or crystalline silicon), or conducting (e.g., doped amorphous, poly, or crystalline silicon). While the photodiode 1012 described includes the spacers 912, in some implementations, the spacers 912 may be omitted.

While the photodiode 1012 described has a single gate 710, additional gates may be provided. For example, the gate 708, the control signal 722, the n+ Si region 712, and the readout circuit 724 of FIG. 7 may be implemented in the photodiode 1012 to implement a multi-gate photodiode 1012 that operates in a manner analogous to the multi-gate photodiode 700 of FIG. 7.

Figure 10D:
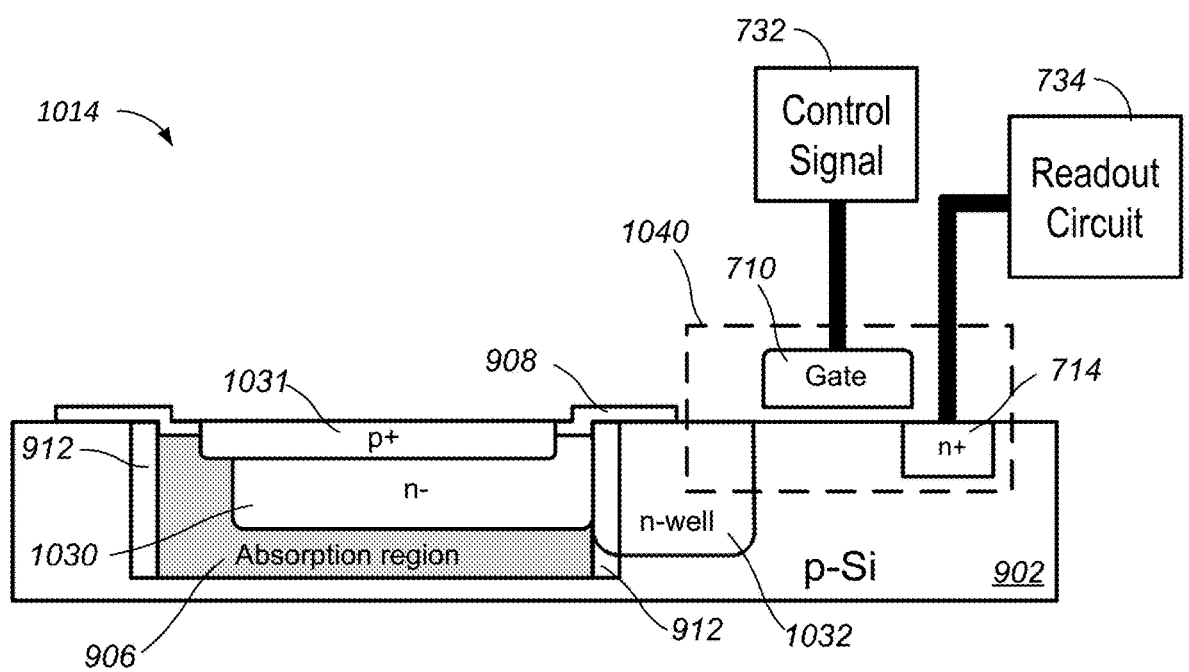

Referring to FIG. 10D, an example photodiode 1014 with reduced built-in potential is shown. The photodiode 1014 is similar to the photodiode 1012 of FIG. 10C, but differs in that the absorption region 906 is now fully embedded in the recess formed on the substrate 902. The n-well 1032 surrounds at least a portion of the recess, thereby surrounding at least a portion of the absorption region 906. In some implementations, the n-well 1032 fully surrounds the embedded portion of the absorption region 906.

The p-doped region 1031 is in contact with (e.g., adjacent) to the n-doped region 1030. The photo-generated carriers may travel laterally through the heterojunction formed between the absorption region 906 and the silicon substrate 902 to be collected by the n-well 1032. The transport of carriers collected by the n-well 1032 between the n-well 1032 and the n-doped region 714 may be controlled by the gate 710.

The spacers 912 may be semiconducting (e.g., undoped amorphous, poly, or crystalline silicon), or conducting (e.g., doped amorphous, poly, or crystalline silicon). While the photodiode 1014 described includes the spacers 912, in some implementations, the spacers 912 may be omitted.

While the p-doped region 1031 and the n-doped region 1030 is shown to be adjacent to each other, in some implementations, the p-doped region 1031 and the n-doped region 1030 may be vertically separated.

While the n-doped region 1030 is shown to not extend across the lateral extents of the absorption region 906, in some implementations, the n-doped region 1030 may fully extend across the lateral extents of the absorption region 906.

While the photodiode 1014 described has a single gate 710, additional gates may be provided. For example, the gate 708, the control signal 722, the n+ Si region 712, and the readout circuit 724 of FIG. 7 may be implemented in the photodiode 1014 to implement a multi-gate photodiode 1014 that operates in a manner analogous to the multi-gate photodiode 700 of FIG. 7.

While photodiodes having p-doped region 1031, and n-doped regions 1030, 1032, 1034 and n+ Si region 714 have been described in relation to FIGS. 10B through 10D, the doping polarity may be reversed in some implementations and operate in an analogous manner.

While the gate 710 for controlling the transport of carriers between the absorption region 906 and the readout region 714 have been described in relation to FIGS. 10B through 10D, other control mechanisms have been contemplated. For example, the gate 710 may be replaced with a p-doped base terminal to form an NPN bipolar junction transistor in place of the MOSFET 1040 to control a flow of carriers to the readout region. As another example, the gate 710 may be replaced with a p-doped gate terminal and an n-doped channel to form an N-channel junction field effect transistor (JFET) in place of the MOSFET 1040.

Fermi-level alignment between the absorption region 906 and the silicon substrate 902 is one of the considerations in improving the transfer of photo-generated carriers from the absorption region to the readout region of a photodiode. Now, additional considerations and techniques for improving the transfer of photo-generated carriers from the absorption region to capacitors associated with the photodiode will be described.

Figure 11A:
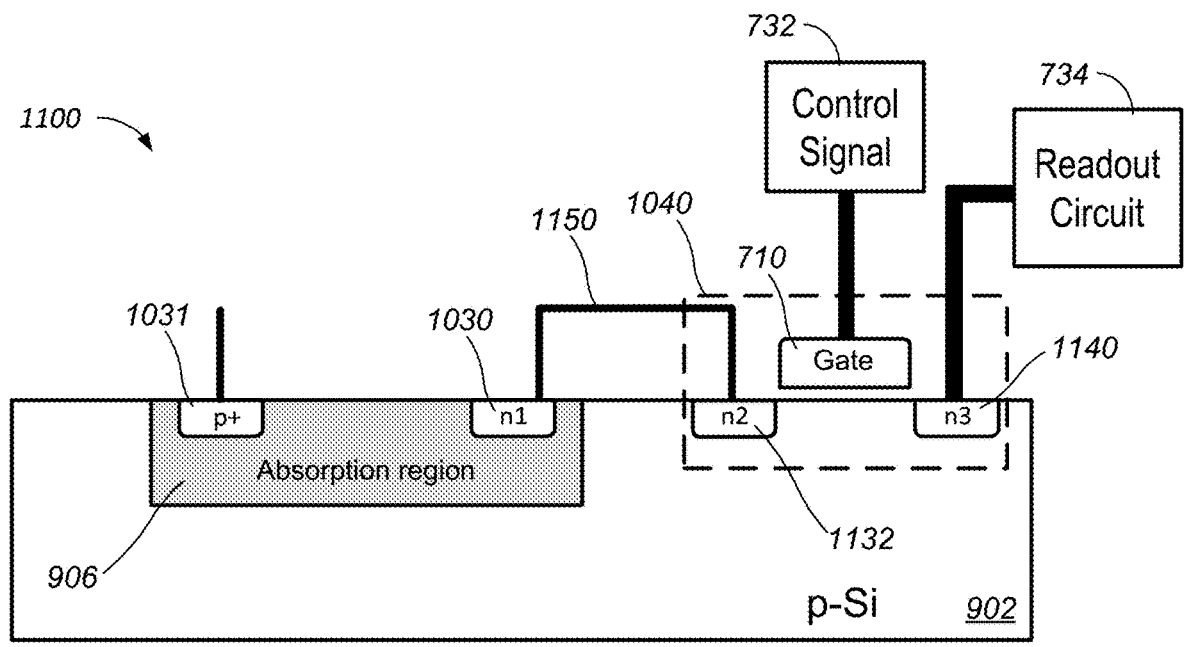
FIGS. 11A-11F show examples of photodiodes with improved carrier transfer.

Referring to FIG. 11A, an example photodiode 1100 with improved carrier transfer is shown. The photodiode 1100 is similar to the photodiode 1014 of FIG. 10D, but differs in that the n-well 1032 has been replaced with a second n-doped region 1132, and the first n-doped region 1030 and the second n-doped region 1132 is coupled with an interconnect 1150. Additionally, both the p-doped region 1031 and the first n-doped region 1030 are arranged on the first surface of the absorption region 906 away from the substrate 902, which may be referred as a lateral PIN photodiode. Further, the n+ Si region 714 is now regarded as a floating-diffusion capacitor 1140. The floating-diffusion capacitor 1140 is an n-doped region formed within the silicon substrate 902. The PN junction formed between the n-doped region of the floating-diffusion capacitor 1140 and the P-type silicon substrate 902 further confines carriers to the n-doped region of the floating-diffusion capacitor 1140, improving the storage of carriers by the floating-diffusion capacitor 1140, relative to the case where the silicon substrate 902 is not doped with P-type dopants.

The first n-doped region 1030 has a first doping concentration n1. The second n-doped region 1132 has a second doping concentration n2. Different from the n-well 1032, the second n-doped region 1132 is not adjacent to the first n-doped region 1030. For example, the second n-doped region does not physically contact the first n-doped region 1030. The floating-diffusion capacitor 1140 has a third doping concentration n3.

The interconnect 1150 provides an electrical coupling between the first n-doped region 1030 and the second n-doped region 1132. The electrical coupling provided by the interconnect 1150 allows the photo-generated carriers generated in the absorption region and received by the first n-doped region 1030 to be transported to the second n-doped region 1132 without physical contact or adjacency between the two n-doped regions. The interconnect 1150 may be formed using various metals, such as aluminum, copper, and tungsten, and may include a contact metal at the interface to the first n-doped region 1030 and the second n-doped region 1132.

The general operation of the photodiode 1100 is as follows. Photo-generated carriers such as electrons generated by the absorption region 906 may be repelled by the p-doped region 1031 toward the first n-doped region 1030. Once the photo-generated carriers reach the first n-doped region 1030, additional force may be imparted on the carriers to induce a flow of those carriers from the first n-doped region 1030 to the floating-diffusion capacitor 1140 when the MOSFET 1040 is turned on. Such force may be generated by engineering of the doping concentrations n1 of the first n-doped region 1030, n2 of the second n-doped region 1132, and n3 of the floating-diffusion capacitor 1140. In general, a charge carrier is driven from a region of low doping concentration to a region of high doping concentration, as the potential energy associated with a region of lower doping concentration is higher than the potential energy associated with a region of higher doping concentration. As such, by setting the doping concentrations according to an inequality n3>n2>n1, the carriers stored at the first n-doped region 1030 may be first driven toward the second n-doped region 1132 having the second doping concentration n2 higher than the first doping concentration n1. Then, when the MOSFET 1040 is turned on, the difference in doping concentration n2 of the second n-doped region 1132 and n3 of the floating-diffusion capacitor 1140 further drives the carriers toward the floating-diffusion capacitor 1140. As a result, the carrier transfer efficiency from the absorption region 906 to the floating-diffusion capacitor 1140 may be improved.

Figure 11B:
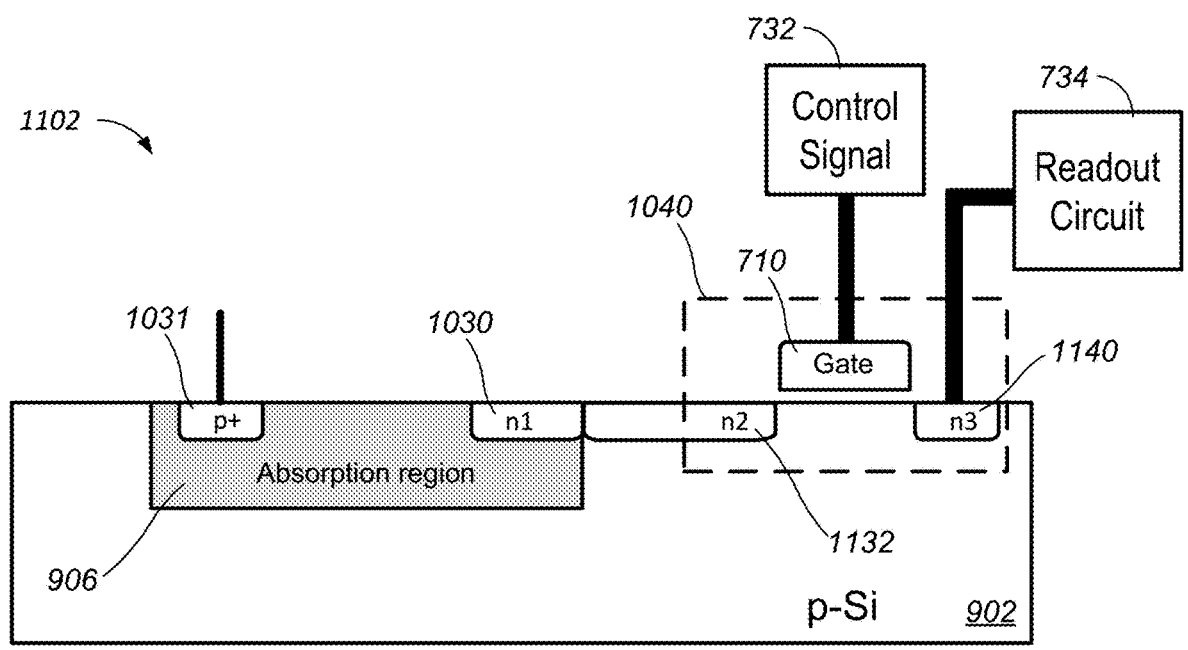

Referring to FIG. 11B, an example photodiode 1102 with improved carrier transfer is shown. The photodiode 1102 is similar to the photodiode 1100 of FIG. 11A, but differs in that the first n-doped region 1030 has been extended to a right lateral edge of the absorption region 906, and the second n-doped region 1132 has been extended to the right lateral edge of the absorption region 906, such that the n-doped regions 1030 and 1132 meet at the heterojunction interface between the absorption region 906 and the substrate 902. The adjacency between the n-doped regions 1030 and 1132 may allow the photo-generated carriers to flow between the two regions without the interconnect 1150 of FIG. 11A.

Figure 11C:
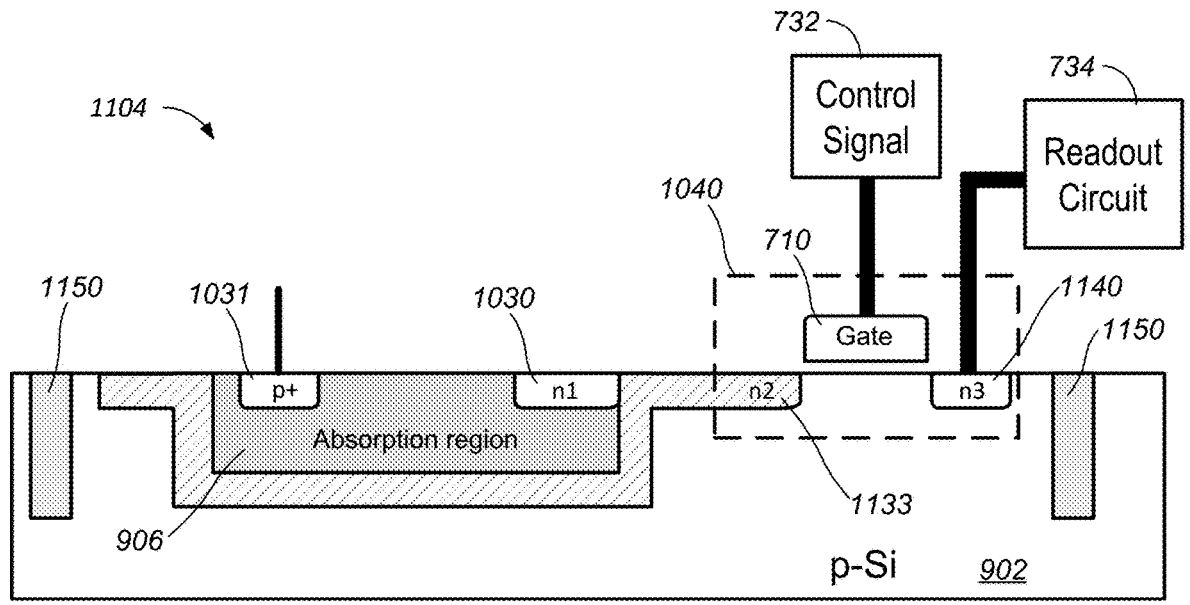

Referring to FIG. 11C, an example photodiode 1104 with improved carrier transfer is shown. The photodiode 1104 is similar to the photodiode 1102 of FIG. 11B, but differs in that the second n-doped region 1132 is now a second n-doped region 1133 that surrounds the absorption region 906, and isolation structures 1150 have been added. The second n-doped region 1133 is similar to the second n-doped region 1132, but differs in that the second n-doped region 1133 surrounds the embedded portion of the absorption region 906. The second n-doped region 1133 may be formed by etching a recess into the substrate 902, defining an implantation mask that opens the region surrounding the recess, and implanting N-type dopants into the recess to form the second n-doped region that surrounds the recess. The second n-doped region 1133 of FIG. 11C may have a relaxed alignment tolerance relative to the second n-doped region 1132 of FIG. 11B, as the configuration of FIG. 11C ensures that any portion of the silicon substrate 902 coming in contact with the first n-doped region 1030 is doped as the second n-doped region 1133 without relying on a precise lateral alignment of the second n-doped region 1133 to the interface between the absorption region 906 and the substrate 902.

The isolation structures 1150 may increase the electrical isolation between the photodiode 1104 and other electrical components that may be present on the substrate 902, such as other photodiodes 1104. The isolation structure 1150 extends from an upper surface of the substrate 902 and into a predetermined depth from the upper surface. In some implementations, the isolation structure 1150 is a doped region that has been doped with P-type dopants or N-type dopants. The doping of the isolation structure 1150 may create a bandgap offset-induced potential energy barrier that impedes a flow of current across the isolation structure 1150, improving electrical isolation between the photodiode 1104 and surrounding components. In some implementations, the isolation structure 1150 is a trench filled with a semiconductor material that is different from the substrate 902. An interface between two different semiconductors formed between the substrate 902 and the isolation structure 1150 may create a bandgap offset-induced energy barrier that impedes a flow of current across the isolation structure 1150, improving electrical isolation between the photodiode 1104 and surrounding components. In some implementations, the isolation structure 1150 is a trench filled with a dielectric or an insulator. The isolation structure 1150 filled with a low conductivity dielectric or insulator may provide a region of high electrical resistance, impeding a flow of current across the isolation structure 1150, improving electrical isolation between the photodiode 1104 and surrounding components.

Figure 11D:
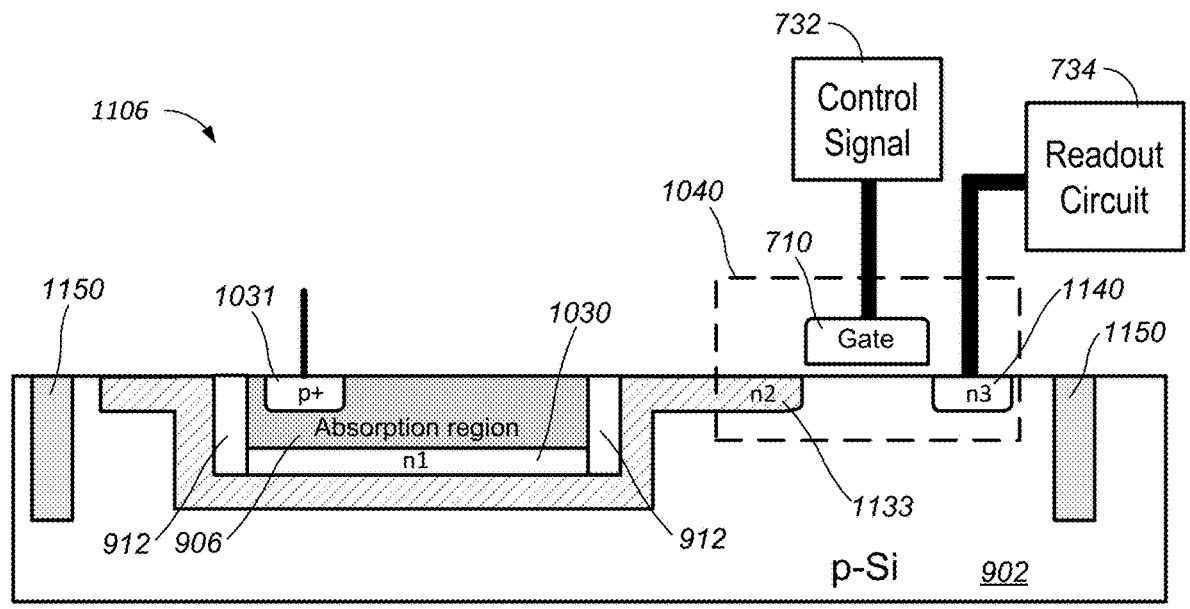

Referring to FIG. 11D, an example photodiode 1106 with improved carrier transfer is shown. The photodiode 1106 is similar to the photodiode 1104 of FIG. 11C, but differs in that the spacers 912 of FIG. 9B have been added, and the first n-doped region 1030 has moved to the bottom surface of the absorption region 906 that interfaces with the substrate 902. The p-doped region 1031 and the first n-doped region 1030 forms a vertical PIN diode. The spacers 912 may provide electrical isolation along the vertical sidewalls of the absorption region 906 from the silicon substrate 902, and confines the flow of the photo-generated carriers in a vertical direction along the absorption region 906. The photo-generated carriers are collected by the second n-doped region 1133 at the bottom interface between the absorption region 906 and the substrate 902, which are in turn driven towards the floating-diffusion capacitor 1140 when the MOSFET 1040 is turned on. In some implementations, the first doping region 1030 may be formed by diffusing the dopants of the second doping region 1333 into the absorption region 906 (e.g., through thermal processing). Because the diffusion-based formation of the region 1030 removes a dopant implantation step, the photodiode 1106 may be simpler to fabricate compared to the photodiode 1104 of FIG. 11C.

Figure 11E:
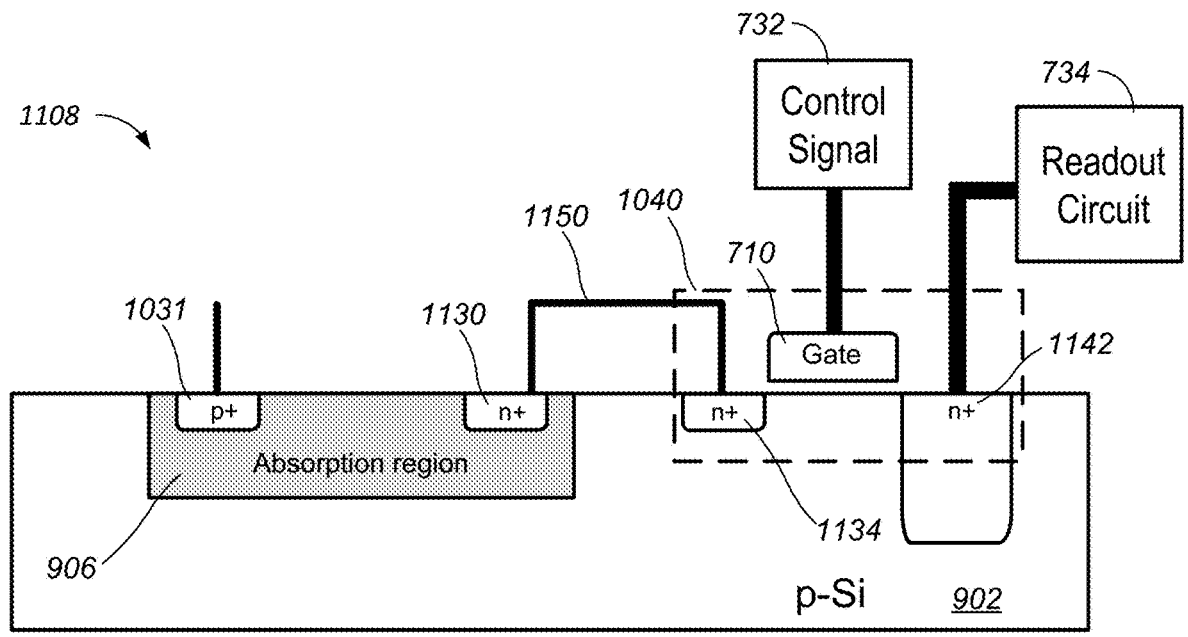

Photodiodes 1100, 1102, 1104, and 1106 utilize a difference in the doping concentrations across the first n-doped region 1030, the second n-doped regions 1132 or 1133, and the floating-diffusion capacitor 1140 to drive the transfer of photo-generated carriers from the absorption region to the floating-diffusion capacitor 1140 when the MOSFET 1040 is turned on. Another technique for improving the carrier transfer is by utilizing a charge sharing effect across capacitances associated with different doped regions. Referring to FIG. 11E, an example photodiode 1108 with improved carrier transfer is shown. The photodiode 1108 is similar to the photodiode 1100 of FIG. 11A, but differs in that the first n-doped region 1030 is now a first n-doped region 1130, the second n-doped region 1132 is now a second n-doped region 1134, and the floating-diffusion capacitor 1140 is now a floating-diffusion capacitor 1142. The floating-diffusion capacitor 1142 has a capacitance substantially larger than respective capacitances associated with the first n-doped region 1130 and the second n-doped region 1134.

In this configuration, a fourth doping concentration n4 of the first n-doped region 1130, a fifth doping concentration n5 of the second n-doped region 1134, and a sixth doping concentration n6 of the floating-diffusion capacitor 1142 may be high (e.g., greater than $5*10^{19}$ cm$^{-3}$) and substantially similar (e.g., within 1%, within 5%, within 10%, or within 20% of a value X). For example, n4, n5, and n6 may be substantially equal to $1*10^{20}$ cm$^{-3}$. A high doping concentration reduces the metal-semiconductor contact resistance, which is turn decreases the associated RC time constant of charge sharing, resulting in a faster carrier transfer.

By increasing the size of the n-doped region of the floating-diffusion capacitor 1142 relative to the size of the n-doped regions 1130 and 1134, the capacitance of the floating-diffusion capacitor 1142 can be made to be substantially larger than that of the n-doped regions 1130 and 1134. Moreover, doped regions, such as the first n-doped region 1130, the second n-doped region 1134, and the n-doped region forming the floating-diffusion capacitor 1142, may form PN junctions with the surrounding material, such as the absorption region 906 or the substrate 902. Such PN junctions contribute junction capacitances, which further increase the capacitances associated with the first n-doped region 1130, the second n-doped region 1134, and the n-doped region forming the floating-diffusion capacitor 1142. The junction capacitances may depend on various factors including the physical sizes and the doping concentrations of the doped regions.

The capacitances of the first n-doped region 1130, the second n-doped region 1134, and the floating-diffusion capacitor 1142 are electrically coupled in parallel when the MOSFET 1040 is turned on. When capacitors are coupled in parallel, the capacitors share a common voltage across its terminals through a process referred to as charge sharing. The voltage V across a capacitor is defined by the amount of charge stored by the capacitor in an equation V=Q/C, where Q is the amount of charge stored by a capacitor, and C is the capacitance of the capacitor. As such, when parallel capacitors share a same voltage $V_1$, the charge Q stored by an individual capacitor is given by relation $Q=V_1*C$. Therefore, by designing the first and second n-doped regions 1130 and 1134, and the floating-diffusion capacitor 1142 such that the capacitance of the floating-diffusion capacitor 1142 is substantially larger than the capacitances of the n-doped regions 1130 and 1134, the charge Q stored by the floating-diffusion capacitor 1142 can be made to be substantially larger than the charge stored by the n-doped regions 1130 and 1134, thereby improving carrier transfer efficiency from the absorption region 906 to the floating-diffusion capacitor 1142. For example, the capacitance of the floating-diffusion capacitor 1142 may be at least 10 times larger (e.g., 20 times larger, 40 times larger, or 50 times larger) than a combined capacitance of the first n-doped region 1130 and the second n-doped region 1134.

In some implementations, the doping engineering described in relation to FIGS. 11A-11D may be implemented in combination with the charge-sharing technique of FIG. 11E. For example, the doping concentrations may be set to satisfy the inequality n4<n5<n6, while simultaneously ensuring that the capacitance of the floating-diffusion capacitor 1142 is substantially larger than the combined capacitances of the n-doped regions 1130 and 1134.

In some implementations, instead of increasing the size of floating-diffusion capacitor 1142 relative to the floating-diffusion capacitor 1140 to increase the capacitance associated with the readout region of the photodiode 1108, the capacitance associated with the readout region may be increased by coupling a separate capacitor such as a metal-oxide-metal (MOM) capacitor, a metal-insulator-metal (MIM) capacitor, or a metal-oxide-semiconductor (MOS) capacitor. The added capacitance by the separate capacitor may provide benefits analogous to the increasing of the capacitance of the floating-diffusion capacitor 1142. In some implementations, the separate capacitor may be coupled to the readout region in parallel with the floating-diffusion capacitor 1142 to further increase the capacitance of the readout region.

Figure 11F:
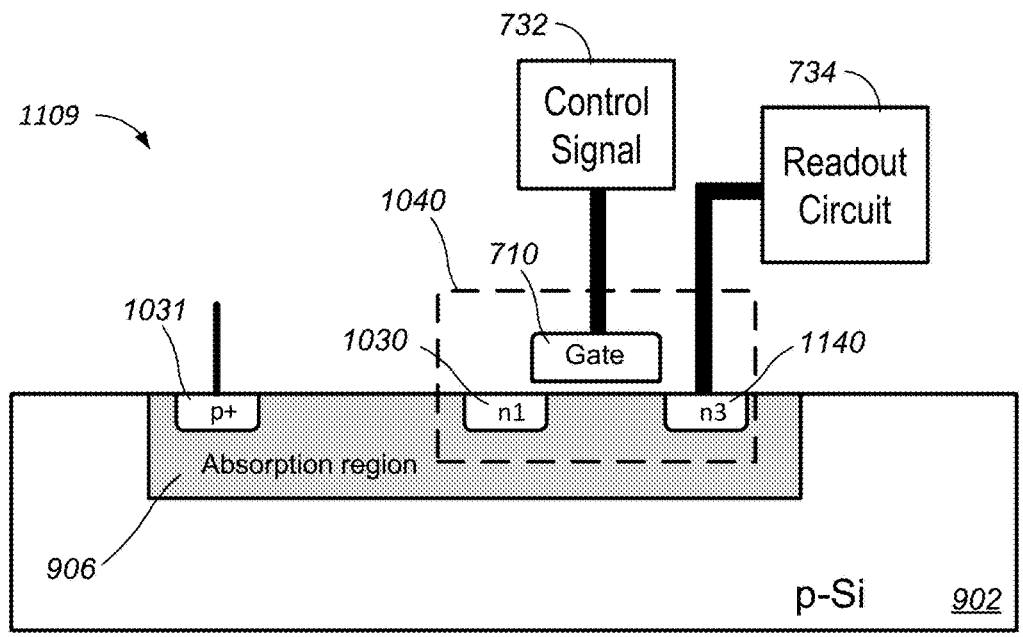

Referring to FIG. 11F, an example photodiode 1109 with improved carrier transfer is shown. The photodiode 1109 is similar to the photodiode 1100 of FIG. 11A, but differs in that the MOSFET 1040 is now supported by the absorption region 906. The relocation of the MOSFET 1040 to be supported entirely within the absorption region 906 eliminates a need for the second n-doped region 1132 formed on the silicon substrate 902 and the interconnect 1150 that coupled the second n-doped region 1132 to the first n-doped region 1030. In this configuration, the photo-generated carriers generated within the absorption region 906 does not flow from the absorption region 906 to the substrate 902. Instead, the photo-generated carriers flow directly from the absorption region 906 to the readout circuit 734 under control of the gate 710. As such, the photo-generated carriers do not experience a built-in potential across the absorption region 906 and the substrate 902. In addition, the difference between the first doping concentration n1 of the first n-doped region 1030 and the third doping concentration n3 of the floating-diffusion capacitor 1140 may improve carrier transfer between the first n-doped region 1030 and the floating-diffusion capacitor 1140.

In some implementations, a capacitor may be coupled to the readout region of the photodiode 1109, such as the floating-diffusion capacitor 1140. Examples of the capacitors include MOM, MIM, and MOS capacitors.

While photodiodes having p-doped region 1031, n-doped regions 1030, 1130, 1132, 1133, 1134, and N-type floating-diffusion capacitors 1140 and 1142 have been described in relation to FIGS. 11A through 11F, the doping polarity may be reversed in some implementations and operate in an analogous manner.

While the gate 710 for controlling the transport of carriers between the absorption region 906 and the readout region 1140 and 1142 have been described in relation to FIGS. 11A through 11F, other control mechanisms have been contemplated. For example, the gate 710 may be replaced with a p-doped base terminal to form an NPN bipolar junction transistor in place of the MOSFET 1040 to control a flow of carriers to the readout region. As another example, the gate 710 may be replaced with a p-doped gate terminal and an n-doped channel to form an N-channel junction field effect transistor (JFET) in place of the MOSFET 1040.

Figure 11G:
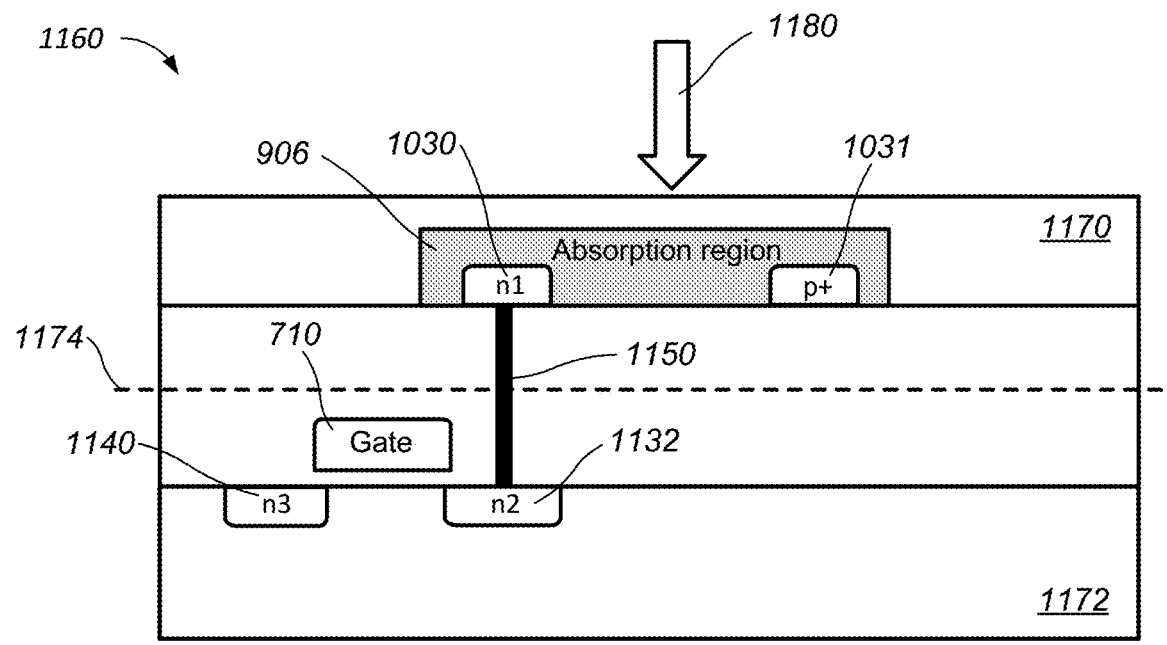
FIGS. 11G and 11H show examples of wafer-bonded photodiodes.

Photodiodes 1100, 1102, 1104, 1106, 1108, and 1109 described in relation to FIGS. 11A through 11F are fabricated on the substrate 902, and hence supported by substrate 902. In general, various components of the photodiodes may be separately fabricated on different semiconductor wafers, and be bonded to each other using various wafer bonding techniques to form a photodiode. Referring to FIG. 11G, a wafer-bonded photodiode 1160 is shown. The wafer-bonded photodiode 1160 is similar to the photodiode 1100 of FIG. 11A, but differs in that the absorption region 906, the p-doped region 1031, and the first n-doped region 1030 are now supported by a first semiconductor layer 1170, and the second n-doped region 1132, the gate 710, and the floating-diffusion capacitor 1140 are now supported by a second semiconductor layer 1172. The first semiconductor layer 1170 and the second semiconductor layer 1172 may be semiconductor wafers, such as a silicon wafer used in standard integrated circuit fabrication processes. The operation of the photodiode 1160 is analogous to the operation of the photodiode 1100.

The first semiconductor layer 1170 may be separately processed from the second semiconductor layer 1172. For example, the first semiconductor layer 1170 may be processed using a first fabrication process specialized for forming absorption region 906, and the second semiconductor layer 1172 may be processed using a second fabrication process specialized for forming the gate 710. The second fabrication process may be, for example, a sub 100 nm CMOS fabrication process for forming high-density digital circuits. A first portion of the interconnect 1150 may be fabricated during the processing of the first semiconductor layer 1170, and a second portion of the interconnect 1150 may be fabricated during the processing of the second semiconductor layer 1172. The processed first and second semiconductor layers 1170 and 1172 may then be bonded at a bonding interface 1174, mechanically coupling the first and second semiconductor layers 1170 and 1172, and electrically coupling the absorption region 906 to the second n-doped region 1132. The entity that results from bonding of the first and second layers 1170 and 1172 may be referred to as a substrate. Additional details regarding wafer bonding will be described later in relation to FIGS. 17A-17D and FIGS. 19A through 20F.

The bonding of the first and semiconductor layers 1170 and 1172 may optically obscure the first surface of the absorption region 906 facing the second semiconductor layer 1172. As such, an optical signal 1180 may enter the absorption region 906 from a second surface of the first semiconductor layer 1170 opposite to the surface where the absorption region 906 is formed. This illumination configuration may be referred to as back-side illumination.

Figure 11H:
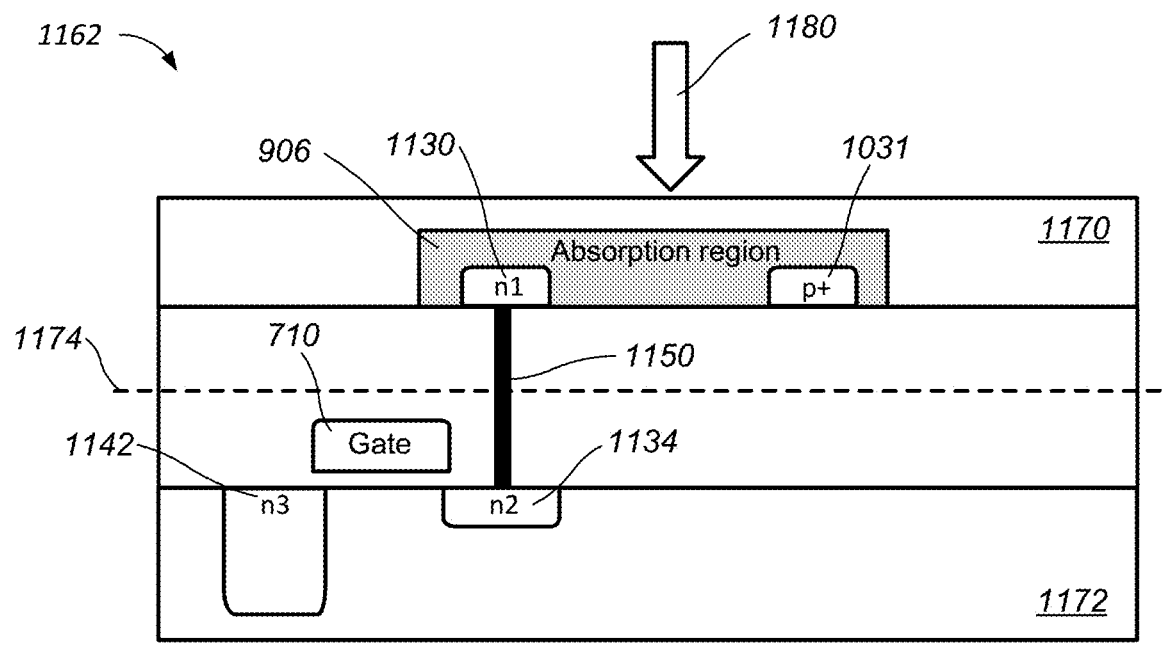

Referring to FIG. 11H, a wafer-bonded photodiode 1162 is shown. The wafer-bonded photodiode 1162 is similar to the photodiode 1108 of FIG. 11E, but differs in that the absorption region 906, the p-doped region 1031, and the first n-doped region 1130 are now supported by the first semiconductor layer 1170, and the second n-doped region 1134, the gate 710, and the floating-diffusion capacitor 1142 are now supported by the second semiconductor layer 1172. The fabrication process of the photodiode 1162 is similar to the fabrication process of the photodiode 1160, and the operation of the photodiode 1162 is analogous to the operation of the photodiode 1108.

Figure 12:
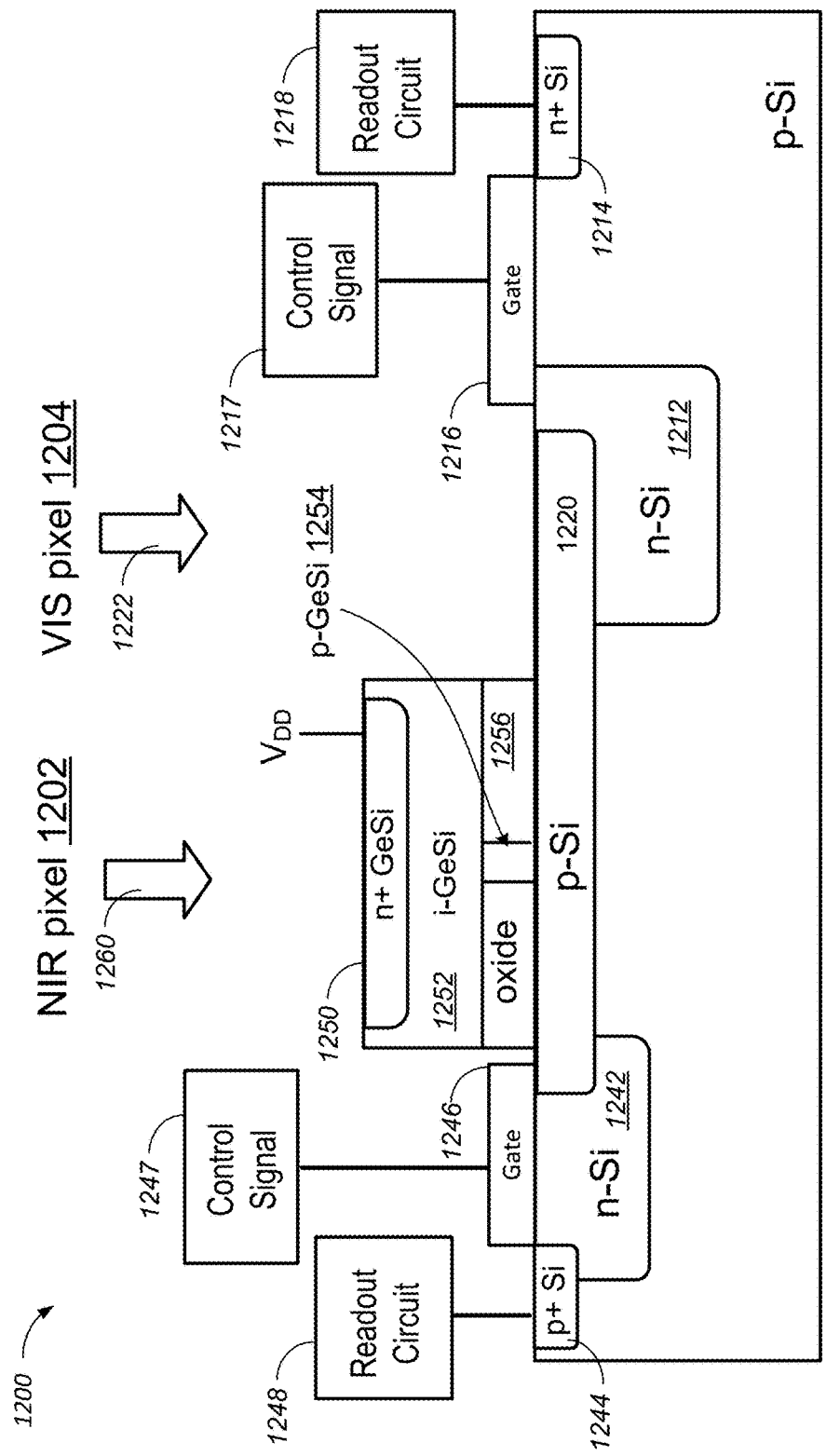
FIG. 12 is an example of a photodiode for detecting visible or infrared light.

FIG. 12 illustrates example photodiodes 1200 for detecting visible and infrared optical signals. The example photodiodes 1200 includes an NIR pixel 1202 for collecting holes and a visible pixel 1204 for collecting electrons, where the NIR pixel 1202 and the visible pixel 1204 are formed on a common substrate. The NIR pixel 1202 and the visible pixel 1204 are not separated by an isolation structure. The NIR pixel 1202 is configured to detect an optical signal having a wavelength in the NIR range. The visible pixel 1204 is configured to detect an optical signal having a wavelength in the visible range (e.g., blue and/or green and/or red). The NIR pixel 1202 and the visible pixel 1204 may be photodiodes in the sensor layer 108 as described in reference to FIG. 1, for example.

The visible pixel 1204 is configured to collect free electrons generated from photo-generated carriers, and includes an n-Si region 1212, an n+ Si region 1214, an p-Si region 1220, a first gate 1216, a first control signal 1217 coupled to the first gate 1216, and a first readout circuit 1218 coupled to the n+ Si region 1214. The n-Si region 1212 may be lightly doped with an n-dopant, e.g., about $10^{16}$ cm$^{-3}$ with phosphorus. The n+ Si region 1214 may have an n+ doping, where the activated dopant concentration is as high as a fabrication process may achieve, e.g., about $5 \times 10^{20}$ cm$^{-3}$ with phosphorous. The p-Si region 1220 may be lightly doped with a p-dopant, e.g., about $10^{16}$ cm$^{-3}$ with boron.

In general, the p-Si layer 1220 receives an optical signal 1222. Since the thickness of the p-Si layer 1220 is generally thin (e.g., 50-100 nm), the optical signal 1222 propagates into the n-Si region 1212, where the n-Si region 1212 absorbs the optical signal 1222 and converts the optical signal 1222 into free carriers. In some implementations, the optical signal 1222 may be filtered by a wavelength filter not shown in this figure, such as a filter in the filter layer 110 as described in reference to FIG. 1. In some implementations, a beam profile of the optical signal 1222 may be shaped by a lens not shown in this figure, such as a lens in the lens layer 112 as described in reference to FIG. 1.

In general, a difference between the Fermi level of the p-Si region 1220 and the Fermi level of the n-Si region 1212 creates an electric field between the two regions, where free electrons generated by the n-Si region 1212 are drifted towards the region below the p-Si region 1220 by the electric field. The first gate 1216 may be coupled to the first control signal 1217. For example, the first gate 1216 may be coupled to a voltage source, where the first control signal 1217 may be a DC voltage signal from the voltage source. The first control signal 1217 controls a flow of free electrons from the region below the p-Si region 1220 to the n+ Si region 1214. For example, if a voltage of the control signal 1217 exceeds a threshold voltage, free electrons accumulated in the region below the p-Si region 1220 will drift to the n+ Si region 1214 for collection. The n+ Si region 1214 may be coupled to the first readout circuit 1218 that processes the collected electrical signal. The first readout circuit 1218 may be similar to the first readout circuit 418 as described in reference to FIG. 4A.

The NIR pixel 1202 is configured to collect free holes generated from photo-generated carriers, and includes an n-Si region 1242, a p+ Si region 1244, a second gate 1246, a second control signal 1247 coupled to the second gate 1246, a second readout circuit 1248 coupled to the p+ Si region 1244, a n+ GeSi region 1250, an intrinsic GeSi region 1252, a p-Ge region 1254, and an oxide region 1256. In addition, the NIR pixel 1202 shares the p-Si region 1220 with the VIS pixel 1204.

The n-Si region 1242 may be lightly doped with an n-dopant, e.g., about $10^{15}$ cm$^{-3}$ with phosphorus. The p+ Si region 1244 may have an p+ doping, where the activated dopant concentration is as high as a fabrication process may achieve, e.g., about $5 \times 10^{20}$ cm$^{-3}$ with boron. The n+ GeSi region 1250 receives an optical signal 1260 and converts the optical signal 1260 into electrical signals. Since the thickness of the n+ GeSi layer 1250 is generally thin (e.g., 50-100 nm), the optical signal 1260 propagates into the intrinsic GeSi region 1252, where the intrinsic GeSi region 1252 absorbs the optical signal 1260 and converts the optical signal 1260 into free carriers. In some implementations, the optical signal 1260 may be filtered by a wavelength filter not shown in this figure, such as an NIR filter in the filter layer 110 as described in reference to FIG. 1. In some implementations, a beam profile of the optical signal 1260 may be shaped by a lens not shown in this figure, such as a lens in the lens layer 112 as described in reference to FIG. 1.

In some implementations, a thickness of the intrinsic GeSi region 1252 may be between 0.05 µm to 2 µm. In some implementations, the n+ GeSi region 1250 may repel the holes generated away from from the intrinsic GeSi region 1252 to avoid surface recombination and thereby may increase the carrier collection efficiency. For example, the n+ GeSi region 1250 may have a n+ doping, where the dopant concentration is as high as a fabrication process may achieve, e.g., about $5 \times 10^{20}$ cm$^{-3}$ when the intrinsic GeSi region 1250 is germanium and doped with phosphorus.

The photo-generated free holes in the intrinsic GeSi region 1252 may drift or diffuse into the p-Si region 1220. The photo-generated free electrons in the intrinsic GeSi region 1252 may be repelled by the p-GeSi region 1254, which prevents the free electrons from entering the p-Si region 1220. In some implementations, a drain supply voltage $V_{DD}$ may be applied to the NIR pixel 1202 to create an electric field between the n+ GeSi region 1250 and the p-Si region 1220, such that the free holes may drift towards the p-Si region 1220 while the free electrons may drift towards the n+ GeSi region 1250.

The second gate 1246 may be coupled to the second control signal 1247. For example, the second gate 1246 may be coupled to a voltage source, where the second control signal 1247 may be a DC voltage signal from the voltage source. The second control signal 1247 controls a flow of free holes from the p-Si region 1220 to the p+ Si region 1244. For example, if a voltage of the second control signal 1247 exceeds a threshold voltage, free holes accumulated in the p-Si region 1220 will drift towards the p+ Si region 1244. The p+ Si region 1244 may be coupled to the second readout circuit 1248 for further processing of the collected electrical signal.

Although not shown in FIG. 12, in some other implementations, the visible pixel 1204 may alternatively be fabricated to collect holes instead of electrons and the NIR pixel 1202 may alternatively be fabricated to collect electrons instead of holes. In this case, the p-Si region 1220 would be replaced by an n-Si region, the n-Si regions 1242 and 1212 would be replaced by p-Si regions, the p+ Si region 1244 would be replaced by an n+ Si region, the n+ Si region 1214 would be replaced by a p+ Si region, the n+ GeSi region 1250 would be replaced by a p+ GeSi region, and the p-GeSi region 1254 would be replaced by an n-GeSi region.

In some implementations, the direction of light signal shown in FIGS. 4A, 4B, 5, 6, 7, 8, and 9 may be reversed depending on designs, packaging, and applications. For example, referring to FIG. 4A, the optical signal 406 may enter the NIR pixel 402 through the p+ Si region 423, propagate through the n-Si region 422, and then be absorbed by the intrinsic GeSi region 433.

Figure 13:
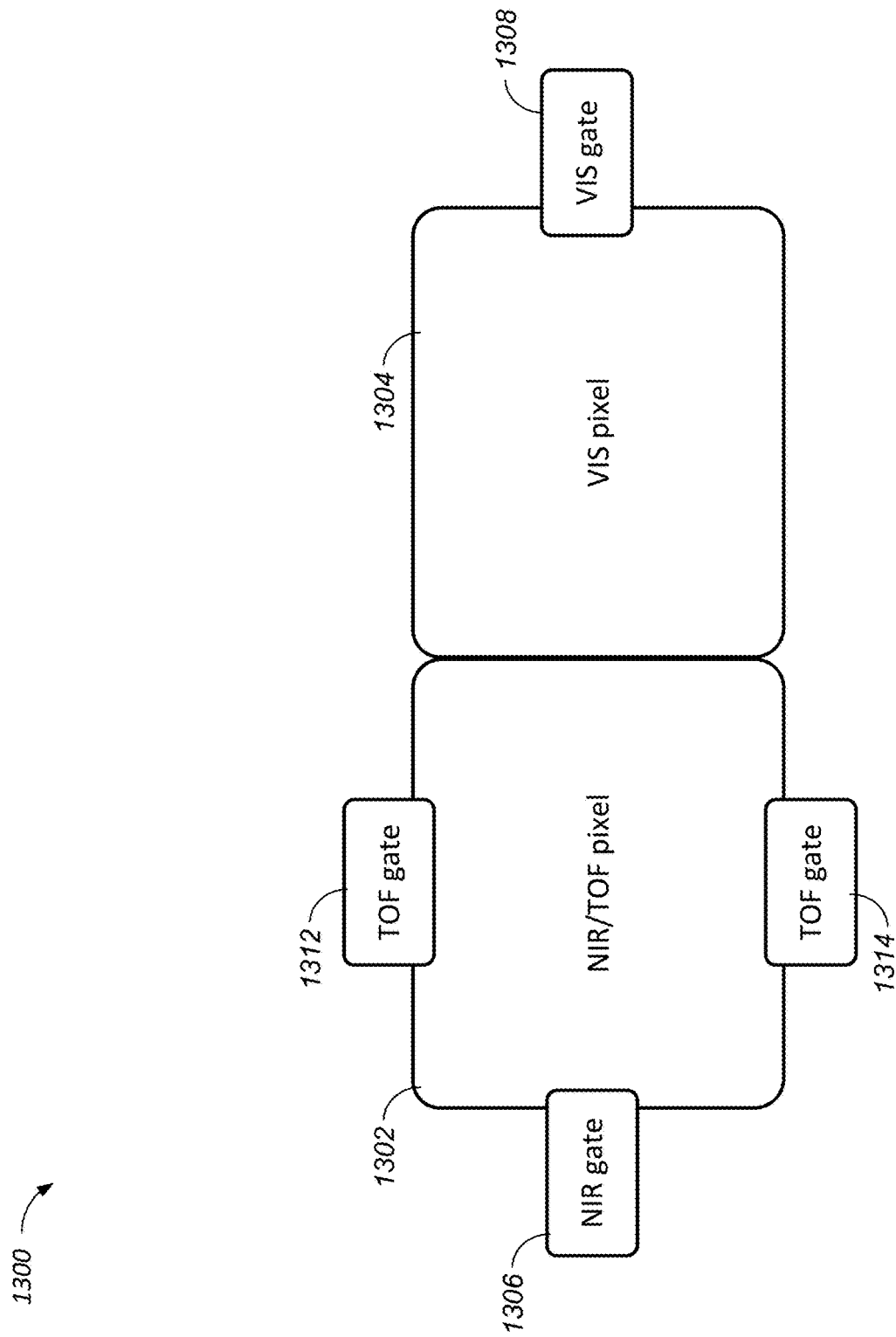
FIG. 13 is an example of an integrated photodiode array for detecting visible and/or infrared light.

FIG. 13 shows a top view of an example integrated photodiode array 1300 for detecting visible and NIR light as well as for a TOF application. The photodiode array 1300 includes a NIR/TOF pixel 1302 and a VIS pixel 1304. The NIR/TOF pixel 1302 includes an NIR gate 1306, a first TOF gate 1312, and a second TOF gate 1314. The VIS pixel 1304 includes a VIS gate 1308. The NIR/TOF pixel 1302 and the VIS pixel 1304 are not isolated by an isolation structure. The controls of the charge readout using the NIR gate 1306 and the VIS gate 1308 are similar to the multi-gate photodiode 1200 as described in reference to FIG. 12. The controls of the charge readout using the TOF gates 1312 and 1314 are similar to the multi-gate photodiode 700 as described in reference to FIG. 7, the multi-gate photodiode 800 as described in reference to FIG. 8, or the multi-gate version of the photodiodes 1010, 1012, 1014, 1100, 1102, 1104, 1106, 1108, 1109, 1160, and 1162 as described in reference to FIGS. 10B-10D and 11A-11H. The readout circuits coupled to the NIR gate 1306 and the TOF gates 1312 and 1314 would collect the same type of carriers, and the readout circuit coupled to the VIS gate 1008 would collect the opposite type of carriers. For example, if the readout circuits of the NIR gate 1306 and the TOF gates 1312 and 1314 are configured to collect electrons, the readout circuit coupled to the VIS gate 1308 would be configured to collect holes. Conversely, if the readout circuits of the NIR gate 1306 and the TOF gates 1312 and 1314 are configured to collect holes, the readout circuit coupled to the VIS gate 1308 would be configured to collect electrons.

Figure 14:
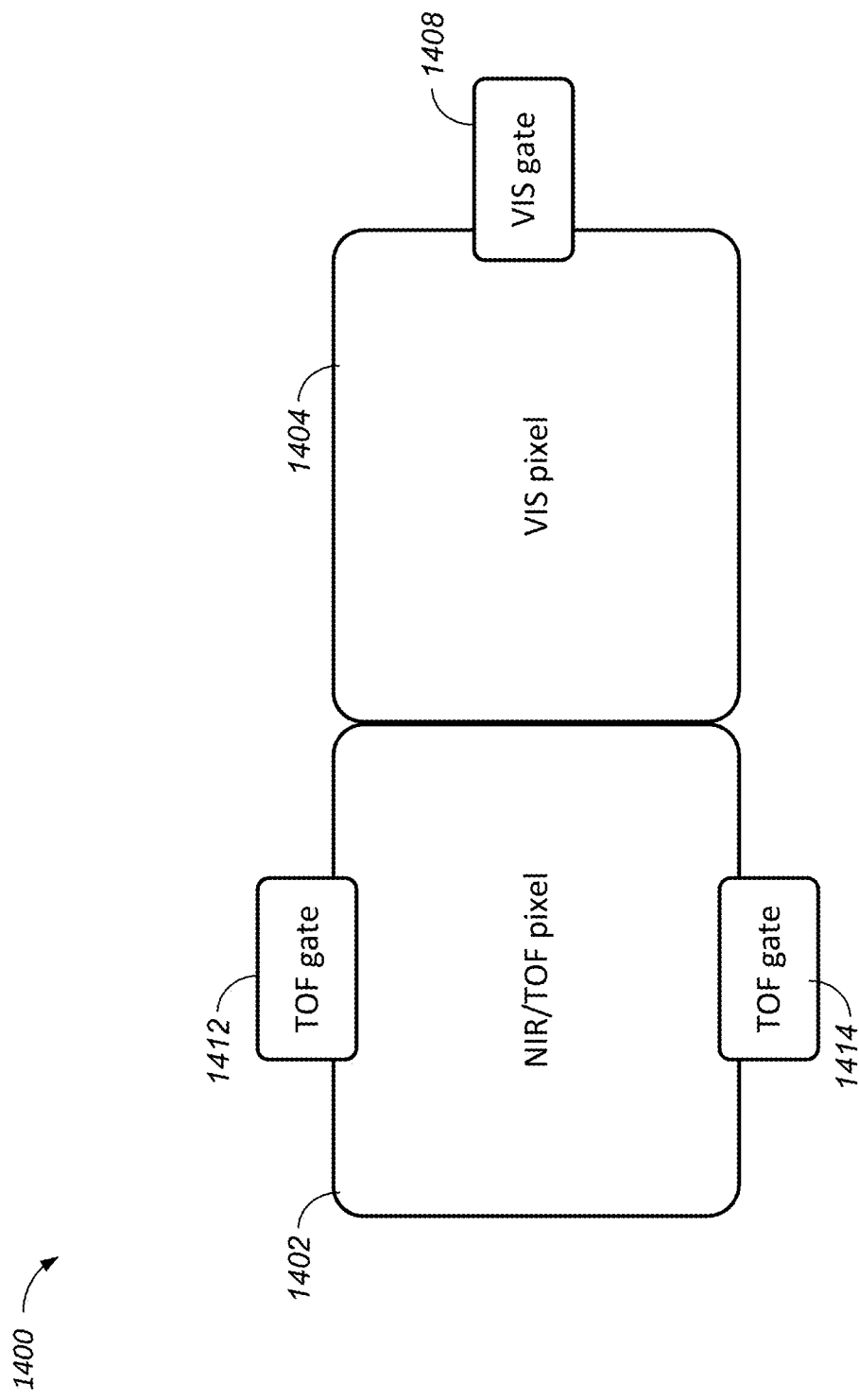
FIG. 14 is an example of an integrated photodiode array for detecting visible and/or infrared light.

FIG. 14 shows a top view of an example integrated photodiode array 1400 for detecting visible light and for a TOF application. The photodiode array 1400 includes a NIR/TOF pixel 1402 and a VIS pixel 1404. The NIR/TOF pixel 1402 includes a first TOF gate 1412, and a second TOF gate 1414. The VIS pixel 1404 includes a VIS gate 1408. The NIR/TOF pixel 1402 and the VIS pixel 1404 are not isolated by an isolation structure. The controls of the charge readout using the VIS gate 1408 and the TOF gate 1412 or 1414 are similar to the multi-gate photodiode 1200 as described in reference to FIG. 12. The controls of the charge readout using the TOF gates 1412 and 1414 are similar to the multi-gate photodiode 700 as described in reference to FIG. 7, the multi-gate photodiode 800 as described in reference to FIG. 8, or the multi-gate version of the photodiodes 1010, 1012, 1014, 1100, 1102, 1104, 1106, 1108, 1109, 1160, and 1162 as described in reference to FIGS. 10B-10D and 11A-11H. The readout circuits coupled to the TOF gates 1412 and 1414 would collect the same type of carriers, and the readout circuit coupled to the VIS gate 1408 would collect the opposite type of carriers. For example, if the readout circuits of the TOF gates 1412 and 1414 are configured to collect electrons, the readout circuit coupled to the VIS gate 1408 would be configured to collect holes. Conversely, if the readout circuits of the TOF gates 1412 and 1414 are configured to collect holes, the readout circuit coupled to the VIS gate 1408 would be configured to collect electrons.

Figure 15:
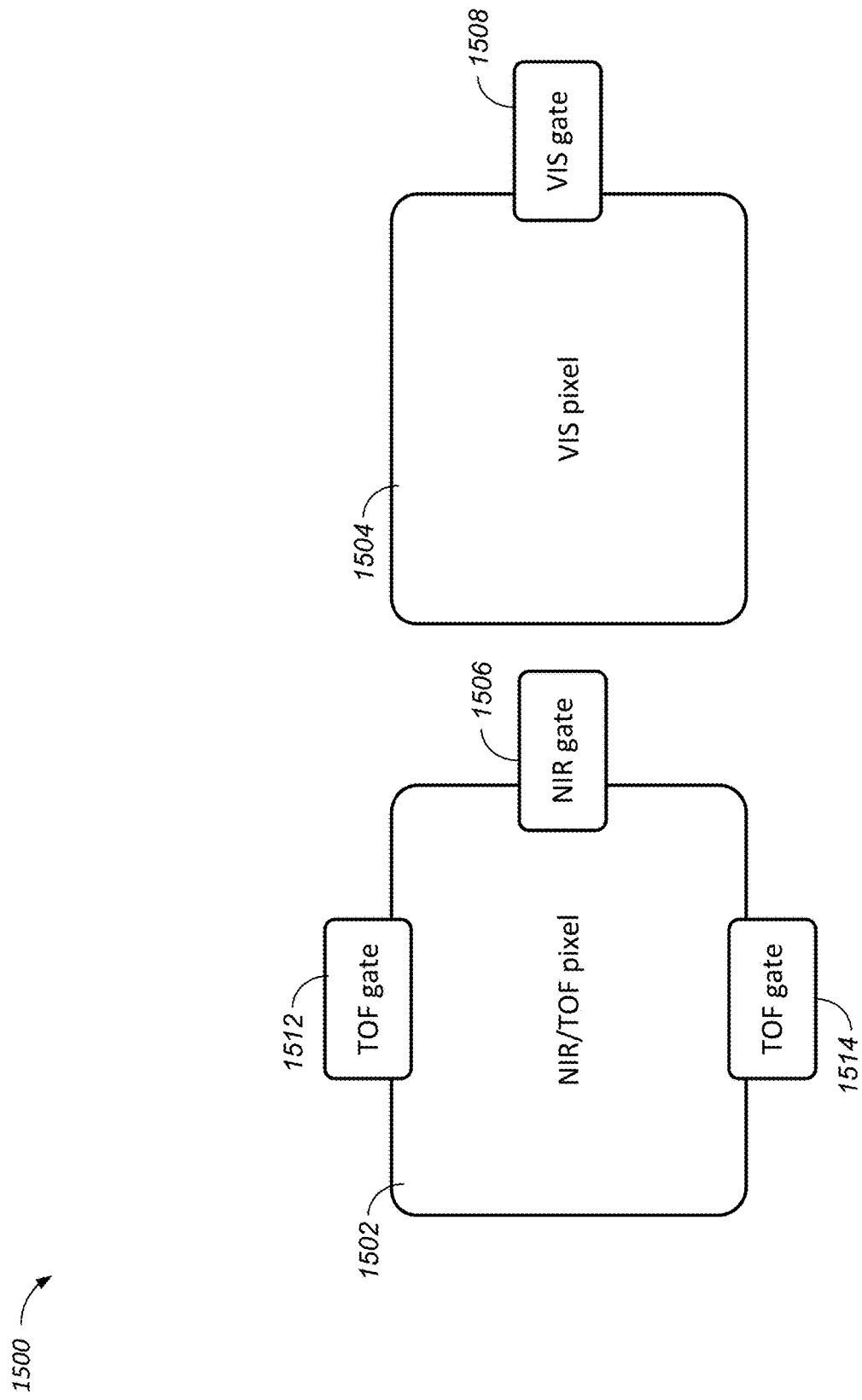
FIG. 15 is an example of an integrated photodiode array for detecting visible and/or infrared light.

FIG. 15 shows a top view of an example integrated photodiode array 1500 for detecting visible and NIR light as well as for a TOF application. The photodiode array 1500 includes a NIR/TOF pixel 1502 and a VIS pixel 1504. The NIR/TOF pixel 1502 includes an NIR gate 1506, a first TOF gate 1512, and a second TOF gate 1514. The VIS pixel 1504 includes a VIS gate 1508. The NIR/TOF pixel 1502 and the VIS pixel 1504 are isolated by an isolation structure. The controls of the charge readout using the NIR gate 1506 and the VIS gate 1508 are similar to the photodiodes 400 as described in reference to FIG. 4A, or the photodiodes 450 as described in reference to FIG. 4B, or the photodiodes 500 as described in reference to FIG. 5, or the photodiodes 600 as described in reference to FIG. 6. The controls of the charge readout using the NIR gate 1506 are similar to the photodiodes 1010, 1012, 1014, 1100, 1102, 1104, 1106, 1108, 1109, 1160, or 1162 as described in reference to FIGS. 10B-10D and 11A-11H. The controls of the charge readout using the TOF gates 1506 and 1508 are similar to the multi-gate photodiode 700 as described in reference to FIG. 7, the multi-gate photodiode 800 as described in reference to FIG. 8, or the multi-gate versions of the photodiodes 1010, 1012, 1014, 1100, 1102, 1104, 1106, 1108, 1109, 1160, and 1162 as described in reference to FIGS. 10B-10D and 11A-11H. The readout circuits coupled to the NIR gate 1506 and the TOF gates 1512 and 1514 would collect the same type of carriers, and the readout circuit coupled to the VIS gate 1508 may or may not collect the same type of carriers. For example, if the readout circuits of the NIR gate 1506 and the TOF gates 1512 and 1514 are configured to collect electrons, the readout circuit coupled to the VIS gate 1508 may be configured to collect holes or electrons depending on the design because the NIR/TOF pixel 1502 and the VIS pixel 1504 are isolated. Similarly, if the readout circuits of the NIR gate 1506 and the TOF gates 1512 and 1514 are configured to collect holes, the readout circuit coupled to the VIS gate 1508 may be configured to collect holes or electrons.

Figure 16:
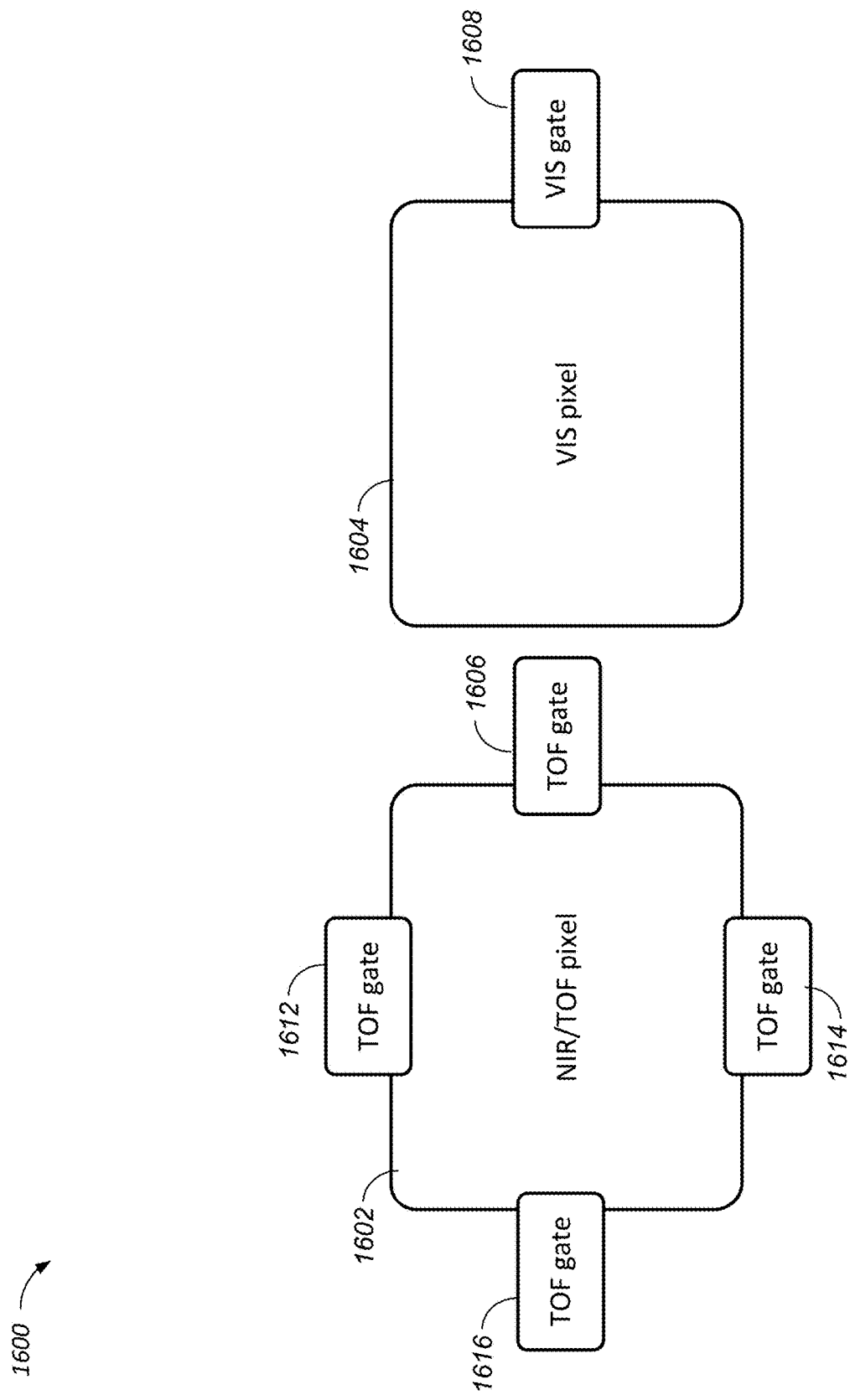
FIG. 16 is an example of an integrated photodiode array for detecting visible and/or infrared light.

FIG. 16 shows a top view of an example integrated photodiode array 1600 for detecting visible light as well as for a TOF application. The photodiode array 1600 includes a NIR/TOF pixel 1602 and a VIS pixel 1604. The NIR/TOF pixel 1602 includes a first TOF gate 1606, a second TOF gate 1612, a third TOF gate 1614, and a fourth TOF gate 1616. The four TOF gates may be used to extract additional phase information about the collected signal. The VIS pixel 1604 includes a VIS gate 1608. The NIR/TOF pixel 1602 and the VIS pixel 1604 are isolated by an isolation structure. The controls of the charge readout using the VIS gate 1608 and the TOF gate 1606, 1612, 1614, and 1616 are similar to the photodiodes 400 as described in reference to FIG. 4A, or the photodiodes 450 as described in reference to FIG. 4B, or the photodiodes 500 as described in reference to FIG. 5, or the photodiodes 600 as described in reference to FIG. 6. The controls of the charge readout using the TOF gates 1606, 1612, 1614, and 1616 are similar to the multi-gate photodiode 700 as described in reference to FIG. 7, the multi-gate photodiode 800 as described in reference to FIG. 8, or the multi-gate versions of the photodiodes 1010, 1012, 1014, 1100, 1102, 1104, 1106, 1108, 1109, 1160, and 1162 as described in reference to FIGS. 10B-10D and 11A-11H. The readout circuits coupled to the TOF gates 1606, 1612, 1614, and 1616 would collect the same type of carriers, and the readout circuit coupled to the VIS gate 1608 may or may not collect the same type of carriers. For example, if the readout circuits of the TOF gates 1606, 1612, 1614, and 1616 are configured to collect electrons, the readout circuit coupled to the VIS gate 1608 may be configured to collect holes or electrons depending on the design because the NIR/TOF pixel 1602 and the VIS pixel 1604 are isolated. Similarly, if the readout circuits of the TOF gates 1606, 1612, 1614, and 1616 are configured to collect holes, the readout circuit coupled to the VIS gate 1608 may be configured to collect holes or electrons.

Figure 17A:
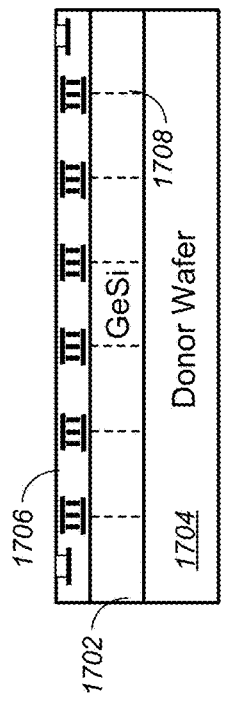
FIGS. 17A-17D illustrate an example design for fabricating a photodiode array.

FIGS. 17A-17D illustrate an example design 1700 for fabricating a photodiode array. Referring to FIG. 17A, a germanium-silicon layer 1702 was formed on a donor wafer 1704. The donor wafer 1704 may be a silicon wafer. The germanium-silicon layer 1702 may be formed using epitaxial growth through chemical vapor deposition (CVD) system.

Figure 17B:
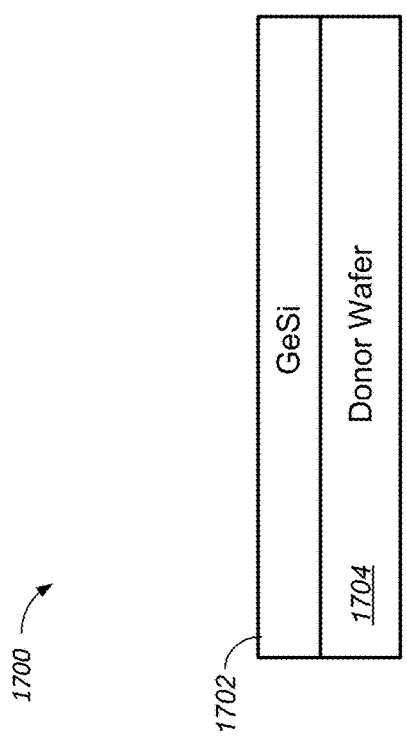

Referring to FIG. 17B, the isolation structures 1708 are formed in the germanium-silicon layer 1702 to define the photodiode regions. The isolation structures 1708 may be formed through dry-etch of the isolation structure patterns followed by a deposition of insulating materials such as oxide, or by implantations to form a doping junction, or any other suitable techniques. Although not shown in the figure, there may be one or more processing steps that further process the photodiodes. For example, there may be a doping step to define a p+ GeSi region on the surface of an intrinsic GeSi region. An interconnect layer 1706 is then formed on the germanium-silicon layer 1702, where multiple interconnects are formed in a dielectric layer to establish electrical connections with the germanium-silicon layer 1702, and where alignment marks for bonding alignment are formed.

Figure 17C:
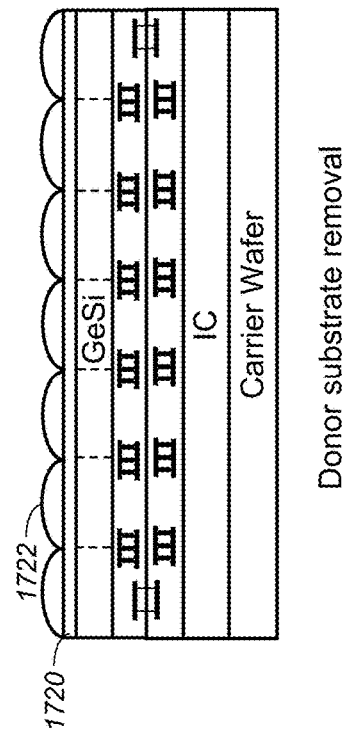

Referring to FIG. 17C, an interconnect layer 1716 of a carrier substrate 1714 is bonded with the interconnect layer 1706 of the donor wafer 1704. Note that the interconnect layer referred herein may include conductive electrical path (e.g. metallic layer) and dielectric layer to isolate individual conductive electrical path. The carrier substrate 1714 may be a silicon substrate, where one or more layers 1718 of circuitry may be formed on the silicon substrate. The circuitry may be control circuitry, readout circuitry, and/or any other suitable circuitry for the photodiode array. Alignment marks may be formed in both the layers 1706 and 1716 by any suitable techniques. The bonding between the layers 1706 and 1716 may be done by any suitable techniques such as thermal bonding or hybrid bonding including metal-metal bonding and oxide-oxide bonding.

Figure 17D:
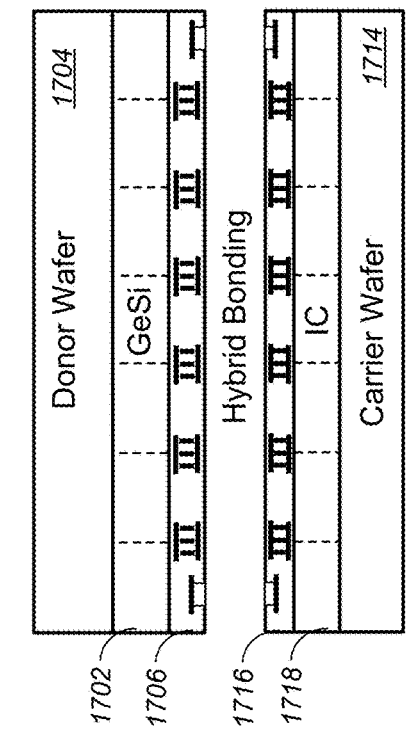

Referred to FIG. 17D, a filter layer 1720 and a lens layer 1722 are formed on the germanium-silicon layer 1702 to form the photodiode array. Although not shown, the donor wafer 1704 may be removed by polishing or other suitable techniques after bonding and before forming the filter layer 1720. In some other implementations, although not shown in these figures, germanium may replace germanium-silicon as the sensor material in the descriptions related to FIGS. 17A-17D.

Figure 18A:
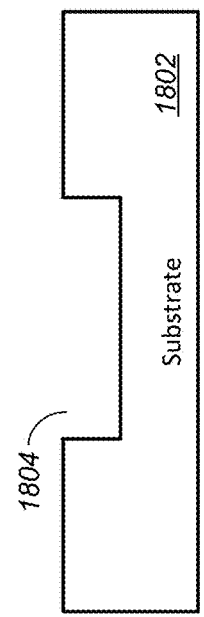
FIGS. 18A-18D illustrate an example of a design for forming germanium-silicon.

FIGS. 18A-18D illustrate an example design 1800 for selectively forming germanium-silicon on a substrate. The design 1800 may be used to fabricate the photodiode array 100, 200, or 300, for example. Referring to FIG. 18A, a recess 1804 is formed on a substrate 1802. The recess 1804 may define the photodiode area for an NIR pixel. The recess may be formed using lithography followed by a dry etching of the substrate 1802. The shape of the recess may correspond to the shape of the pixel, such as a square, a circle, or other suitable shapes.

Figure 18B:
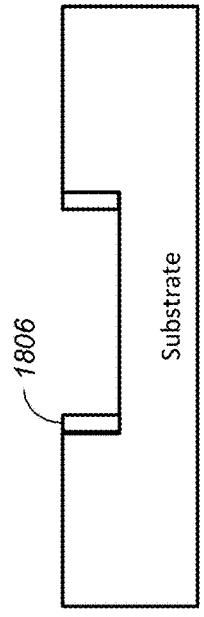
Figure 18C:
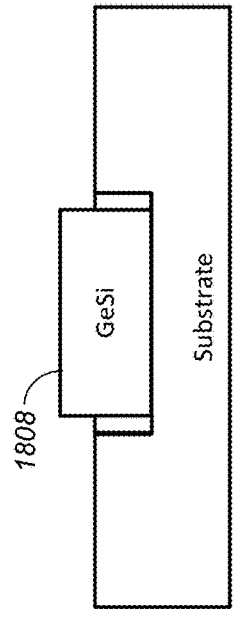

Referring to FIG. 18B, a dielectric layer may be deposited over the substrate, and a directional etch may be performed to form a sidewall spacer 1806. The directional etch may be an anisotropic dry etch. Referring to FIG. 18C, a germanium-silicon region 1808 is selectively grown from the substrate 1802. For example, the germanium-silicon region 1808 may be formed using epitaxial growth through chemical vapor deposition (CVD) system.

Figure 18D:
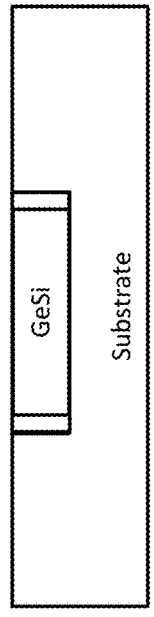

Referring to FIG. 18D, the germanium-silicon region 1808 is planarized with the substrate 1802. The germanium-silicon region 1808 may be planarized using chemical mechanical polishing (CMP) or any other suitable techniques. In some other implementations, although not shown in these figures, germanium may replace germanium-silicon as the sensor material in the descriptions related to FIGS. 18A-18D. In some implementations, the sidewall spacers 1806 may be omitted.

Figure 19A:
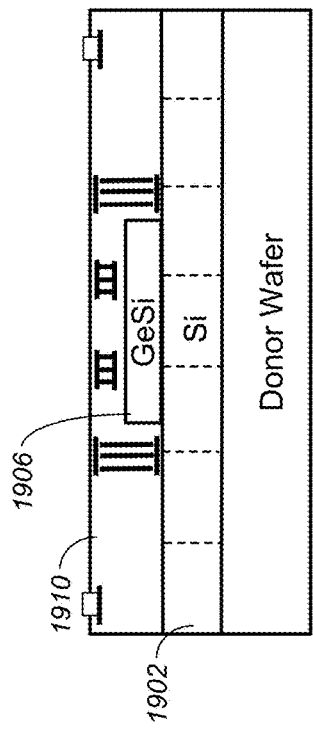
FIGS. 19A-19D illustrate an example design for fabricating a photodiode array.

FIGS. 19A-19D illustrate an example design 1900 for fabricating a photodiode array. The design 1900 may be used to fabricate the photodiodes 400, 450, 500, 600, 700, 800, 900, 910, 920, 1010, 1012, 1014, 1100, 1102, 1104, 1106, 1108, 1109, 1160, 1162, and 1200 as described respectively in reference to FIGS. 4A, 4B, 5, 6, 7, 8, 9, 10B-10D, 11A-11H, and 12, for example. Referring to FIG. 19A, silicon photodiodes 1902 are formed on a donor wafer 1904, and a germanium-silicon photodiode 1906 was selectively grown on the donor wafer 1904. The visible pixel 454 may be an example of a diode of the silicon photodiodes 1902, and the NIR pixel 452 may be an example of a diode of the GeSi photodiodes 1906. The selective growth of germanium-silicon photodiode may be done using the design 1800 as described in reference to FIG. 18A-18D or any other suitable designs or processes.

Figure 19B:
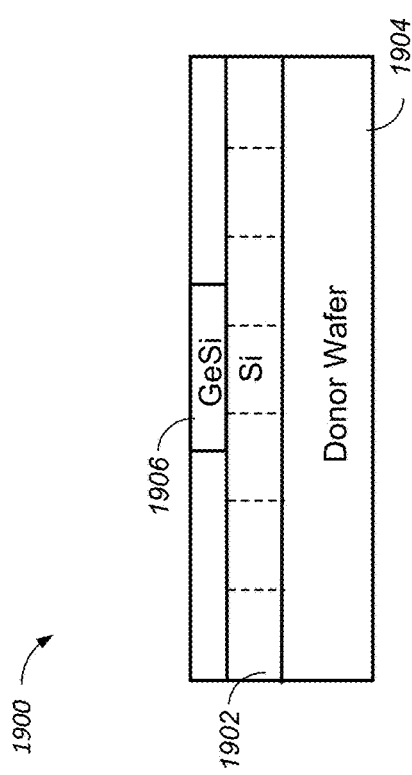

Referring to FIG. 19B, an interconnect layer 1910 is formed on the germanium-silicon photodiode 1906, where multiple interconnects are formed in a dielectric layer to establish electrical connections with the germanium-silicon photodiode 1906 and the silicon photodiodes 1902, and where alignment marks for bonding alignment are formed.

Figure 19C:
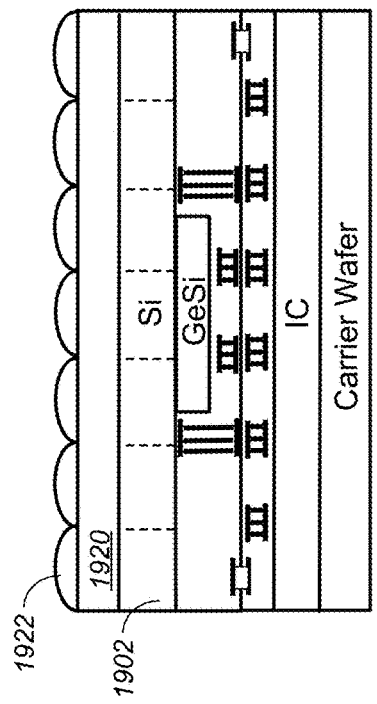

Referring to FIG. 19C, an interconnect layer 1916 of a carrier substrate 1914 is bonded with the interconnect layer 1910 of the donor wafer 1904. The carrier substrate 1914 may be a silicon substrate, where one or more layers 1918 of circuitry may be formed on the silicon substrate. The circuitry may be control circuitry, readout circuitry, and/or any other suitable circuitry for the photodiode array. Alignment marks may be formed in both the layers 1910 and 1916 by any suitable techniques. The bonding between the layers 1910 and 1916 may be done by any suitable techniques such as thermal bonding or hybrid bonding including metal-metal bonding and oxide-oxide bonding.

Figure 19D:
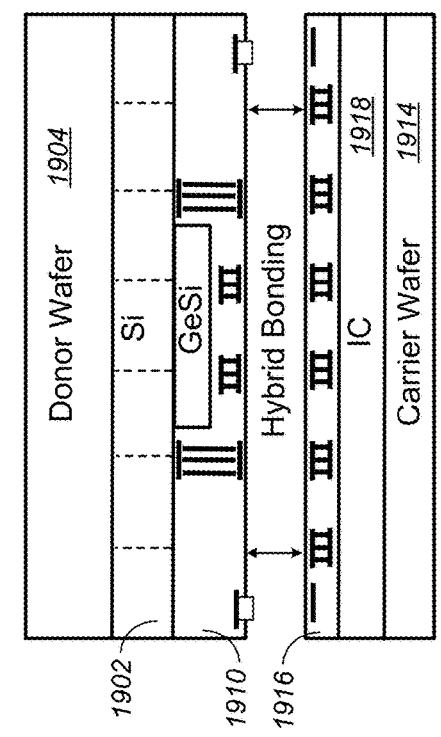

Referred to FIG. 19D, a filter layer 1920 and a lens layer 1922 are formed on the silicon photodiode 1902 to form the photodiode array. Although not shown, the donor wafer 1904 may be removed by polishing or other suitable techniques after bonding and before forming the filter layer 1920. In some other implementations, although not shown in these figures, germanium may replace germanium-silicon as the sensor material in the descriptions related to FIGS. 19A-19D.

Figure 20E:
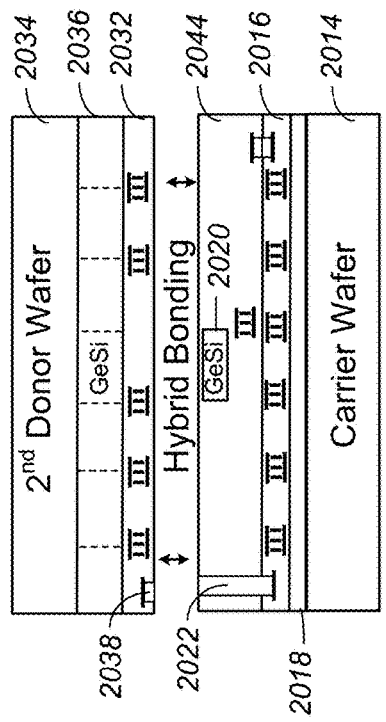

FIGS. 20A-20E illustrate an example design 2000 for fabricating a photodiode array. The design 2000 may be used to fabricate the photodiodes 400, 450, 500, 600, 700, 800, 900, 910, 920, 1010, 1012, 1014, 1100, 1102, 1104, 1106, 1108, 1109, 1160, 1162, and 1200 as respectively described in reference to FIGS. 4A, 4B, 5, 6, 7, 8, 9, 10B-10D, 11A-11H, and 12, for example. Referring to FIG. 20A, a germanium-silicon layer 2002 was formed on a first donor wafer 2004. A first interconnect layer 2006 is formed on the germanium-silicon layer 2002 with multiple interconnects and alignment marks.

Referring to FIG. 20B, an interconnect layer 2016 of a carrier substrate 2014 is bonded with the interconnect layer 2006 of the first donor wafer 2004. The carrier substrate 2014 may be a silicon substrate, where one or more layers 2018 of circuitry may be formed on the silicon substrate. The circuitry may be control circuitry, readout circuitry, and/or any other suitable circuitry for the photodiode array. The bonding between the layers 2006 and 2016 may be done by any suitable techniques such as thermal bonding or hybrid bonding including metal-metal bonding and oxide-oxide bonding.

Figure 20D:
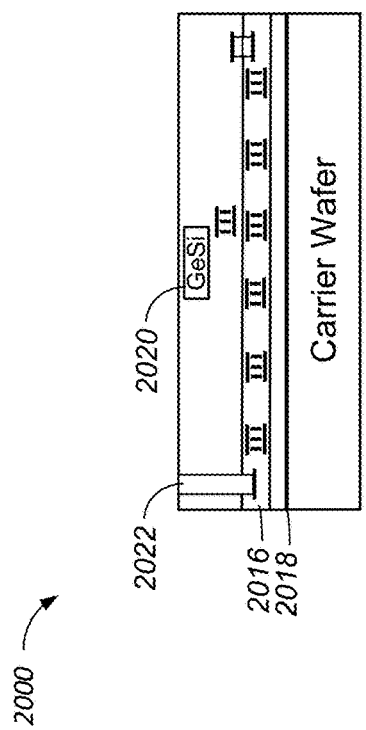

Referring to FIG. 20C, the first donor wafer 2004 is removed by polishing or other suitable techniques after bonding. Referring to FIG. 20D, a first germanium-silicon photodiode 2020 is formed. The first germanium-silicon photodiode 2020 may be formed using a pattern and an etch of the germanium-silicon layer 2002, followed by a deposition of a passivation layer such as a dielectric layer. The dielectric layer may be planarized through CMP or other suitable techniques. A via 2022 may be formed by an anisotropic etch followed by a deposition of conductive materials such as copper.

Referring to FIG. 20E, the dielectric layer 2044 of the carrier substrate 2014 is bonded with an interconnect layer 2032 of a second donor wafer 2034. A germanium-silicon photodiode array 2036 are formed on the second donor wafer 2034. The via 2038 is bonded with the via 2022 to establish electrical connections between the first germanium-silicon photodiode 2020, the germanium-silicon photodiode array 2036, and the integrated circuits 2018.

Figure 20F:
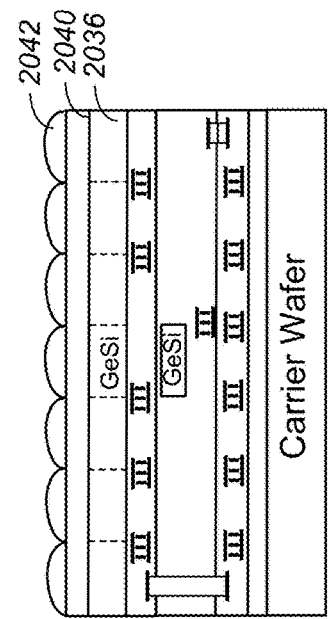

Referred to FIG. 20F, a filter layer 2040 and a lens layer 2042 are formed on the germanium-silicon photodiode array 2036 to form the photodiode array. Although not shown, the second donor wafer 2034 may be removed by polishing or other suitable techniques after bonding and before forming the filter layer 2040. In some other implementations, although not shown in these figures, germanium may replace germanium-silicon as the sensor material in the descriptions related to FIGS. 20A-20F.

Operation speed or bandwidth of a photodetector can be an important performance parameter for applications that benefit from high speed detection of light, such as TOF detection. Among characteristics that can affect bandwidth of a photodetector is the physical size of the photodetector, such as the area of the photodetector through which light is received. Reducing the area of the photodetector, for example, can lead to a reduction in device capacitance, carrier transit time, or a combination of both, which typically results in an increase in photodetector bandwidth. However, a reduction in the detection area of a photodetector can lead to a reduction in the amount of light (i.e., number of photons) detected by the photodetector. For example, for a given intensity of light per unit area, the reduction in the area of the detector leads to a reduction in detected light.

For applications that benefit from both high bandwidth and high detection efficiency, such as TOF detection, addition of a microlens before the photodetector may be beneficial. The microlens can focus the incident light onto the photodetector, allowing a small-area photodetector to detect light incident over an area larger than itself. For example, a properly designed combination of a microlens and a spacer layer (SL) that separates the microlens from the photodetector by an effective focal length of the microlens can allow focusing of the incident light to a diffraction-limited spot that is on the order of the square of the optical wavelength of the incident light. Such a scheme can allow reduction of photodetector area while mitigating the potential downsides of the photodetector area reduction.

Figure 21A:
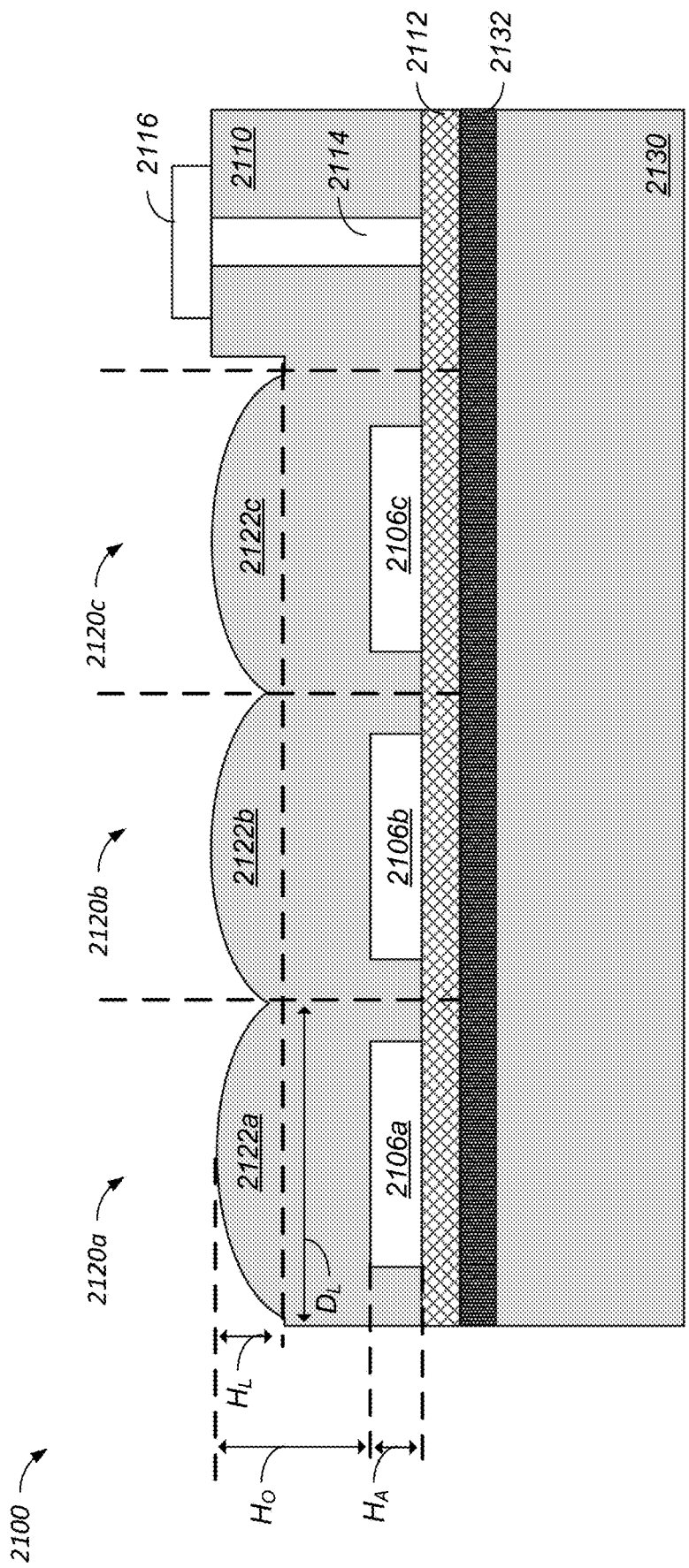
FIGS. 21A-21B are cross-sectional views of example configurations of microlenses integrated with photodetectors.

FIG. 21A shows a cross-sectional view of an example configuration 2100 of silicon lenses integrated with photodetectors. The configuration 2100 includes a donor wafer 2110 and a carrier wafer 2130. The donor wafer 2110 includes multiple pixels 2120a through 2120c (collectively referred to as pixels 2120), via 2114, metal pad 2116, and a first bonding layer 2112. The carrier wafer 2130 includes a second bonding layer 2132. The donor wafer 2110 and the carrier wafer 2130 are bonded to each other through the first bonding layer 2112 and the second bonding layer 2132. The substrate 2110 may be similar to substrate 102 of FIG. 1. The absorption region 2106 may be similar to the absorption regions 706, 806, and 906.

The pixels 2120a through 2120c include absorption regions 2106a through 2106c, respectively, and microlenses 2122a through 2122c (collected referred to as microlenses 2122), respectively. The microlenses 2122 are convex lenses that are integrated into or on the donor wafer 2110. In applications that benefit from high light collection efficiency, such as TOF detection, addition of microlenses 2122 may be beneficial. The convex configuration of the microlens 2122 can cause light incident on the microlens 2122 to be focused toward the absorption region 2106, which may improve light collection efficiency of the pixels 2120, leading to improved pixel performance. The arrangement of the pixel 2120 with the microlens 2122 on a backside of the donor wafer 2110 may be referred to as backside illumination.

The microlens 2122 has various characteristics that affect its performance, including geometrical parameters and material from which it is formed. The microlens 2122 is typically implemented in a plano-convex configuration, with one surface facing the incident light and being convex with a radius of curvature, and the other surface being a planar surface interfacing with the donor wafer 2110 in or on which the microlens 2122 is formed. The plano-convex configuration of the microlens 2122 may lend itself to fabrication through standard semiconductor processing techniques. The microlens 2122 may have a height $H_L$ and a diameter $D_L$, and may be separated from a lens-facing surface of the absorption region 2106 by a height $H_O$. In some implementations, $H_L$ may range from 1 to 4 µm, $H_O$ may range from 8 to 12 µm, HA may range from 1 to 1.5 µm, and $D_L$ may range from 5 to 15 µm. In some implementations, for a spherical-type microlens 2122, its radius of curvature may be set such that the focal length of the microlens 2122 is approximately equal to $H_O$ to achieve optimal focusing of light onto the absorption region 2106. The determination of the focal length and the radius of curvature may be performed using various simulation techniques such as beam propagation method (BPM) and finite difference time domain (FDTD) technique. In some implementations, the microlens 2122 is an aspheric lens.

The microlens 2122 can be formed from various materials and fabricated in various ways. In general, various materials that are transparent for the wavelengths to be detected by the pixels 2120 may be used. For example, the microlens 2122 may be fabricated from materials having moderate to high index of refraction (e.g., >1.5), such as crystalline silicon, polysilicon, amorphous silicon, silicon nitride, polymer, or combination thereof. For visible wavelengths, polymer materials may be used. For NIR wavelengths, silicon may be used as silicon is relatively transparent in the NIR, and has a relatively high index of refraction (approximately 3.5 at 1000 nm), making it well suited as a lens material in the NIR. Furthermore, as silicon is strongly absorbing in the visible wavelengths (e.g., <800 nm), a silicon microlens may block a substantial portion of visible light from reaching the absorption region 2106, which may be beneficial for applications where selective detection of NIR wavelengths is desired (e.g., ToF detection). A crystalline silicon microlens 2122 may be fabricated by patterning and etching a surface of the donor wafer 2110, which is typically a crystalline silicon wafer. As another example, polysilicon or amorphous silicon may be deposited on the surface of the donor wafer 2110, which may then be patterned and etched in similar fashion. The formation of microlens 2122 through etching of the crystalline silicon donor wafer 2110 or by etching of the polysilicon or amorphous silicon deposited on the donor wafer 2110 is an example method of integrally forming the microlens 2122 on the donor wafer 2110.

The patterning of the microlens 2122 may be performed using, for example, grayscale lithography techniques. In grayscale lithography, a feature to be patterned, such as the microlens, is exposed using a local gradation in the exposure dose, which translates into a gradation in the thickness of the resulting photoresist mask that has been developed. For example, the photoresist mask can be patterned to have a similar shape as the microlens 2122. The photoresist mask is then transferred onto the material underneath, such as the crystalline silicon donor wafer 2110, by semiconductor etching techniques such as plasma-based directional etching techniques, completing the fabrication of the microlens 2122. In some implementations, the local gradation in the exposure dose may be achieved, for example, by varying a fill-factor of sub-wavelength features on a photomask.

The absorption regions 2106 may be similar to absorption region 706, 806, and 906. The carrier wafer 2130 may include various electronic circuits that are coupled to the pixels 2120. For example, the electronic circuits may be coupled through structures such as the via 2114. The via 2114 may be coupled to a metal pad 2116 to interface with external electronics through, for example, a wire bond.

The carrier wafer 2130 and the donor wafer 2110 may be bonded or mechanically attached to one another through various techniques. For example, the first and second bonding layers 2112 and 2132 may be oxides (e.g., silicon dioxide), and the bonding may be an oxide-to-oxide bonding. As another example, the first and second bonding layers 2112 and 2132 may be metals (e.g., copper), and the bonding may be a metal-to-metal bonding. As yet another example, the first and second bonding layers 2112 and 2132 may be a combination of oxide and metals (e.g., silicon dioxide and copper), and the bonding may be a hybrid bonding.

Figure 21B:
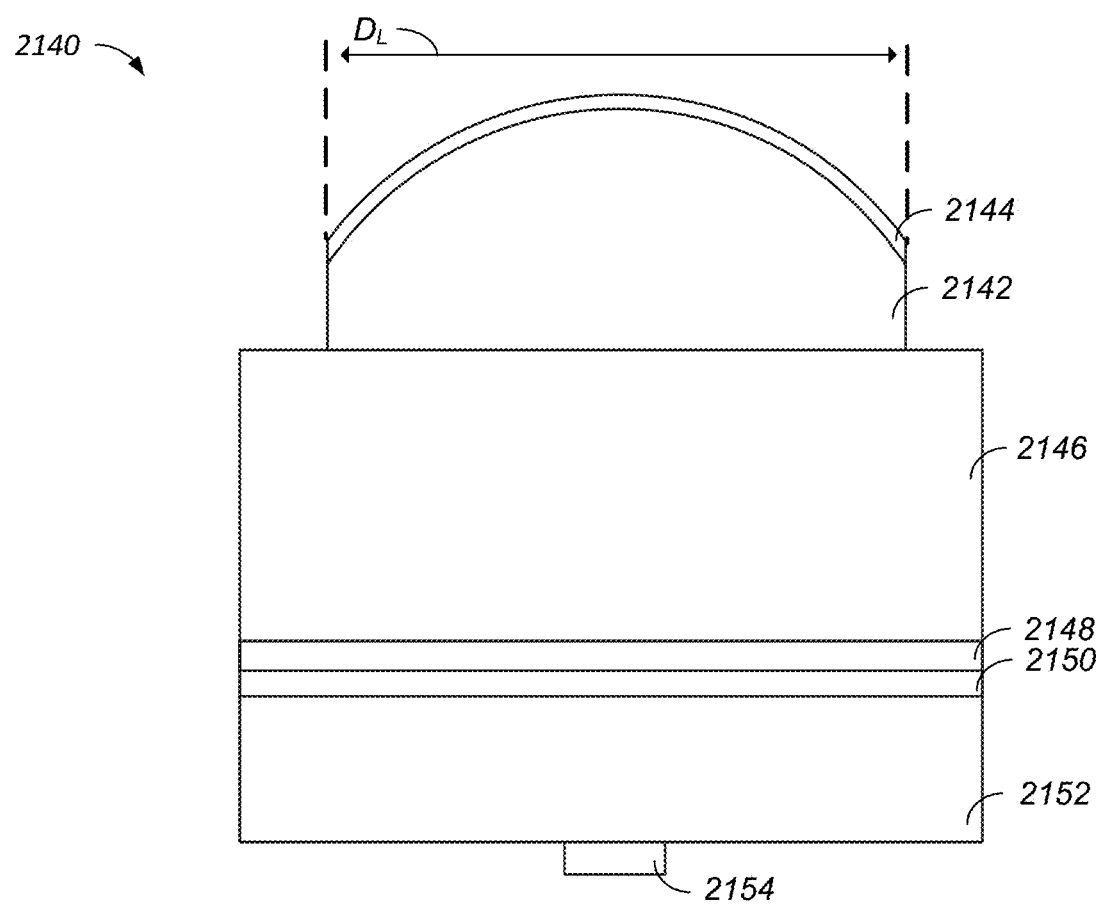

FIG. 21B shows a cross-sectional view of an example configuration 2140 of a microlens integrated with a photodetector. The configuration 2140 includes a microlens 2142, an anti-reflection coating (ARC) layer 2144, a spacer layer 2146, a first layer 2148, a second layer 2150, a silicon layer 2152 and a photodetector 2154. The ARC layer 2144 is supported by the microlens 2142. The microlens 2142 is supported by the spacer layer 2146. The photodetector 2154 may be supported by the silicon layer 2152 or be formed within the silicon layer 2152. The first layer 2148 and the second layer 2150 may be intermediate layers between the silicon layer 2152 and the spacer layer 2146.

The ARC layer 2144 is provided to reduce a reflection of light incident on the microlens 2142. The ARC layer 2144, for example, may be designed to have a refractive index that is the square root of the index of the microlens 2142, and have a thickness corresponding to a quarter of the incident wavelength. In some implementations, the ARC layer 2144 may be formed from silicon dioxide. In some implementations, the ARC layer 2144 may include multiple layers to form a multi-layer ARC.

The configuration 2140 may correspond to an integration of microlens 2142 in a back-side illuminated (BSI) image sensor configuration. For example, the silicon layer 2152 can be a silicon substrate, such as the donor wafer 1904 of FIG. 19C or the second donor wafer 2034 of FIG. 20E, and the photodetector 2154 may be, for example, the photodetectors 1902 or 1906 of FIGS. 19A-19D. The interface between the silicon layer 2152 and the second layer 2150 may correspond to the bottom surface of the donor wafer 1904 opposite to the photodetector 1906 of FIGS. 19A-19D. In such a BSI configuration, the second layer 2150 formed on the silicon layer 2152, e.g., the backside of the donor wafer 1904, can include various structures and layers typical in fabrication of a BSI illuminated sensor wafer. Examples of such structures and layers include an ARC layer for reducing light reflection at the interface of the silicon layer 2152, and a metal grid, such as a tungsten grid, for blocking light into the silicon layer 2152 other than regions for receiving light, such as the regions underneath the microlens 2142. The first layer 2148 may be a thin layer of material that promotes adhesion of the spacer layer 2146 to the second layer 2150 for improving, among others, manufacturability and reliability of the configuration 2140. The material for the first layer 2148 may be, for example, various dielectric materials (e.g., $SiO_2$, SiON, and SiN) or polymers. In some implementation, the first layer 2148 can be omitted depending on the interaction between the second layer 2150 and the spacer layer 2146 (e.g., in the case where the spacer layer 2146 has good adhesion with the second layer 2150).

The configuration 2140 may be fabricated by providing a sensor wafer including the silicon layer 2152, the photodetector 2154, and the second layer 2150, and depositing the first layer 2148, the spacer layer 2146, the microlens 2142, and the ARC layer 2144 in the order given, and then patterning and etching to expose metal pads similar to the metal pad 2116 shown in FIG. 21A. The microlens 2142 may be patterned and etched using techniques described in relation to fabrication of the microlens 2122 of FIG. 21A. While the ARC layer 2144 is shown to be limited to the surface of the microlens 2142, in general, the ARC layer 2144 may extend to other surfaces, such as the side surface of the microlens 2142 and the upper surface of the spacer layer 2146.

Various characteristics of the components of a particular implementation of the configuration 2140 configured for operational wavelength of 940 nm are given as an example. The microlens 2142 has a refractive index of 1.53, a radius of curvature of 6 μm, a height of 4 μm, and a diameter $D_L$ of 10 μm. The ARC layer 2144 is formed from $SiO_2$, which has a refractive index of 1.46 at 940 nm and a thickness of 161 nm. The spacer layer 2146 has a refractive index of 1.56, and a thickness of 2 μm. The first layer 2148 has a refractive index 1.54 and a thickness of 8 μm. The second layer 2150 includes an ARC layer for the silicon layer 2152 and a tungsten grid. While specific characteristics have been provided, the characteristics may be modified to adapt the configuration 2140, for example, for different operational wavelengths, materials, and size of the photodetector 2154.

In some implementations, the second layer 2150, which may be referred to as the "top layer" formed on top of the backside of a silicon substrate of a BSI image sensor, may be modified to improve the overall optical performance of configuration 2140. The second layer 2150, as previously described, typically includes metal grid embedded in a dielectric layer, such as tungsten grid embedded in a layer of $SiO_2$. This layer of $SiO_2$ may serve as an ARC layer if the light was entering the silicon layer 2152 directly from air. However, due to the addition of the microlens 2142, the spacer layer 2146 and the first layer 2148 which all have refractive indices that are significantly higher than that of air (approximately 1.0), the $SiO_2$ layer may not function effectively in reducing the optical reflection at the interfaces between the silicon layer 2152 and the stacking of the first layer 2148 and spacer layer 2146.

Table 1 shows simulation parameters and calculated transmission of an implementation of configuration 2140. The layers and the thicknesses have been adapted and/or approximated for the purpose of performing a simulation that approximate the expected transmission of different implementations of the configuration 2140.

TABLE 1

| LAYERS | REFRACTIVE INDEX | THICKNESS (μm) Case 1 | THICKNESS (μm) Case 2 |
|---|---|---|---|
| ARC layer 2144 | 1.46 | | 0.161 |
| Spacer layer 2146 | 1.56 | | 2 |
| First layer 2148 | 1.54 | | 8 |
| Second $SiO_2$ | 1.46 | | 0.55 |
| layer $Si_3N_4$ 2150 | 1.95 | 0 | 0.120 |
| Silicon layer 2152 | 3.599 + 0.00135i | 1 | |
| Transmission (%) | | 79 | 98 |

Referring to Table 1, case 1 corresponds to a second layer 2150 that includes a standard single layer of $SiO_2$, which results in a simulated transmission of approximately 79%. For applications where it is important to detect as much of the incident light as possible, such 21% loss of the incident light may not be acceptable. Such a drop in transmission can be mitigated by including a $Si_3N_4$ layer in the second layer 2150 under the $SiO_2$ layer as an intermediate layer between the $SiO_2$ layer and the silicon layer 2152. By including approximately 120 nm of $Si_3N_4$, the transmission can be improved to approximately 98%. As such, the intermediate layer may be referred to as an anti-reflection layer. In general, various optically transparent material with a refractive index greater than $SiO_2$ may be used in place of $Si_3N_4$. Example materials include SiON, SiN, $Al_2O_3$, $HfO_2$, $ZrO_2$, and $La_2O_3$, and high-k materials (e.g., materials with high dielectric constant) that are compatible with CMOS manufacturing processes. Suitable material may have a refractive index greater than, for example, 1.6, 1.7, 1.8, 1.9, or 2.0. Thickness of the material should be adapted to be an odd multiple of a quarter of the wavelength of light within the material.

The addition of $Si_3N_4$ or high-k material layer directly on top of the silicon layer 2152 may result in an increase of a dark current of the photodetector 2154 due to, for example, increased surface defect at the Silicon-$Si_3N_4$ or the Silicon-high-k material interface relative to Silicon-$SiO_2$ interface. To mitigate such increase in dark current, in some implementations, a second layer of $SiO_2$ can be inserted between the $Si_3N_4$ layer and the silicon layer 2152. Inserting the second layer of $SiO_2$ of thickness ranging from 10 nm to 50 nm results in a transmission ranging from approximately 97.1% to 85%, respectively. As such, inserting a thin layer of $SiO_2$, such as 10 nm, may be beneficial for mitigating the increase in dark current while maintaining high optical transmission.

Figure 22A:
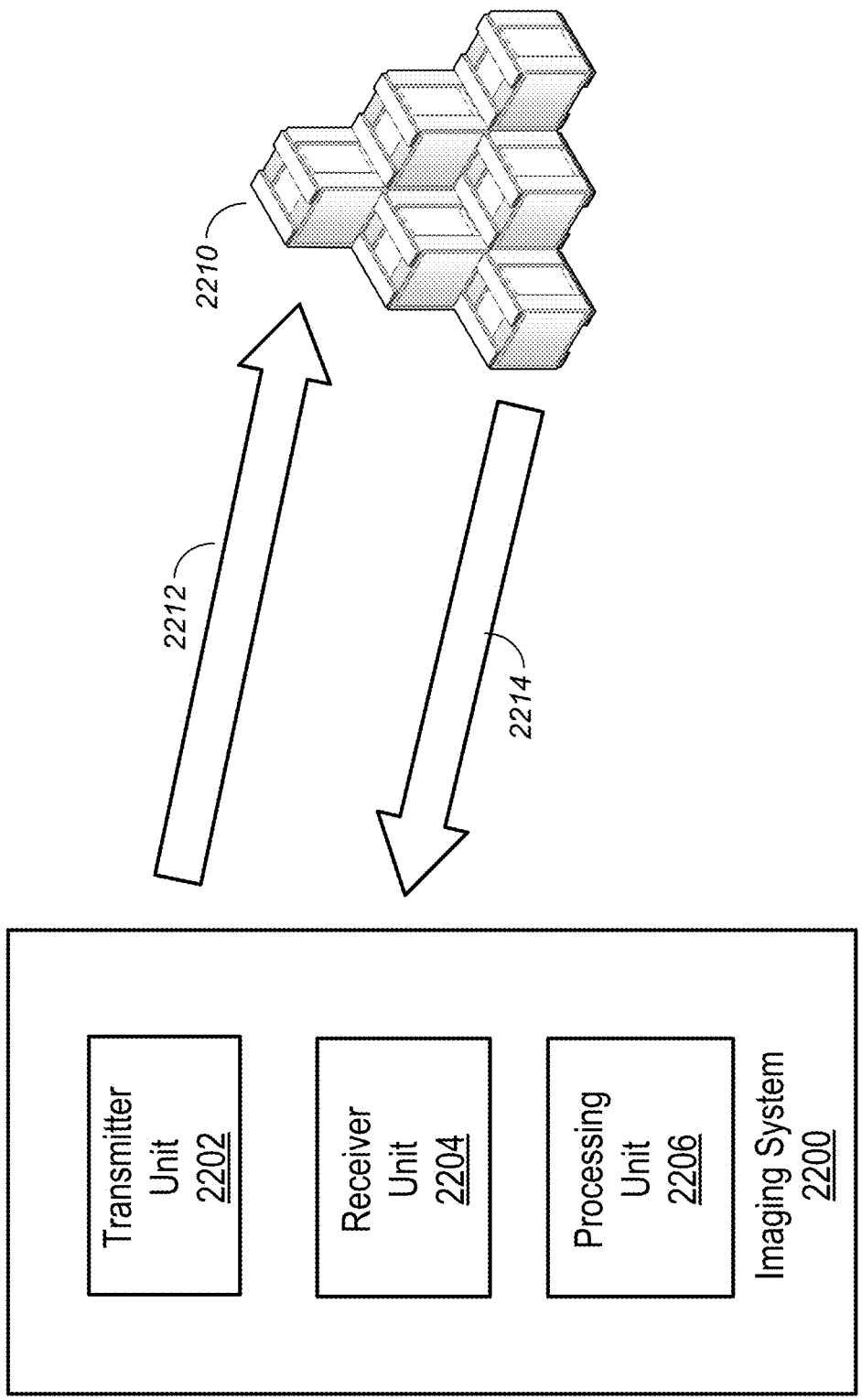
FIG. 22A is a block diagram of an example of an imaging system.

FIG. 22A shows an example imaging system 2200 for determining characteristics of a target object 2210. The target object 2210 may be a three-dimensional object. The imaging system 2200 may include a transmitter unit 2202, a receiver unit 2204, and a processing unit 2206. In general, the transmitter unit 2202 emits light 2212 towards the target object 2210. The transmitter unit 2202 may include one or more light sources, control circuitry, and/or optical elements. For example, the transmitter unit 2202 may include one or more NIR or visible LEDs, where the emitted light 2212 may be collimated by a collimating lens to propagate in free space.

In general, the receiver unit 2204 receives the reflected light 2214 that is reflected from the target object 2210. The receiver unit 2204 may include one or more photodiodes, control circuitry, and/or optical elements. For example, the receiver unit 2204 may include an image sensor, where the image sensor includes multiple pixels fabricated on a semiconductor substrate. Each pixel may include one or more multi-gate photodiodes for detecting the reflected light 2214, where the reflected light 2214 may be focused to the photodiodes. Each photodiode may be the multi-gate photodiode disclosed in this patent application.

In general, the processing unit 2206 processes the photo-carriers generated by the receiver unit 2204 and determines characteristics of the target object 2210. The processing unit 2206 may include control circuitry, one or more processors, and/or computer storage medium that may store instructions for determining the characteristics of the target object 2210. For example, the processing unit 2206 may include readout circuits and processors that can process information associated with the collected photo-carriers to determine the characteristics of the target object 2210. In some implementations, the characteristics of the target object 2210 may be depth information of the target object 2210. In some implementations, the characteristics of the target object 2210 may be material compositions of the target object 2210.

Figure 22B:
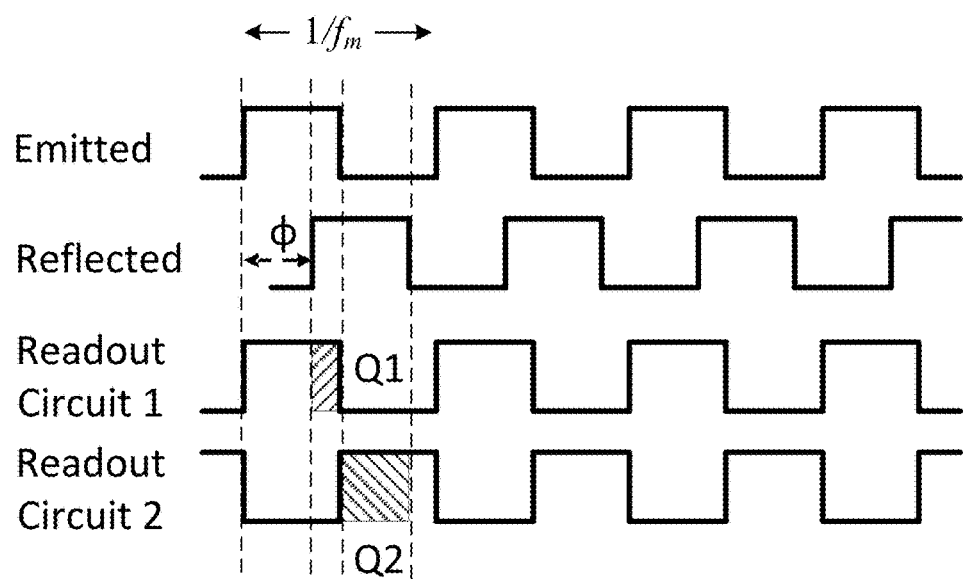
FIGS. 22B and 22C show examples of techniques for determining characteristics of an object using an imaging system.

FIG. 22B shows one example technique for determining characteristics of the target object 2210. The transmitter unit 2202 may emit light pulses 2212 modulated at a frequency $f_m$ with a duty cycle of 50% as an example. The receiver unit 2204 may receive reflected light pulses 2214 having a phase shift of Φ. The multi-gate photodiodes are controlled such that a readout circuit 1 reads the collected charges $Q_1$ in a phase synchronized with the emitted light pulses, and a readout circuit 2 reads the collected charges $Q_2$ in an opposite phase with the emitted light pulses. In some implementations, the distance, D, between the imaging system 2200 and the target object 2210 may be derived using the equation $$D = \frac{c}{4f_m} \frac{Q_2}{Q_1 + Q_2},$$

where c is the speed of light.

Figure 22C:
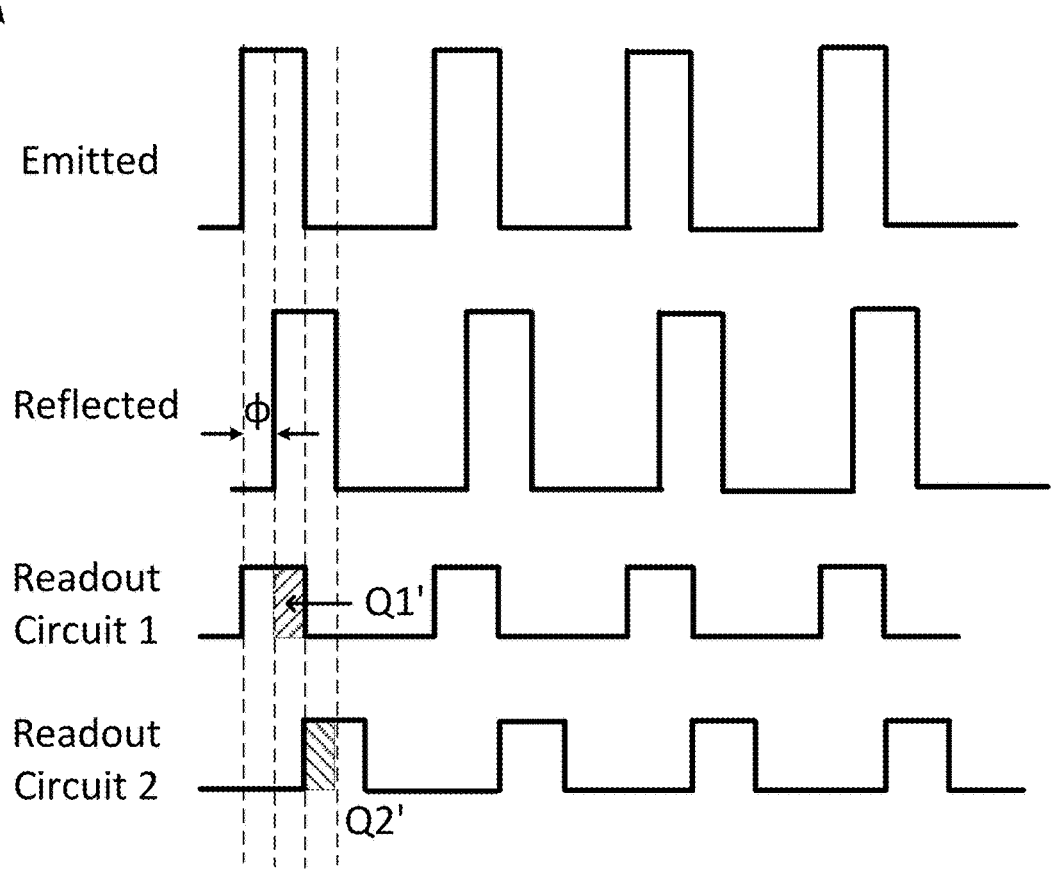

FIG. 22C shows another example technique for determining characteristics of the target object 2210. The transmitter unit 2202 may emit light pulses 2212 modulated at a frequency $f_m$ with a duty cycle of less than 50%. By reducing the duty cycle of the optical pulses by a factor of N, but increasing the intensity of the optical pulses by a factor of N at the same time, the signal-to-noise ratio of the received reflected light pulses 2214 may be improved while maintaining substantially the same power consumption for the imaging system 2200. This is made possible when the device bandwidth is increased so that the duty cycle of the optical pulses can be decreased without distorting the pulse shape. The receiver unit 2204 may receive reflected light pulses 2214 having a phase shift of Φ. The multi-gate photodiodes are controlled such that a readout circuit 1 reads the collected charges $Q_1'$ in a phase synchronized with the emitted light pulses, and a readout circuit 2 reads the collected charges $Q_2'$ in a delayed phase with the emitted light pulses.

In some implementations, the distance, D, between the imaging system 2200 and the target object 2210 may be derived using the equation $$D = \frac{c}{4Nf_m} \frac{Q_2'}{Q_1' + Q_2'}.$$

Figure 23:
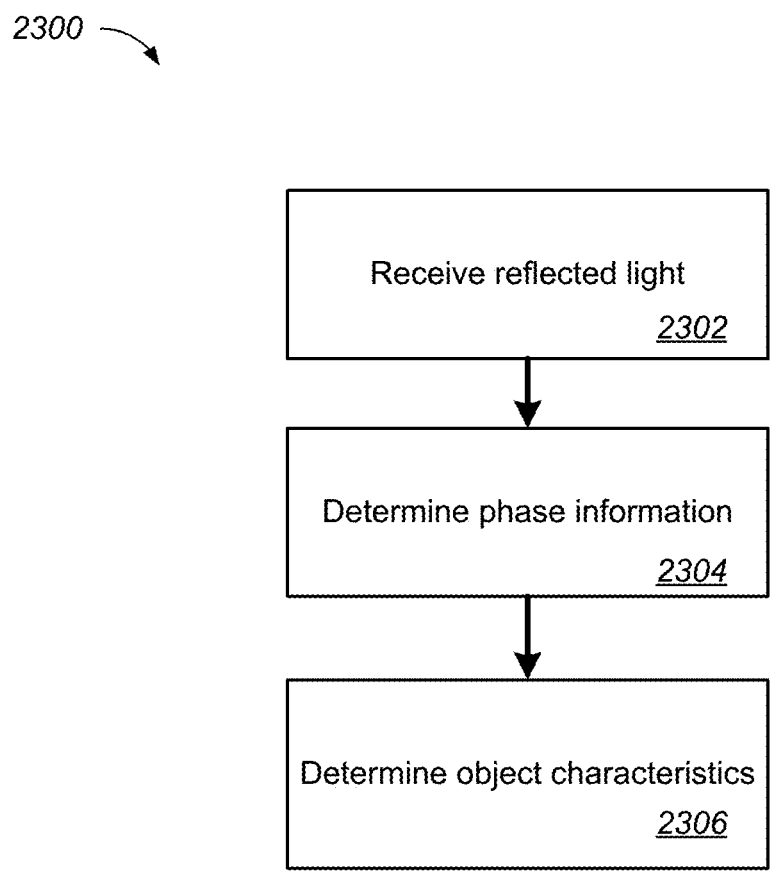
FIG. 23 shows an example of a flow diagram for determining characteristics of an object using an imaging system.

FIG. 23 shows an example of a flow diagram 2300 for determining characteristics of an object using an imaging system. The process 2300 may be performed by a system such as the imaging system 2200.

The system receives reflected light (2302). For example, the transmitter unit 2202 may emit NIR light pulses 2212 towards the target object 2210. The receiver unit 2204 may receive the reflected NIR light pulses 2214 that is reflected from the target object 2210.

The system determines phase information (2304). For example, the receiver unit 2204 may include an image sensor, where the image sensor includes multiple pixels fabricated on a semiconductor substrate. Each pixel may include one or more photodiodes for detecting the reflected light pulses 2214. The type of photodiodes may be the multi-gate photodiodes disclosed in this patent application, where the phase information may be determined using techniques described in reference to FIG. 22B or FIG. 22C.

The system determines object characteristics (2306). For example, the processing unit 2206 may determine depth information of the object 2210 based on the phase information using techniques described in reference to FIG. 22B or FIG. 22C.

An important performance metric of a photodiode is its dark current, which is a current that flows in absence of an optical signal and ambience light. In general, signal to noise ratio (SNR) of optical measurements made through photodiodes, such as TOF measurements made through multi-gate photodiodes, are negatively influenced by the presence of the dark current. For example, the SNR of an optical measurement through a photodiode is proportional to an integration time of the measurement (e.g., proportional to a square root of the integration time). The dark current of a photodiode is typically an exponential function of the reverse bias voltage established across the cathode and anode of the photodiode. As such, reducing the reverse bias voltage in a controlled manner while retaining the overall operation of the photodiode, such as the integration time of the measurement, may lead to improved SNR performance of the photodiode.

Figure 24A:
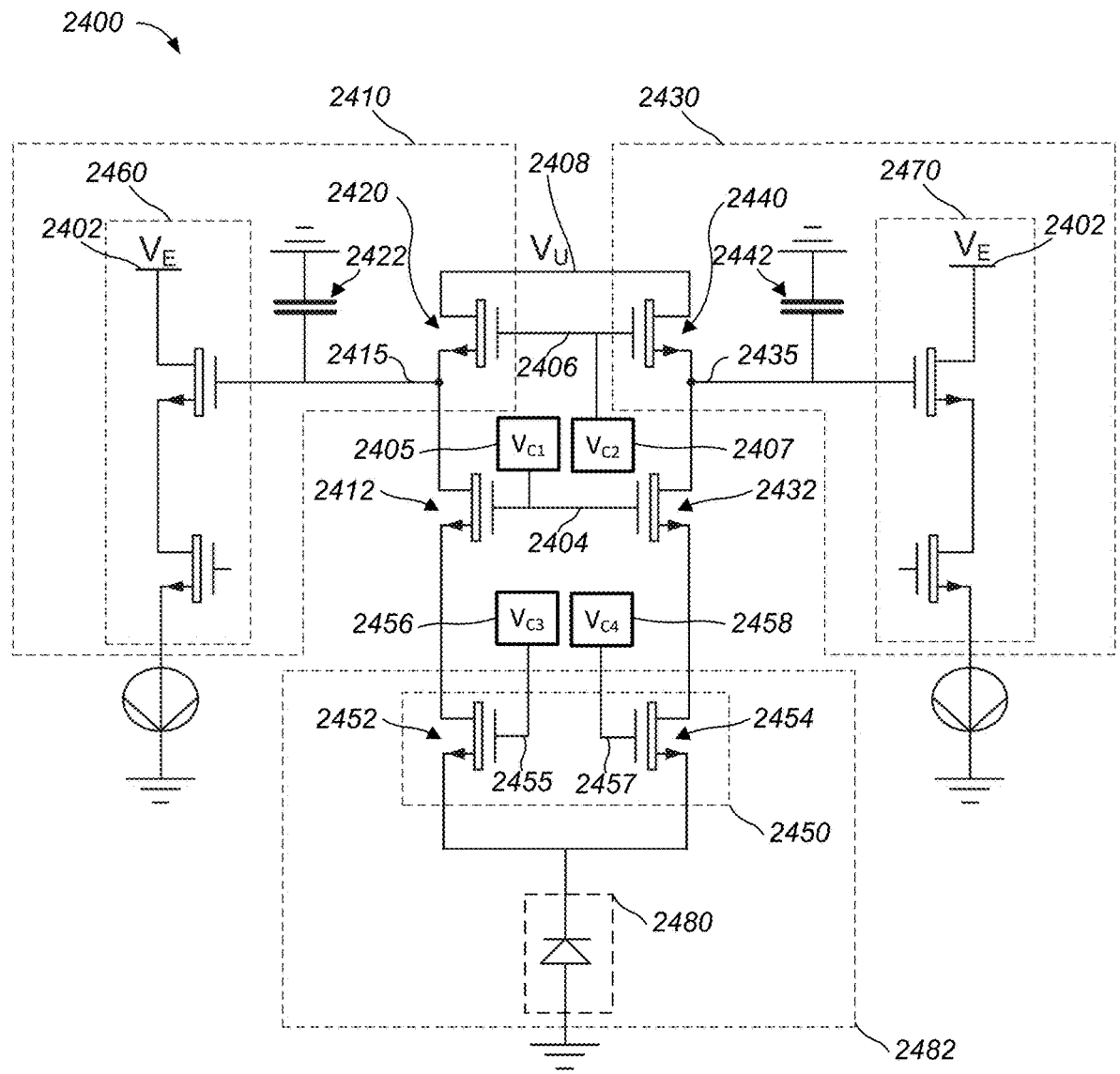
FIGS. 24A-24C show schematic diagrams of circuits for operating a multi-gate photodiode.

FIG. 24A shows a schematic diagram of a circuit 2400 for operating a multi-gate photodiode. The circuit 2400 includes a first readout circuit 2410, a second readout circuit 2430, a first MOSFET transistor 2412, a second MOSFET transistor 2432, a current steering circuit 2450, and a photodiode 2480. The first MOSFET transistor 2412 is coupled to the first readout circuit 2410 and the current steering circuit 2450. The second MOSFET transistor 2432 is coupled to the second readout circuit 2430 and the current steering circuit 2450.

The first readout circuit 2410 includes a first reset MOSFET transistor 2420, a first capacitor 2422 coupled to the first reset MOSFET transistor 2420, and a first source follower circuit 2460. An input terminal of the first source follower circuit is coupled to the first capacitor 2422. The second readout circuit 2430 includes a second reset MOSFET transistor 2440, a second capacitor 2442 coupled to the second reset MOSFET transistor 2440, and a second source follower circuit 2470. An input terminal of the second source follower circuit is coupled to the second capacitor 2442. The first and second source follower circuits 2460 and 2470 are configured to output voltages that corresponds to the voltages supplied at the input terminals of the source follower circuits 2460 and 2470.

The current steering circuit 2450 includes a first current steering MOSFET transistor 2452 and a second current steering MOSFET transistor 2454. A third control voltage source 2456 is coupled to a gate terminal of the first current steering MOSFET transistor 2452, and a fourth control voltage source 2458 is coupled to a gate terminal of the second current steering MOSFET transistor 2454. The current steering circuit 2450 operates by directing the photo-generated carriers generated by the photodiode 2480 through the first current steering MOSFET 2452, the second current steering MOSFET 2454, or a combination thereof, based on the control voltages generated by the first and second control voltage sources 2456 and 2458. For example, by controlling the third voltage source 2456 to apply a third control voltage 2455 ($V_{c3}$) greater than a threshold voltage of the MOSFET 2452 while controlling the fourth voltage source 2458 to apply a fourth control voltage 2457 ($V_{c4}$) of 0 V, the photo-generated carriers generated by the photodiode 2480 may be directed to flow through the first current steering MOSFET 2452, and vice versa. The operation of the first and second current steering MOSFET transistors 2452 and 2454 may be similar to the operation of the various gates described previously, such as the gates 416, 426, 516, 526, 708, 710, 808, and 810.

In this example, the current steering circuit 2450 and the photodiode 2480 in combination forms a multi-gate photodiode 2482. The multi-gate photodiode 2482 may be analogous to the multi-gate photodiode 700 of FIG. 7, the multi-gate photodiode 800 of FIG. 8, or the multi-gate version of the photodiodes 1010, 1012, 1014, 1100, 1102, 1104, 1106, 1108, 1109, 1160, and 1162 as described in reference to FIGS. 10B-10D and 11A-11H. For example, the vertical PIN diode formed by the p+ GeSi region 731, the absorption layer 706, and the n-well region 704 may form the photodiode 2480. The first gate 708, the first n+ Si region 712 and a portion of the n-well region 704 may form the first current steering MOSFET transistor 2452, and the second gate 710, the second n+ Si region 714 and a portion of the n-well region 704 may form the second current steering MOSFET transistor 2454. In some implementations, the multi-gate photodiode 2482 may be replaced by the switched photodetector described in U.S. patent application Ser. No. 15/908,328 titled "HIGH-SPEED LIGHT SENSING APPARATUS II."

Each of the MOSFET transistors 2412, 2420, 2432, 2440, 2452, and 2454 includes a source terminal, a drain terminal, and a gate terminal. The source terminal and the drain terminal may be identical in the underlying structure, but distinguished based on the direction of flow of the current through the transistors. For example, for an N-type MOSFET ("NMOS transistor") having a P-type channel region, the current may flow from the drain terminal to the source terminal through the channel region, whereas for a P-type MOSFET ("PMOS transistor") having an N-type channel region, the current may flow from the source terminal to the drain terminal through the channel region. As the designation of the source and drain nomenclature is based on convention and as the underlying structure may be similar or identical, the source and drain terminals may be referred to as a first channel terminal and a second channel terminal when describing the connectivity between the MOSFETs and other circuit elements.

The gate terminal controls the flow of current through the source and the drain terminals. For example, a control voltage larger than a threshold voltage $V_{th}$ may allow current to flow through the source and drain terminals. Such mode of operation of the MOSFET transistors may be referred to as operating in a saturation region or a triode region of operation, depending on voltages of the source and drain terminals relative to the gate terminal. In the saturation region, the current flowing through the source and drain terminals is not strongly affected by changes in the difference between the source and drain voltages (i.e., output impedance of the transistor is high). In the triode region, the current flowing through the source and drain terminals is approximately linearly proportional to the difference between the source and drain voltages (i.e., the transistor operates similarly to a resistor). A control voltage smaller than the threshold voltage may reduce the flow of current through the source and drain terminals. For example, the flow of current may be reduced exponentially as the control voltage is reduced below the threshold voltage. Such mode of operation of the MOSFET transistors may be referred to as operating in a subthreshold region of operation.

For the purpose of illustration, the circuit 2400 is implemented using N-type MOSFET transistors. With respect to the first readout circuit 2410, the drain terminal of the first reset MOSFET 2420 is coupled to a first supply node 2408, and the source terminal of the first reset MOSFET 2420 is coupled to the first capacitor 2422. The first capacitor 2422 is coupled to the input terminal of the first source follower circuit 2460. The source terminal of the first reset MOSFET 2420 is coupled to the drain terminal of the first MOSFET 2412, and the source terminal of the first MOSFET 2412 is coupled to the drain terminal of the first current steering MOSFET 2452. As such, a flow of current into and out of the first capacitor 2422 may be controlled through operations of various MOSFETs coupled to the first capacitor 2422. Analogously, with respect to the second readout circuit 2430, the drain terminal of the second reset MOSFET 2440 is coupled to the first supply node 2408, and the source terminal of the second reset MOSFET 2440 is coupled to the second capacitor 2442. The second capacitor 2442 is coupled to an input terminal of the second source follower circuit 2470. The source terminal of the second reset MOSFET 2440 is coupled to the drain terminal of the second MOSFET 2432, and the source terminal of the second MOSFET 2432 is coupled to the drain terminal of the second current steering MOSFET 2454. As such, a flow of current into and out of the second capacitor 2442 may be controlled through operations of various MOSFETs coupled to the second capacitor 2442.

The first supply node 2408 supplies a first supply voltage to the first and the second reset MOSFET transistors 2420 and 2440. A second supply node 2402 supplies a second supply voltage to the first and the second source follower circuits 2460 and 2470. One or more supply voltage sources may provide suitable first and second supply voltages to the first and second supply nodes 2408 and 2402, which may depend on various factors including specific process node, circuit design, characteristics of the photodiode 2480, reset voltage of the first and second capacitors 2422 and 2442, and charge-to-voltage conversion gain. The first supply node 2408 may be referred to as a $V_U$ node, and the first supply voltage of the $V_U$ node may be a user-defined voltage generated by, for example, an on-chip integrated circuit block. The second supply node 2402 may be referred to as a $V_E$ node, and the second supply voltage of the $V_E$ node may be an externally-defined voltage generated by, for example, an off-chip power supply.

During operation of the circuit 2400, the first capacitor 2422 and the second capacitor 2442 are charged to a preset voltage through the first and second reset MOSFET transistors 2420 and 2440. For example, by applying a second control voltage 2406 ($V_{c2}$) that causes the first and second reset MOSFET transistors 2420 and 2440 to operate in the saturation or triode region, current may flow from the first supply node 2408 to the respective capacitors 2422 and 2442 and charge the capacitors 2422 and 2442 to a preset voltage. A second control voltage source 2407 coupled to the gate terminals of the first and second reset MOSFET transistors 2420 and 2440 can be used to apply the second control voltage 2406. The second control voltage 2406 may be controlled to vary the preset voltage to which the capacitors 2422 and 2442 are charged (e.g., set to the supply voltage or a fraction of the supply voltage). Once the charging of the capacitors 2422 and 2442 is complete, the second control voltage 2406 may be set (e.g., to 0 V) to turn off the first and second reset MOSFET transistors 2420 and 2440, which decouples the capacitors 2422 and 2442 from the first supply node 2408. This charging operation may be referred to as a reset operation of the circuit 2400. The reset operation may be a step within the readout step of the multi-gate photodiode 2482.

Once the charging is complete, integration of the electrical signal generated by the photodiode 2480 may begin. The first and second MOSFETs 2412 and 2432 may be controlled to initiate and terminate the integration by generating, through a first control voltage source 2405 coupled to the gate terminals of the MOSFETs 2412 and 2432, a first control voltage 2404 ($V_{c1}$). For example, the first control voltage 2404 may be set through the control voltage source 2405 to operate the first and second MOSFETs 2412 and 2432 in the triode regions. In the triode region operation, the photocurrent generated by the multi-gate photodiode 2482 may flow through the drain and source terminals of the MOSFETs 2412 and 2432 and through the current steering circuit 2450 of the multi-gate photodiodes 2482. Such flow of the photocurrent through the current steering circuit 2450 may be integrated at the capacitors 2422 and 2442 by discharging the capacitors 2422 and 2442 that have been charged to the preset voltage during the reset operation.

Operation of the first and second MOSFETs 2412 and 2432 in the triode region is analogous to coupling the first and second capacitors 2422 and 2442 to respective drain terminals of the first and second current steering MOSFET transistors 2452 and 2454 through respective resistors ("effective resistors") put in place of the first and the second MOSFETs 2412 and 2432. The resistances of such effective resistors are typically of modest values (e.g., 10 ohms to 10,000 ohms) that do not present significant voltage drops in response to current flowing through the photodiode 2480. For example, the photodiode current, which may be a combination of photocurrent and dark current, is typically a small current (e.g., ranging from pA to μA), and the resulting voltage drops across the resistors are relatively small as well (e.g., ranging from nV to mV). As such, the voltages at the drain terminals of the current steering MOSFET transistors 2452 and 2454 are similar to the voltages of the capacitors 2422 and 2442 within a small voltage drop. As the capacitors 2422 and 2442 have been charged to a preset voltage that may approach the first supply voltage of the first supply node 2408, and the current steering MOSFET transistors 2452 and 2454 may pass on the voltage at their drain terminals to the photodiode 2480 coupled to their source terminals when one or both of the current steering MOSFET transistors are turned on. As such, the photodiode 2480 may experience a voltage similar to the preset voltage to which the capacitors 2422 and 2442 have been charged, resulting in a reverse bias across the junctions of the photodiode 2480 that may be larger than the minimum reverse bias needed for proper operation of the photodiode 2480. Such excessive reverse bias results in increased dark current, which may reduce the SNR of the output generated by the circuit 2400.

Photodiodes of various design and material composition may benefit from controlling of the reverse bias voltage. Among materials for forming the absorption region of a photodiode, germanium maybe more susceptible to dark current generation relative to silicon due to a higher material defect density that is typically associated with germanium absorption region grown on silicon substrate. As such, germanium-based multi-gate photodiode 2482 may be well suited to benefit from the controlling of the reverse bias voltage through the first control voltage 2404 and the resulting reduction in the dark current.

The reverse bias established across the junction of the photodiode 2480 may be reduced by decoupling the drain terminals of the current steering MOSFET transistors 2452 and 2454 from the respective capacitors 2422 and 2442 during the integration time. Such decoupling may be achieved by operating the first and second MOSFETs 2412 and 2432 in the saturation region or the subthreshold region. Operation in the saturation region or the subthreshold region allow the photocurrent generated by the photodiode 2480 to flow through the current steering circuit 2450 and the drain and source terminals of the MOSFETs 2412 and 2432. However, due to the operating principles of the first and second MOSFETs 2412 and 2432, the effective resistances, or the output impedances, of the first and second MOSFETs 2412 and 2432 operating in saturation or subthreshold regions are significantly higher than output impedances of the first and second MOSFETs 2412 and 2432 operating in the triode region. High output impedance decouples the capacitors 2422 and 2442 from the drain terminals of the current steering MOSFETs 2452 and 2454, which allows the voltages of the drain terminals of the current steering MOSFETs 2452 and 2454 to be different from (e.g., significantly lower than) the voltages of the capacitors 2422 and 2442. The voltages at the drain terminals of the current steering MOSFETs 2452 and 2454 are determined at least in part by the first control voltage 2404 and the threshold voltages of the first and the second MOSFETs 2412 and 2432 operating in the saturation or subthreshold regions. The threshold voltages may be determined by the design and structural parameters of the MOSFETs such as channel doping concentration and gate oxide thickness, and may range, for example, from 0.1 V to 1V. Lowering the first control voltage 2404 reduces the voltages at the drain terminals of the current steering MOSFETs 2452 and 2454, which in turn reduces the reverse bias across the junction of the photodiode 2480. As a result, the dark current of the multi-gate photodiode 2482 may be reduced, and SNR of the output generated by the circuit 2400 may be improved.

The first and second MOSFETs 2412 and 2432 may be controlled to operate in the saturation region or the subthreshold region by controlling, through the first control voltage source 2405, the first control voltage 2404. For example, MOSFETs can be operated in the saturation region by setting the voltage difference between the gate terminal and the source terminal ($V_{GS}$) to be greater than the threshold voltage ($V_{TH}$) while maintaining the voltage difference between the drain terminal and the source terminal ($V_{DS}$) to be greater than $V_{GS}-V_{TH}$. As another example, MOSFETs can be operated in the subthreshold region by setting the voltage difference between the gate terminal and the source terminal ($V_{GS}$) to be smaller than the threshold voltage $V_{TH}$. In general, the first control voltage 2404 may be varied to control the voltage difference between the capacitors 2422 and 2442 and the drain terminals of the respective current steering MOSFETs 2452 and 2454. In some implementations, the first control voltage 2404 may be increased to reduce the voltage difference, and vice versa. In some implementations, the first control voltage 2404 may control the voltage difference between the capacitors 2422 and 2442 and the drain terminals of the current steering MOSFETs 2452 and 2454 to be equal to or greater than 10%, 30%, or 50% of the first supply voltage of the first supply node 2408. In some implementations, the first control voltage 2404 may control the voltages of the drain terminals of the current steering MOSFETs 2452 and 2454 to be at least 100 mV smaller than the voltages of the capacitors 2422 and 2442.

When the first and second MOSFETs 2412 and 2432 are operated in either the saturation region or the subthreshold region, the MOSFETs 2412 and 2432 may be operating as current buffers that decouples the source voltages from the drain voltages.

After a preset integration time, the first control voltage 2404 may be set (e.g., to 0 V) to turn off the first and second MOSFETs 2412 and 2432, which stops the photocurrent from flowing through the respective MOSFETs 2412 and 2432, stopping the integration. The preset integration time may be a variable integration time. The initiation and termination of the integration may be referred to as shutter operation, and the first and second MOSFETs 2412 and 2432 may be referred to as shutter MOSFETs.

Once integration has been completed, the capacitors 2422 and 2442 hold output voltages that is inversely proportional to the photocurrent that flowed through the respective current steering MOSFETs 2452 and 2454 over the integration period. The output voltages may be buffered for further processing by the source follower circuits 2460 and 2470.

The current steering circuit 2450 may be operated in various ways to implement various operation modes of the circuit 2400. Operation modes of the circuit 2400 includes a time-of-flight (TOF) imaging mode, a first intensity imaging mode, and a second intensity imaging mode. The operation modes of the circuit 2400 may be controlled, for example, by the processing unit 2206, or a control unit of the imaging system 2200.

The circuit 2400 may be operated in the TOF imaging mode by steering the photo-generated carriers generated by the photodiode 2480 to the first readout circuit 2410 for a first period, and steering the photo-generated carriers to the second readout circuit 2430 for a second period. The steering may be performed by controlling the third voltage source 2456 to apply the third control voltage 2455 greater than the threshold voltage of the MOSFET 2452 while simultaneously controlling the fourth voltage source 2458 to apply the fourth control voltage 2457 of 0 V for the first period of time, then controlling the fourth voltage source 2458 to apply the fourth control voltage 2455 greater than the threshold voltage of the MOSFET 2454 while simultaneously controlling the third voltage source 2456 to apply the third control voltage 2455 of 0 V for the second period of time. An example operation of the time-of-flight imaging mode has been described in relation to FIGS. 22A-22C and 23, where charges $Q_1$ and $Q_2$ are stored in the first and second capacitors 2422 and 2442, respectively, and the first and second periods are determined based on the duty cycle and the frequency of the emitted light pulses 2212.

The circuit 2400 may be operated in the first intensity imaging mode by controlling the third voltage source 2456 and the fourth voltage source 2458 in a synchronous manner, such that the third and fourth control voltages 2455 and 2457 are substantially equal to each other at a given time. Such synchronous control of the third and fourth voltage sources 2456 and 2458 leads to the first and second current steering MOSFETs 2452 and 2454 being simultaneously turned on or off. As such, the photo-generated carriers may flow to both capacitors 2422 and 2442, and the voltages of both capacitors may be read-out and processed to determine the amount of light the photodiode 2480 has received during an integration time period, which corresponds to an intensity of light received during the integration time period. By directing the photo-generated carriers to both capacitors 2422 and 2442, twice as much photo-generated carriers may be integrated by the capacitors 2422 and 2442 relative to use of a single capacitor. In some implementations, the first intensity imaging mode may not require a modulation of the transmitter unit 2202 and a demodulation of the receiver unit 2206 shown in FIG. 22A.

The circuit 2400 may be operated in the second intensity imaging mode by controlling one of the third and fourth voltage sources 2456 and 2458 to begin and end the integration of the photo-generated carriers while maintaining the other of the third and fourth voltage sources 2456 and 2458 to generate a fixed control voltage of 0 V. For example, by controlling the fourth voltage source 2458 to output a fixed control voltage of 0 V, the second current steering MOSFET 2454 is shut off, and photo-generated carriers do not flow to the second capacitor 2442. As such, the output of the second readout circuit 2430 is not used, and the photo-generated carriers are integrated only at the first capacitor 2422 through control of the third voltage source 2456. The voltage of the first capacitor 2422 may be read-out and processed to determine the amount of light the photodiode 2480 has received during an integration time period, which corresponds to an intensity of light received during the integration time period. Integration of the photo-generated carriers at one, and not both, of the capacitors may simplify the determination of the amount of received light. Further, unused readout circuit, such as the second readout circuit 2430, may be shut down to save power. In some implementations, the second intensity imaging mode may not require a modulation of the transmitter unit 2202 and a demodulation of the receiver unit 2206 shown in FIG. 22A.

The operation of the circuit 2400 may be controlled by the control voltage sources 2456, 2458, 2405, and 2407. In some implementations, the control voltages 2455 and 2457 may be a pair of complementary clock signals to demodulate the optical signal received by the photodiode 2480, and the control voltage sources 2456 and 2458 may be output terminals of a clock source included in the imaging system 2200, such as in the receiver unit 2204 or the processing unit 2206 of FIG. 22A. To mitigate charge injection or clock feedthrough, charge injection cancelling and clock feedthrough cancelling techniques may be implemented with the MOSFETs 2452 and 2454 realized by an N-type MOSFET, a P-type MOSFET, or a combination thereof with dummy transistors added at the drain terminals of the MOSFETs 2452 and 2454. In some implementations, the control voltage 2404 may be a programmable reference voltage generated by, for example, a tunable LDO (Low Dropout) regulator, a resistor divider, or a diode-connected N-type MOSFET as the control voltage source 2405. The control voltage 2404 may be set to ensure the operation of the MOSFETs 2412 and 2432 in the saturation region or the sub-threshold region.

In some implementations, to operate the circuit 2400 at a high speed, the MOSFETs 2412 and 2432 may have separate control voltage sources, e.g., $V_{c1a}$ and $V_{c1b}$, coupled to the gate terminals of the MOSFETs 2412 and 2432, respectively. In this high-speed case, the control voltage sources $V_{c1a}$ and $V_{c1b}$ may sense the drain and/or source voltages of MOSFETs 2412 and 2432, respectively, and generate corresponding control voltages. In some implementations, the control voltage sources $V_{c1a}$ and $V_{c1b}$ may be amplifiers with a negative gain.

In some implementations, the control voltage 2406 may be a reset signal configured to periodically reset voltages at nodes 2415 and 2435.

While an N-type implementation of the circuit 2400 have been described, in general, the circuit 2400 may be implemented as a P-type circuit. For example, the MOSFETs 2412, 2420, 2432, 2440, 2452, and 2454 may be P-type MOSFETs, the source follower circuits 2460 and 2470 may be P-type source followers, and the polarity of the photodiode 2480 may be reversed. In some implementations, the MOSFETs 2412, 2420, 2432, 2440, 2452, and 2454 may have different polarities. For example, MOSFETs 2420 and 2440 may be P-type and the remaining MOSFETs may be N-type.

Also, as previously described, the MOSFET 2452 and 2454 may be realized by N-type MOSFET, P-type MOSFET, or a combination of thereof.

The circuit 2400 may be fabricated through wafer bonding a first semiconductor layer and a second semiconductor layer having various components of the circuit 2400. For example, in some implementations, the photodiode 2480 may be fabricated on the first semiconductor layer, and the first and second MOSFET transistors 2412 and 2432, the first and second readout circuits 2410 and 2430, and the current-steering circuit 2450 may be fabricated on the second semiconductor layer. As another example, in some implementations, the photodiode 2480 and the current steering circuit 2450 may be fabricated on the first semiconductor layer, and the first and second MOSFET transistors 2412 and 2432 and the first and second readout circuits 2410 and 2430 may be fabricated on the second semiconductor layer. As yet another example, in some implementations, the photodiode 2480, the current steering circuit 2450, and the first and second MOSFET transistors 2412 and 2432 may be fabricated on the first semiconductor layer, and the first and second readout circuits 2410 and 2430 may be fabricated on the second semiconductor layer.

Figure 24B:
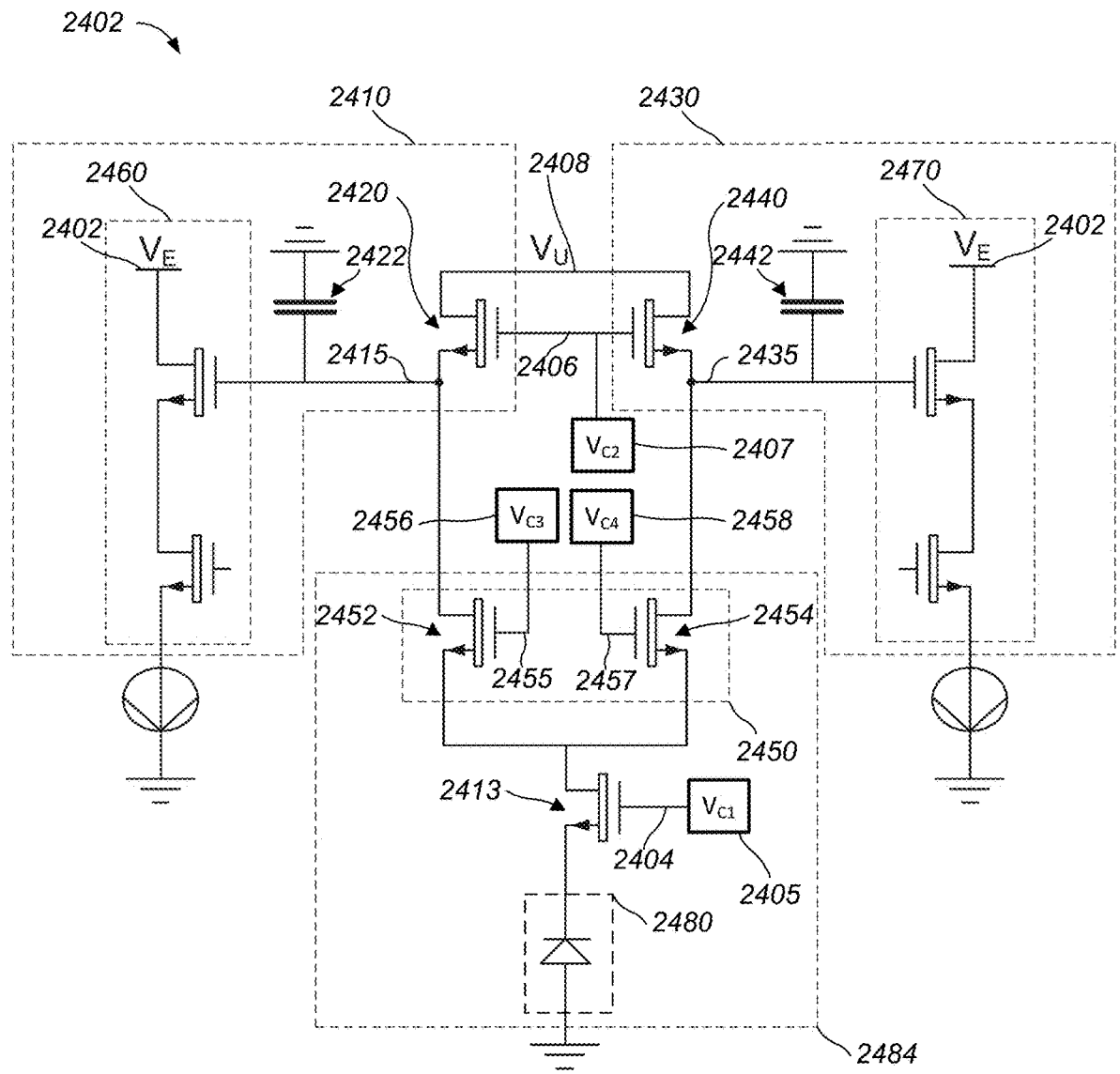

FIG. 24B shows a schematic diagram of a circuit 2402 for operating a multi-gate photodiode. The circuit 2402 is similar to the circuit 2400 of FIG. 23A, but differs in that the first and second MOSFETs 2412 and 2432 of the circuit 2400 have been replaced with a MOSFET 2413 arranged between the photodiode 2480 and the current steering circuit 2450. The MOSFET 2413 may be similar to the first and second MOSFETs 2412 and 2432 of FIG. 24A, and may perform an analogous function. For example, the MOSFET 2413 may operate as a current buffer that decouples the source voltage from the drain voltage. As such, the reverse bias applied to the photodiode 2480 may be reduced through the MOSFET 2413. The photodiode 2480, the current steering circuit 2450, and the MOSFET 2413 form a multi-gate photodiode 2484. In some implementations, the photodiode 2480 and the MOSFET 2413 of the multi-gate photodiode 2484 may be analogous to the photodiodes 1010, 1012, 1014, 1100, 1102, 1104, 1106, 1108, 1109, 1160, or 1162 as described in reference to FIGS. 10B-10D and 11A-11H.

The circuit 2402 may be fabricated through wafer bonding a first semiconductor layer and a second semiconductor layer having various components of the circuit 2402. For example, in some implementations, the photodiode 2480 may be fabricated on the first semiconductor layer, and the MOSFET transistor 2413, the first and second readout circuits 2410 and 2430, and the current-steering circuit 2450 may be fabricated on the second semiconductor layer. As another example, in some implementations, the photodiode 2480 and the MOSFET transistor 2413 may be fabricated on the first semiconductor layer, and the current steering circuit 2450 and the first and second readout circuits 2410 and 2430 may be fabricated on the second semiconductor layer. As yet another example, in some implementations, the photodiode 2480, the MOSFET transistors 2413, and the current steering circuit 2450 may be fabricated on the first semiconductor layer, and the first and second readout circuits 2410 and 2430 may be fabricated on the second semiconductor layer.

Figure 24C:
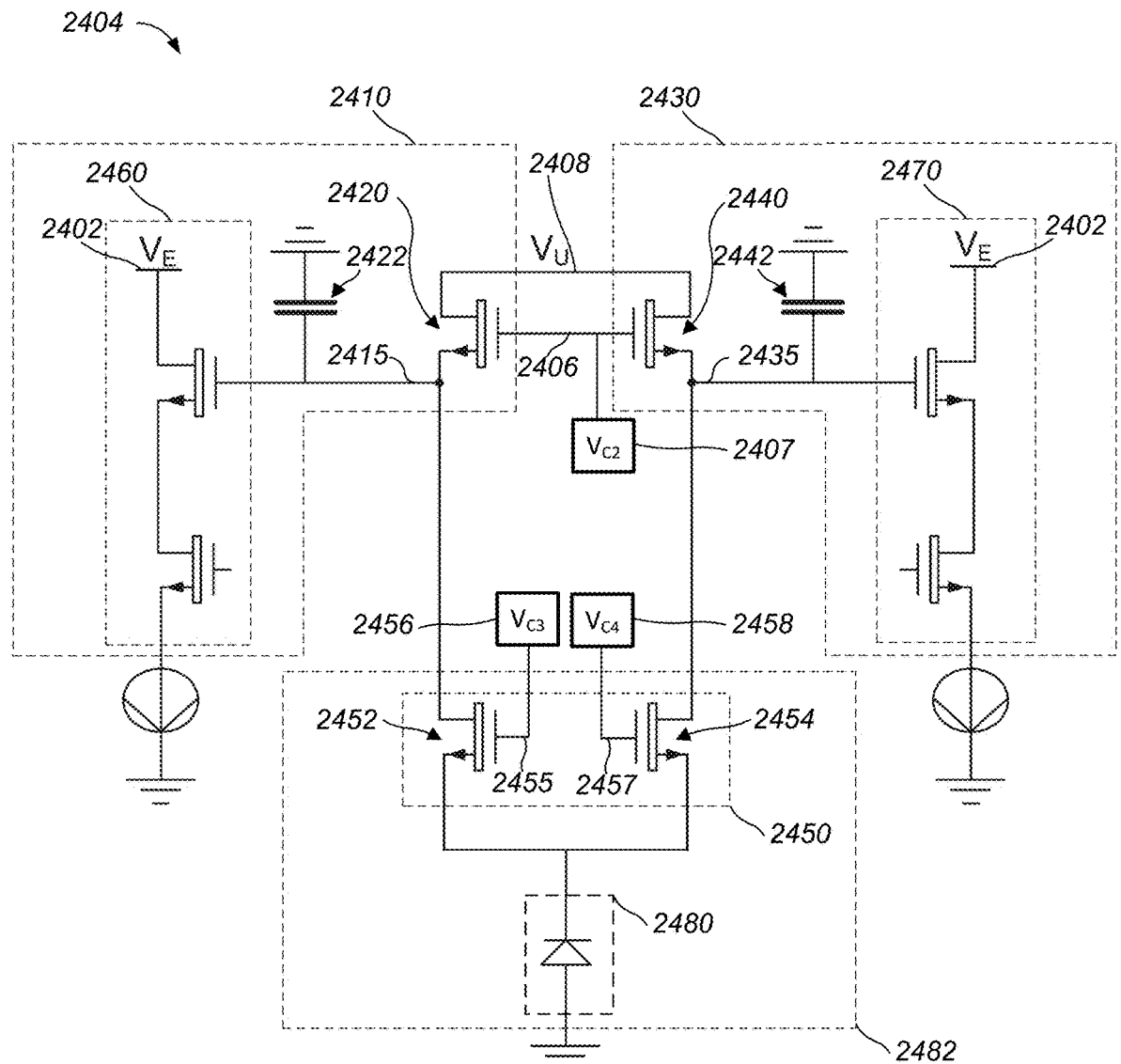

FIG. 24C shows a schematic diagram of a circuit 2404 for operating a multi-gate photodiode. The circuit 2404 is similar to the circuit 2400 of FIG. 23A, but differs in that the first and second MOSFETs 2412 and 2432 of the circuit 2400 have been omitted, and the first and second current steering MOSFETs 2452 and 2454 are controlled to operate in a manner similar to the first and second MOSFETs 2412 and 2432, such that the current steering circuit 2450 may provide a decoupling of the voltage of the capacitors 2422 and 2442 from the junction of the photodiode 2480 while providing the current steering function.

An example operation of the current steering circuit 2450 for reducing the reverse bias of the photodiode 2480 is described. In the circuit 2400 of FIG. 24A, the third and fourth control voltages 2455 and 2457 may be switched in a digital manner, i.e., from a supply rail voltage (e.g., VDD) to 0 V, to achieve current steering. However, application of a supply voltage, and more generally a voltage sufficient to operate the MOSFETs 2452 and 2454 in respective linear regions, leads to the voltage at the drain terminals of the MOSFETs to be passed onto the source terminals with minimal voltage reduction. However, by controlling the third and fourth control voltage sources 2456 and 2458 to apply respective control voltages 2455 and 2457 such that the current steering MOSFETs 2452 and 2454 operate in respective saturation or sub-threshold regions while steering current in their directions, and in cut-off region while not steering current in their directions, current steering function can be achieved while decoupling the voltages of the capacitors 2422 and 2442 from the junction of the photodiode 2480. For example, when the photo-generated carriers are to be steered through the first current steering MOSFET 2452, the third control voltage 2455 may be set to a voltage that is less than the threshold voltage of the current steering MOSFET 2452 to operate the MOSFET 2452 in the subthreshold region, and the fourth control voltage 2457 may be set to 0 V or a voltage substantially equal to 0 V to operate the MOSFET 2454 in the cut-off region. For example, when the photo-generated carriers are to be steered through the first current steering MOSFET 2452, the third control voltage 2455 may be set to a voltage that is greater than the threshold voltage of the current steering MOSFET 2452 while maintaining the voltage difference between the drain and the gate terminals of the current steering MOSFET 2452 at a level greater than the threshold voltage of the current steering MOSFET 2452 to operate the MOSFET 2452 in the saturation region, and the fourth control voltage 2457 may be set to 0 V or a voltage substantially equal to 0 V to operate the MOSFET 2454 in the cut-off region.

In some implementations, the third and fourth control voltage sources 2456 and 2458 may include adjustable voltage buffers for generating control voltages 2455 and 2457 that are configured to operate the current steering MOSFETs 2452 and 2454 in the subthreshold or saturation region. For example, the adjustable voltage buffer may receive a digital voltage for adjusting the current steering direction. The buffer may then, for example, scale the input digital voltage and adjust a bias-point (e.g., DC component) such that the output control voltages 2455 and 2457 are configured to switch the operating regions of the current steering MOSFETs 2452 and 2454 between the saturation or subthreshold region and the cut-off region.

In some implementations, to operate the circuit 2404 at a high speed, the control voltage sources 2456 and 2458 may sense the drain and/or source voltages of the MOSFETs 2452 and 2454, respectively, and generate the corresponding control voltages 2455 and 2457, respectively. In some implementations, the control voltage sources 2456 and 2458 may be amplifiers with a negative gain.

In this example, the current steering circuit 2450 and the photodiode 2480 in combination forms a multi-gate photodiode 2482. The multi-gate photodiode 2482 may be analogous to the multi-gate photodiode 700 of FIG. 7, the multi-gate photodiode 800 of FIG. 8, the multi-gate version of the photodiodes 1010, 1012, 1014, 1100, 1102, 1104, 1106, 1108, 1109, 1160, or 1162 as described in reference to FIGS. 10B-10D and 11A-11H. For example, the vertical PIN diode formed by the p+ GeSi region 731, the absorption layer 706, and the n-well region 704 may form the photodiode 2480. The first gate 708, the first n+ Si region 712 and a portion of the n-well region 704 may form the first current steering MOSFET transistor 2452, and the second gate 710, the second n+ Si region 714 and a portion of the n-well region 704 may form the second current steering MOSFET transistor 2454. In some implementation, the multi-gate photodiode 2482 may be replaced by the switched photodetector described in U.S. patent application Ser. No. 15/908,328 titled "HIGH-SPEED LIGHT SENSING APPARATUS II."

The circuit 2404 may be fabricated through wafer bonding a first semiconductor layer and a second semiconductor layer having various components of the circuit 2404. For example, in some implementations, the photodiode 2480 may be fabricated on the first semiconductor layer, and the current-steering circuit 2450 and the first and second readout circuits 2410 and 2430 may be fabricated on the second semiconductor layer. As another example, in some implementations, the photodiode 2480 and the current steering circuit 2450 may be fabricated on the first semiconductor layer, and the first and second readout circuits 2410 and 2430 may be fabricated on the second semiconductor layer.

While the term "photodiode" is used in various contexts such as in "photodiode" 2480, multi-gate "photodiode" 2482, and multi-gate "photodiode" 2484, and typically refers to a two-terminal device, it should be understood that, in general, any photon-to-carrier conversion device with two or more terminals that generates photocurrent may be used in place of the photodiode, such as the "photodiode" 2480, the multi-gate "photodiode" 2482, or the multi-gate "photodiode" 2484. For example, a phototransistor is a three-terminal device in which the photo-generated carriers are amplified by an internal gain (e.g., electron devices $N^+PN$, $N^+PNN^+$, $N^+PIN$, and $N^+PINN^+$; hole devices $P^+NP$, $P^+NPP^+$, $P^+NIP$, and $P^+NIPP^+$). The phototransistor may be used in place of the "photodiode" 2480, the multi-gate "photodiode" 2482, or the multi-gate "photodiode" 2484. As another example, a floating-base phototransistor in a two-terminal configuration may also be used in place of the "photodiode" 2480, the multi-gate "photodiode" 2482, or the multi-gate "photodiode" 2484.

A number of implementations have been described. Nevertheless, it will be understood that various modifications may be made without departing from the spirit and scope of the disclosure. For example, various forms of the flows shown above may be used, with steps re-ordered, added, or removed.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:

1. A circuit comprising:
   a photodiode configured to absorb photons and to generate photo-carriers from the absorbed photons;
   a first readout circuit configured to output a first readout voltage, the first readout circuit comprising:
      a first capacitor configured to integrate the photo-carriers generated by the photodiode; and
      a first reset MOSFET transistor configured to charge the first capacitor to a first voltage;
   a second readout circuit configured to output a second readout voltage, the second readout circuit comprising:
      a second capacitor configured to integrate the photo-carriers generated by the photodiode; and a second reset MOSFET transistor configured to charge the second capacitor to a second voltage;
a first MOSFET transistor comprising:
   a first channel terminal;
   a second channel terminal coupled to the first readout circuit; and
   a first gate terminal coupled to a first control voltage source;
a second MOSFET transistor comprising:
   a third channel terminal;
   a fourth channel terminal coupled to the second readout circuit; and
   a second gate terminal coupled to the first control voltage source; and
a current-steering circuit configured to steer the photo-carriers generated by the photodiode to one or both of the first readout circuit and the second readout circuit, the current-steering circuit comprising:
   a first current-steering MOSFET transistor comprising a third gate terminal coupled to a second control voltage source, a fifth channel terminal coupled to a first terminal of the photodiode and configured to collect a portion of the photo-carriers generated by the photodiode, and a sixth channel terminal coupled to the first channel terminal; and
   a second current-steering MOSFET transistor comprising a fourth gate terminal coupled to a third control voltage source, a seventh channel terminal coupled to the first terminal of the photodiode and configured to collect a portion of the photo-carriers generated by the photodiode, and an eighth channel terminal coupled to the third channel terminal,
wherein, during operation of the circuit, the first control voltage source generates a first control voltage configured to create a first voltage difference between the first voltage and a third voltage of the first terminal of the photodiode, and to create a second voltage difference between the second voltage and the third voltage of the first terminal of the photodiode.

2. The circuit of claim 1, further comprising a first semiconductor layer and a second semiconductor layer,
   wherein the photodiode is supported by the first semiconductor layer, and
   wherein the first MOSFET transistor, the second MOSFET transistor, the first readout circuit, the second readout circuit, and the current-steering circuit are supported by the second semiconductor layer.

3. The circuit of claim 1, further comprising a first semiconductor layer and a second semiconductor layer,
   wherein the photodiode and the current-steering circuit are supported by the first semiconductor layer, and
   wherein the first readout circuit, the second readout circuit, the first MOSFET transistor, and the second MOSFET transistor are supported by the second semiconductor layer.

4. The circuit of claim 1, further comprising a first semiconductor layer and a second semiconductor layer,
   wherein the photodiode, the current-steering circuit, the first MOSFET transistor, and the second MOSFET transistor are supported by the first semiconductor layer, and
   wherein the first readout circuit and the second readout circuit are supported by the second semiconductor layer.

5. The circuit of claim 1, wherein during operation of the circuit, the first control voltage is configured to operate the first MOSFET transistor and the second MOSFET transistor in a subthreshold region or a saturation region.

6. The circuit of claim 1, wherein the first voltage difference is greater than or equal to 10% of the first voltage, and
   wherein the second voltage difference is greater than or equal to 10% of the second voltage.

7. The circuit of claim 1, wherein during operation of the circuit, the first control voltage source reduces a first dark current integrated by the first capacitor and a second dark current integrated by the second capacitor relative to a comparable circuit without the first MOSFET transistor and the second MOSFET transistor.

8. The circuit of claim 1, wherein during operation of the circuit, the second control voltage source and the third control voltage source are controlled to operate the circuit in a time-of-flight imaging mode by steering the photo-carriers to the first readout circuit for a first period, and steering the photo-carriers to the second readout circuit for a second period.

9. The circuit of claim 1, wherein during operation of the circuit, the second control voltage source and the third control voltage source are controlled to operate the circuit in an intensity imaging mode by steering the photo-carriers to the first readout circuit and the second readout circuit in a synchronous manner.

10. The circuit of claim 1, wherein during operation of the circuit, the second control voltage source and the third control voltage source are controlled to operate the circuit in an intensity imaging mode by steering the photo-carriers to one of the first readout circuit and the second readout circuit while operating in the intensity imaging mode.

* * * * *